US011681526B2

United States Patent
Rahman et al.

(10) Patent No.: US 11,681,526 B2
(45) Date of Patent: Jun. 20, 2023

(54) METHOD AND APPARATUS FOR VECTOR BASED FINITE IMPULSE RESPONSE (FIR) FILTERING

(71) Applicant: Texas Instruments Incorporated, Dallas, TX (US)

(72) Inventors: Mujibur Rahman, Plano, TX (US); Asheesh Bhardwaj, Allen, TX (US); Timothy David Anderson, University Park, TX (US)

(73) Assignee: Texas Instmments Incorporated, Dallas, TX (US)

( * ) Notice: Subject to any disclaimer, the term of this patent is extended or adjusted under 35 U.S.C. 154(b) by 0 days.

(21) Appl. No.: 16/878,606

(22) Filed: May 20, 2020

(65) Prior Publication Data
US 2020/0373913 A1    Nov. 26, 2020

Related U.S. Application Data

(60) Provisional application No. 62/852,870, filed on May 24, 2019.

(51) Int. Cl.
| | |
|---|---|
| *G06F 9/30* | (2018.01) |
| *G06F 17/16* | (2006.01) |
| *G06F 7/487* | (2006.01) |
| *G06F 7/499* | (2006.01) |
| *G06F 7/24* | (2006.01) |

(Continued)

(52) U.S. Cl.
CPC ............ *G06F 9/30036* (2013.01); *G06F 7/24* (2013.01); *G06F 7/487* (2013.01); *G06F 7/4876* (2013.01); *G06F 7/49915* (2013.01); *G06F 7/53* (2013.01); *G06F 7/57* (2013.01); *G06F 9/3001* (2013.01); *G06F 9/30021* (2013.01); *G06F 9/30032* (2013.01); *G06F 9/30145* (2013.01); *G06F 9/30149* (2013.01); *G06F 9/3818* (2013.01); *G06F 9/3836* (2013.01); *G06F 9/3851* (2013.01); *G06F 9/48* (2013.01); *G06F 17/16* (2013.01); *H03H 17/0664* (2013.01)

(58) Field of Classification Search
CPC .......................... H03H 17/06; H03H 17/0664
See application file for complete search history.

(56) References Cited

U.S. PATENT DOCUMENTS

| | | |
|---|---|---|
| 6,606,686 B1 | 8/2003 | Agarwala et al. |
| 8,918,445 B2 | 12/2014 | Anderson et al. |

(Continued)

OTHER PUBLICATIONS

"66AK2Hx Keystone Multicore DSP+ARM System-on-Chips", SPRT651A, Texas Instruments, Inc., 2013, pp. 1-3.

(Continued)

*Primary Examiner* — Tan V Mai
(74) *Attorney, Agent, or Firm* — Michael T. Gabrik; Frank D Cimino

(57) ABSTRACT

A method is provided that includes performing, by a processor in response to a vector finite impulse response (VFIR) filter instruction, generating of a plurality of filter outputs using a plurality of coefficients and a plurality of sequential data elements, the plurality of coefficients specified by a coefficient operand of the VFIR filter instruction and the plurality of sequential data elements specified by a data operand of the VFIR filter instruction, and storing the filter outputs in a storage location specified by the VFIR filter instruction.

20 Claims, 40 Drawing Sheets

(51) Int. Cl.
*H03H 17/06* (2006.01)
*G06F 7/53* (2006.01)
*G06F 9/38* (2018.01)
*G06F 7/57* (2006.01)
*G06F 9/48* (2006.01)

(56) References Cited

U.S. PATENT DOCUMENTS

| | | | |
|---|---|---|---|
| 9,904,645 B2 | 2/2018 | Thompson et al. | |
| 2006/0095712 A1* | 5/2006 | Selvaggi | G06F 7/5443 |
| | | | 712/22 |
| 2014/0122551 A1* | 5/2014 | Dogon | H03H 17/06 |
| | | | 708/201 |
| 2016/0328233 A1* | 11/2016 | Van Dalen | G06F 9/3895 |
| 2019/0096025 A1* | 3/2019 | Nystad | G06T 1/20 |
| 2019/0103857 A1* | 4/2019 | Zivkovic | H03H 17/06 |

OTHER PUBLICATIONS

Pradeep Kumar Kumawat and Gajendra Sujediya, "Design and Comparison of 8×8 Wallace Tree Multiplier using CMOS and GDI Technology", IOSR Journal of VLSI and Signal Processing (IOSR-JVSP), vol. 7, Issue 4, Version 1, Jul.-Aug. 2017, pp. 57-62.

* cited by examiner

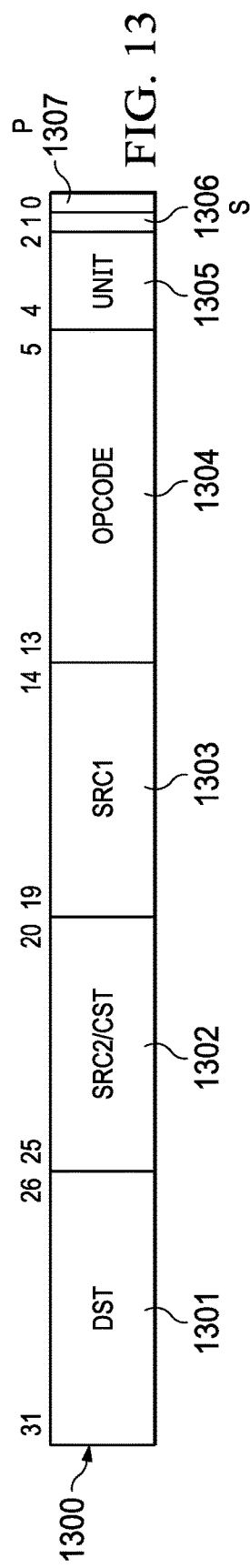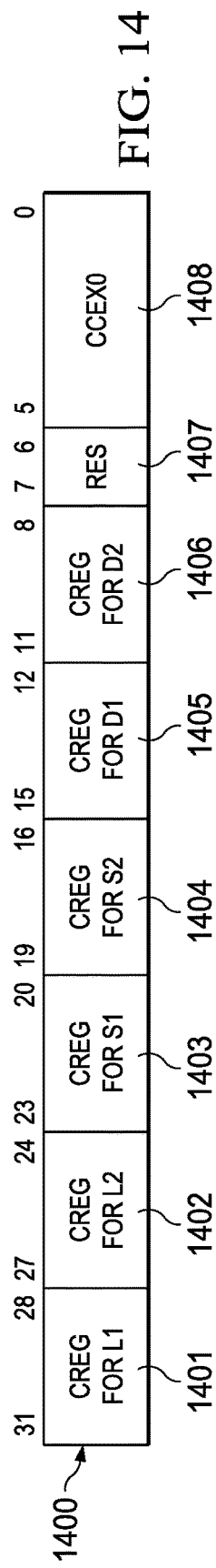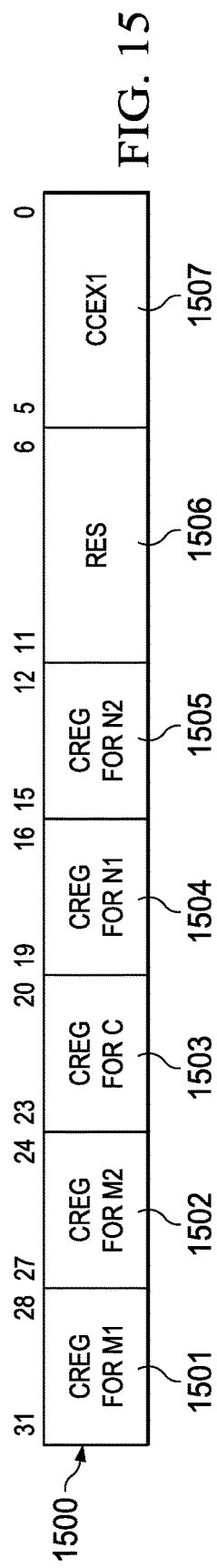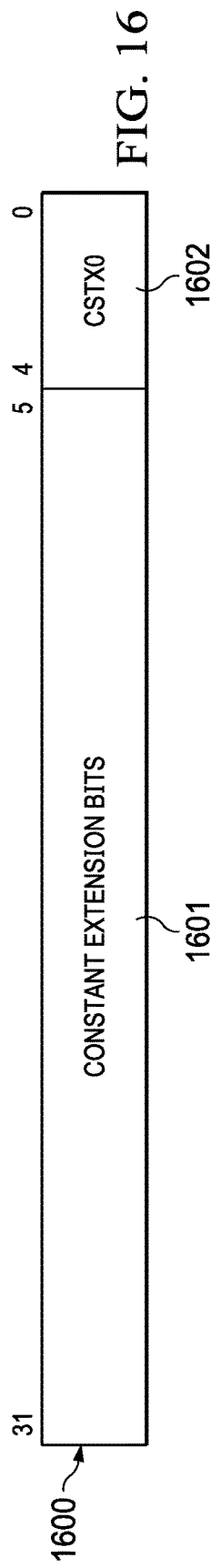

FIG. 21

| 511 | 448 447 | 384 383 | 320 319 | 256 |
|---|---|---|---|---|
| LANE 7 | LANE 6 | LANE 5 | LANE 4 |

| 255 | 192 191 | 128 127 | 64 63 | 0 |
|---|---|---|---|---|
| LANE 3 | LANE 2 | LANE 1 | LANE 0 |

| 511 | 480 479 | 448 447 | 416 415 | 384 383 | 352 351 | 320 319 | 288 287 | 256 |
|---|---|---|---|---|---|---|---|---|
| LANE 15 | LANE 14 | LANE 13 | LANE 12 | LANE 11 | LANE 10 | LANE 9 | LANE 8 |

| 255 | 224 223 | 192 191 | 160 159 | 128 127 | 96 95 | 64 63 | 32 31 | 0 |
|---|---|---|---|---|---|---|---|---|
| LANE 7 | LANE 6 | LANE 5 | LANE 4 | LANE 3 | LANE 2 | LANE 1 | LANE 0 |

| 3700 | 3702 | 3704 | | 3708 | 3710 | | | | | |
|---|---|---|---|---|---|---|---|---|---|---|
| DST | SRC2 | SRC1 | 1 | OPCODE | V | 0 | 1 | 0 | S | P |
| 6bits | 6bits | 6bits | | 7bits | 1bit | | | | 1bit | 1bit |
FIG. 37
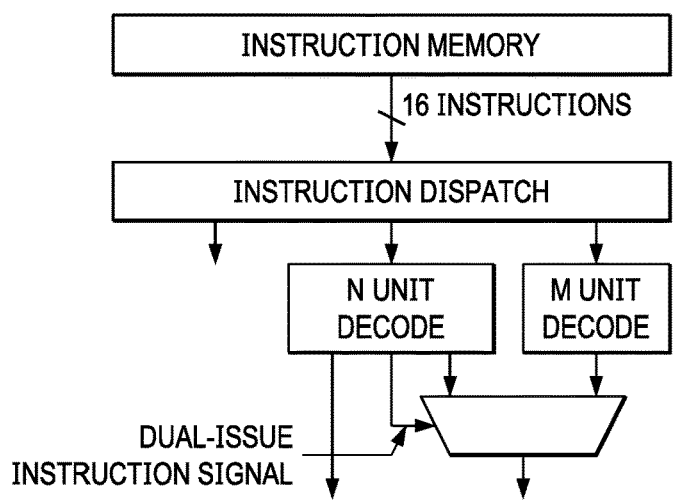
FIG. 38
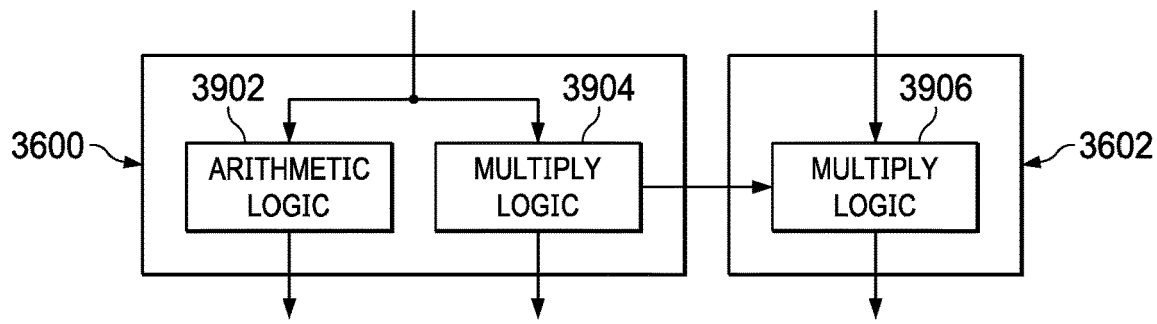
FIG. 39

VFIR8(SU/U)HD .N2 VBM1 : VBM0, SE0, VB1 : VB0
VBM1 : VBM0 : c7-c4 c7-c4 c7-c4 c7-c4 c7-c4 c7-c4 c7-c4 c7-c4 : c3-c0 c3-c0 c3-c0 c3-c0 c3-c0 c3-c0 c3-c0 c3-c0
SE0 : a22-a0
VB1 : r15, r13, r11, r9, r7, r5, r3, r1
VB0 : r14, r12, r10, r8, r6, r4, r2, r0

| <511:448> | <447:384> | <383:320> | <319:256> | <255:192> | <191:128> | <127:64> | <63:0> |      |
|-----------|-----------|-----------|-----------|-----------|-----------|----------|--------|------|
| c7-c4     | c7-c4     | c7-c4     | c7-c4     | c7-c4     | c7-c4     | c7-c4    | c7-c4  | VBM1 |
| c3-c0     | c3-c0     | c3-c0     | c3-c0     | c3-c0     | c3-c0     | c3-c0    | c3-c0  | VBM0 |
| xxxx      | xxxx      | x, a22-a20| a19-a16   | a15-a12   | a11-a8    | a7-a4    | a3-a0  | SE0  |
| r15       | r14       | r13       | r12       | r11       | r10       | r9       | r8     | VB1  |
| r7        | r6        | r5        | r4        | r3        | r2        | r1       | r0     | VB0  |

$r15 = a22*c7 + a21*c6 + a20*c5 + a19*c4 + a18*c3 + a17*c2 + a16*c1 + a15*c0$
$r0 = a7*c7 + a6*c6 + a5*c5 + a4*c4 + a3*c3 + a2*c2 + a1*c1 + a0*c0, r1 = a8*c7 + a7*c6 + a6*c5 + a5*c4 + a4*c3 + a3*c2 + a2*c1 + a1*c0, \ldots,$
x = IGNORED

FIG. 44

VFIR8(SU/U)HW.N2 VBM1 : VBM0, SE0, VB0
VBM1 : VBM0 : c7-c4 c7-c4 c7-c4 c7-c4 c7-c4 c7-c4 c7-c4 c7-c4 : c3-c0 c3-c0 c3-c0 c3-c0 c3-c0 c3-c0 c3-c0 c3-c0
SE0 : a22-a0
VB0 : r15-r0

| <511:448> | <447:384> | <383:320> | <319:256> | <255:192> | <191:128> | <127:64> | <63:0> | |
|---|---|---|---|---|---|---|---|---|
| c7-c4 | c7-c4 | c7-c4 | c7-c4 | c7-c4 | c7-c4 | c7-c4 | c7-c4 | VBM1 |
| c3-c0 | c3-c0 | c3-c0 | c3-c0 | c3-c0 | c3-c0 | c3-c0 | c3-c0 | VBM0 |
| xxxx | xxxx | x, a22-a20 | a19-a16 | a15-a12 | a11-a8 | a7-a4 | a3-a0 | SE0 |
| r15-r14 | r13-r12 | r11-r10 | r9-r8 | r7-r6 | r5-r4 | r3-r2 | r1-r0 | VB0 |

FIG. 46

VFIR4(SU/U)HW.N2 VBM0, SE1 : SE0, VB1 : VB0
VBM0 : c3-c0 c3-c0 c3-c0 c3-c0 c3-c0 c3-c0 c3-c0 c3-c0
SE1 : a34-a32
SE0 : a31-a0
VB1 : r31-r16
VB0 : r15-r0

| 63:0 | 63:0 | 63:0 | 63:0 | 63:0 | 63:0 | 63:0 | 63:0 | |
|---|---|---|---|---|---|---|---|---|
| c3-c0 | c3-c0 | c3-c0 | c3-c0 | c3-c0 | c3-c0 | c3-c0 | c3-c0 | VBM0 |
| xxxx | xxxx | xxxx | xxxx | xxxx | xxxx | xxxx | x, a34-a32 | SE1 |
| a31-a28 | a27-a24 | a23-a20 | a19-a16 | a15-a12 | a11-a8 | a7-a4 | a3-a0 | SE0 |
| r31-r30 | r29-r28 | r27-r26 | r25-r24 | r23-r22 | r21-r20 | r19-r18 | r17-r16 | VB1 |
| r15-r14 | r13-r12 | r11-r10 | r9-r8 | r7-r6 | r5-r4 | r3-r2 | r1-r0 | VB0 |

FIG. 48

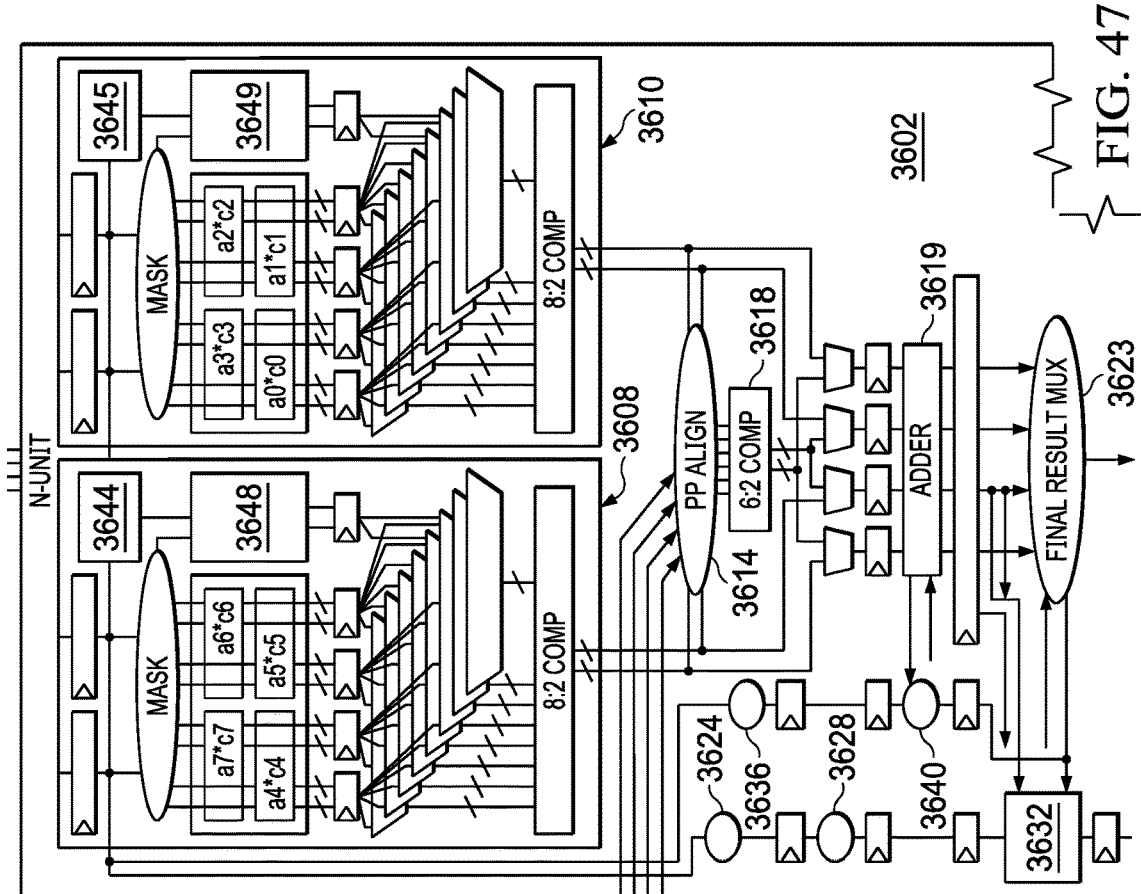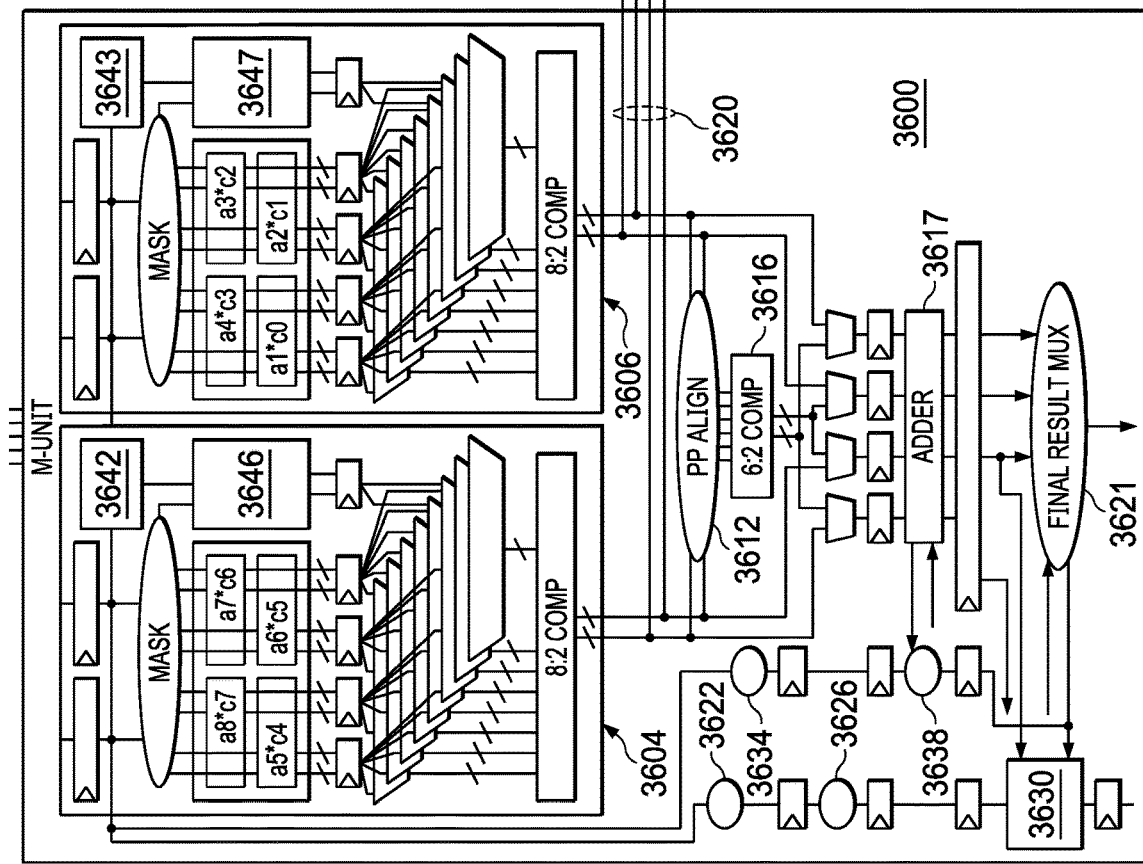
FIG. 47

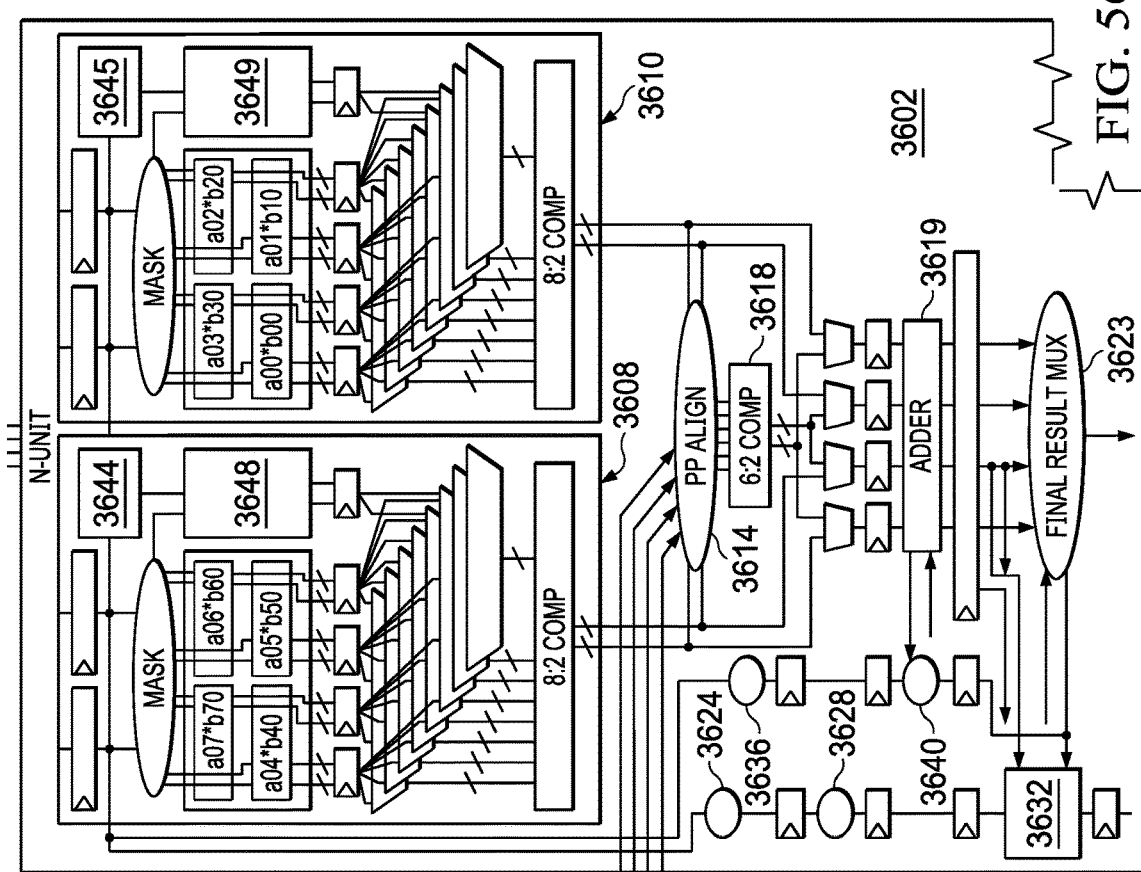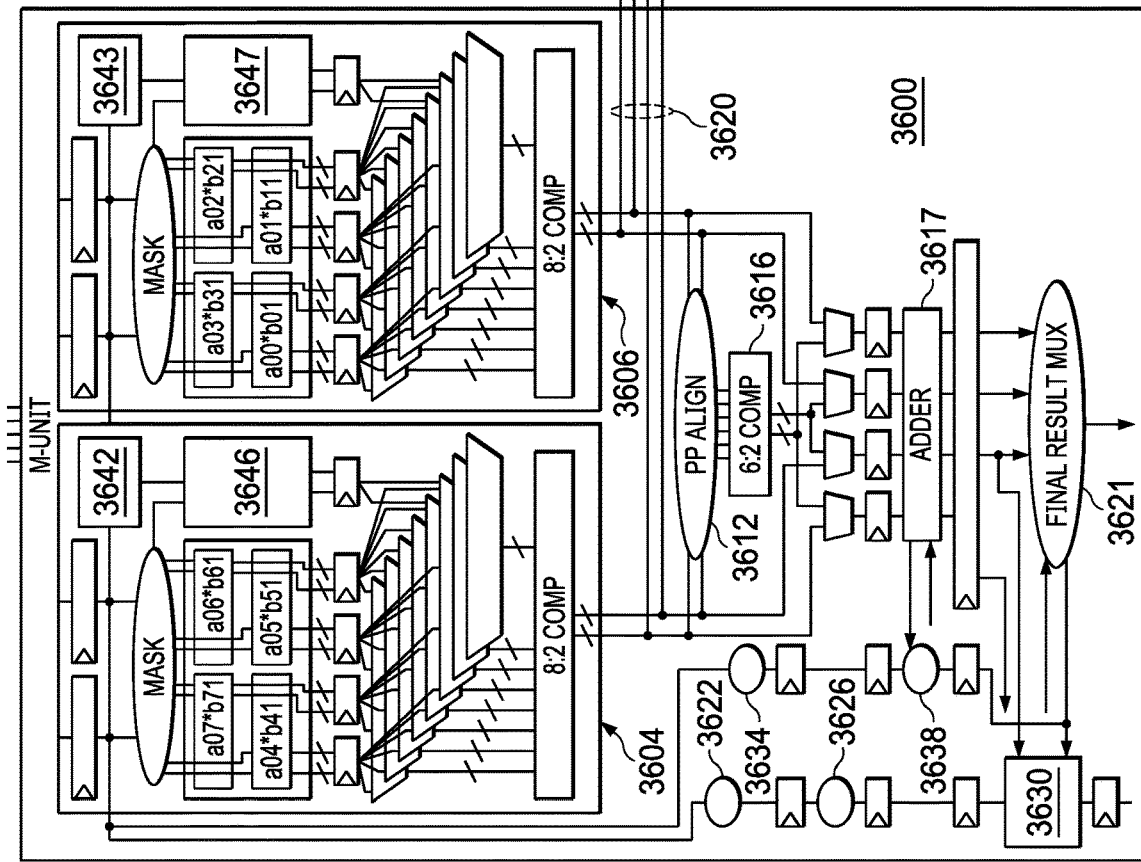
FIG. 56

METHOD AND APPARATUS FOR VECTOR BASED FINITE IMPULSE RESPONSE (FIR) FILTERING

CROSS-REFERENCE TO RELATED APPLICATIONS

This application claims benefit of U.S. Provisional Patent Application No. 62/852,870 filed May 24, 2019, which is incorporated herein by reference in its entirety.

BACKGROUND

Digital signal processors (DSP) are optimized for processing streams of data that may be derived from various input signals, such as sensor data, a video stream, a voice channel, radar signals, biomedical signals, etc. Digital signal processors operating on real-time data typically receive an input data stream, perform a filter function on the data stream (such as encoding or decoding) and output a transformed data stream. The system is called real-time because the application fails if the transformed data stream is not available for output when scheduled. Typical video encoding requires a predictable but non-sequential input data pattern. A typical application requires memory access to load data registers in a data register file and then supply data from the data registers to functional units which perform the data processing.

One or more DSP processing cores can be combined with various peripheral circuits, blocks of memory, etc. on a single integrated circuit (IC) die to form a system on chip (SoC). These systems can include multiple interconnected processors that share the use of on-chip and off-chip memory. A processor can include some combination of instruction cache (ICache) and data cache (DCache) to improve processing. Furthermore, multiple processors with shared memory can be incorporated in a single embedded system. The processors can physically share the same memory without accessing data or executing code located in the same memory locations or can use some portion of the shared memory as common shared memory.

SUMMARY

Embodiments of the present disclosure relate to methods and apparatus for vector based finite impulse response (FIR) filtering. In one aspect, a method is provided that includes performing, by a processor in response to a vector finite impulse response (VFIR) filter instruction, generating of a plurality of filter outputs using a plurality of coefficients and a plurality of sequential data elements, the plurality of coefficients specified by a coefficient operand of the VFIR filter instruction and the plurality of sequential data elements specified by a data operand of the VFIR filter instruction, and storing the filter outputs in a storage location specified by the VFIR filter instruction.

In one aspect, a processor is provided that includes an instruction decoder configured to decode a vector finite impulse response (VFIR) filter instruction, and filter computation logic configured to generate, responsive to the VFIR filter instruction, a plurality of filter outputs using a plurality of coefficients and a plurality of sequential data elements, the plurality of coefficients specified by a coefficient operand of the VFIR filter instruction and the plurality of sequential data elements specified by a data operand of the VFIR filter instruction.

BRIEF DESCRIPTION OF THE DRAWINGS

FIG. 13 illustrates an example of instruction coding;

FIG. 14 illustrates bit coding of a condition code extension slot 0;

FIG. 15 illustrates bit coding of a condition code extension slot 1;

FIG. 16 illustrates bit coding of a constant extension slot 0;

FIG. 21 illustrates an example of lane allocation in a vector;

FIG. 22 illustrates an example of lane allocation in a vector;

FIG. 30 illustrates sub-field definitions of the flags field of the example stream template register of FIG. 29;

FIG. 37 illustrates an instruction format for a dual issue instruction;

FIG. 38 illustrates a block diagram of instruction decoding for a dual issue instruction;

FIG. 39 illustrates an example of M unit slice multiply logic and N unit slice multiply logic in which the M unit slice multiply logic includes both arithmetic logic and multiply logic;

FIG. 44 illustrates an example of the operation of VFIR8×HD instructions;

FIG. 46 illustrates an example of the operation of VFIR8×HW instructions;

FIG. 47 illustrates an example of multiplier use for the VFIR8×HW instructions;

FIG. 48 illustrates an example of the operation of VFIR4×HW instructions;

FIG. 51 illustrates an example of the operation of VMATMPY×HW instructions;

FIG. 54 illustrates an example of the operation of VMATMPY×HD instructions;

FIG. 56 illustrates an example of multiplier use for the VMATMPY×HD instructions;

DETAILED DESCRIPTION

Figure 1:
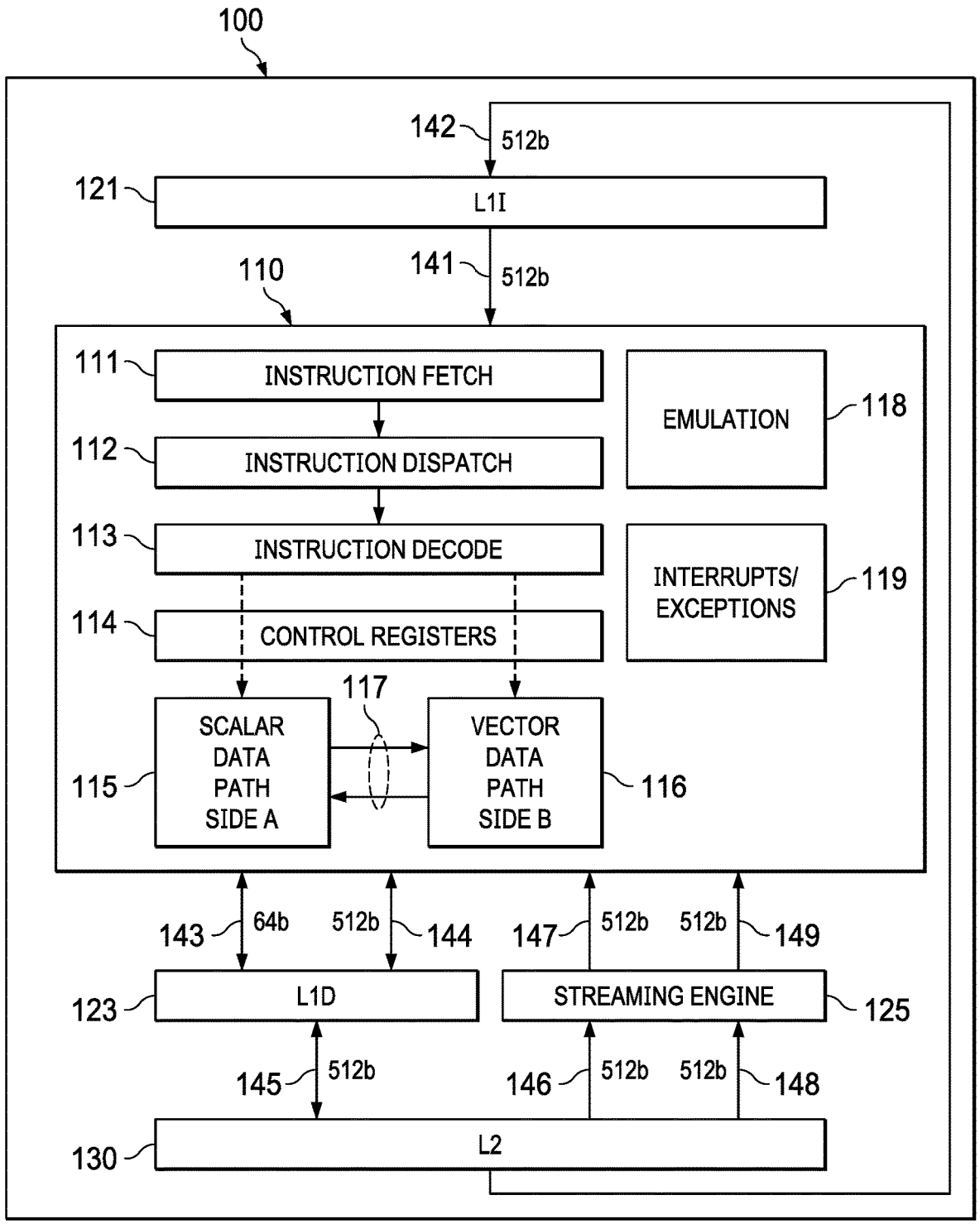
FIG. 1 illustrates an example dual scalar/vector data path processor.

Like elements in the various figures are denoted by like reference numerals for consistency.

Digital signal processors (DSP) are optimized for processing streams of data that can be derived from various input signals, such as sensor data, a video stream, a voice channel, radar signals, biomedical signals, etc. Memory bandwidth and scheduling are concerns for digital signal processors operating on real-time data. An example DSP processing core is described herein that includes a streaming engine to improve memory bandwidth and data scheduling.

One or more DSP processing cores can be combined with various peripheral circuits, blocks of memory, etc. on a single integrated circuit (IC) die to form a system on chip (SoC). See, for example, "66AK2Hx Multicore Keystone™ DSP+ARM® System-on-Chips," 2013 which is incorporated by reference herein.

In the example DSP core described herein, an autonomous streaming engine (SE) is coupled to the DSP. In this example, the streaming engine includes two closely coupled streaming engines that can manage two data streams simultaneously. In another example, the streaming engine is capable of managing only a single stream, while in other examples the streaming engine is capable of handling more than two streams. In each case, for each stream, the streaming engine includes an address generation stage, a data formatting stage, and some storage for formatted data waiting for consumption by the processor. In the examples described herein, addresses are derived from algorithms that can involve multi-dimensional loops, each dimension maintaining an iteration count. In one example, the streaming engine supports six levels of nested iteration. In other examples, more or fewer levels of iteration are supported.

Further, in the example DSP core described herein, instruction support is provided for various operations that are important for computer vision processing and other applications. In various examples, support is provided for one or more of vector based finite impulse filtering (FIR), vector and scalar multiplication, vector and scalar floating point multiplication, and vector based matrix multiplication.

FIG. 1 illustrates an example processor 100 that includes dual scalar/vector data paths 115, 117. Processor 100 includes a streaming engine 125 that is described in more detail herein. Processor 100 includes separate level one instruction cache (L1I) 121 and level one data cache (L1D) 123. Processor 100 includes a level 2 (L2) combined instruction/data cache 130 that holds both instructions and data. FIG. 1 illustrates connection between L1I cache and L2 combined instruction/data cache 130, 512-bit bus 142. FIG. 1 illustrates the connection between L1D cache 123 and L2 combined instruction/data cache 130, 512-bit bus 145. In the example processor 100, L2 combined instruction/data cache 130 stores both instructions to back up L1I cache 121 and data to back up L1D cache 123. In this example, L2 combined instruction/data cache 130 is further connected to higher level cache and/or main memory using known or later developed memory system techniques not illustrated in FIG. 1. As used herein, the term "higher level" memory or cache refers to a next level in a memory hierarchy that is more distant from the processor, while the term "lower level" memory or cache refers to a level in the memory hierarchy that is closer to the processor. L1I cache 121, L1D cache 123, and L2 cache 130 may be implemented in different sizes in various examples. In this example, L1I cache 121 and L1D cache 123 are each 32K bytes, and L2 cache 130 is 1024K bytes. In the example processor 100, L1I cache 121, L1D cache 123 and L2 combined instruction/data cache 130 are formed on a single integrated circuit. This single integrated circuit optionally includes other circuits.

Processing unit core 110 fetches instructions from L1I cache 121 as controlled by instruction fetch unit 111. Instruction fetch unit 111 determines the next instructions to be executed and recalls a fetch packet sized set of such instructions. The nature and size of fetch packets are further detailed below. Instructions are directly fetched from L1I cache 121 upon a cache hit if the instructions are stored in L1I cache 121. Upon a cache miss occurring when the specified instructions are not stored in L1I cache 121, the instructions are sought in L2 combined cache 130. In this example, the size of a cache line in L1I cache 121 equals the size of a fetch packet which is 512 bits. The memory locations of these instructions are either a hit in L2 combined cache 130 or a miss. A hit is serviced from L2 combined cache 130. A miss is serviced from a higher level of cache (not illustrated) or from main memory (not illustrated). In this example, the requested instruction is simultaneously supplied to both L1I cache 121 and processing unit core 110 to speed use.

In this example, processing unit core 110 includes multiple functional units to perform instruction specified data processing tasks. Instruction dispatch unit 112 determines the target functional unit of each fetched instruction. In this example, processing unit 110 operates as a very long instruction word (VLIW) processor capable of operating on multiple instructions in corresponding functional units simultaneously. A complier organizes instructions in execute packets that are executed together. Instruction dispatch unit 112 directs each instruction to its target functional unit. The functional unit assigned to an instruction is completely specified by the instruction produced by the compiler. The hardware of processing unit core 110 has no part in the functional unit assignment. In this example, instruction dispatch unit 112 operates on several instructions in parallel. The number of such parallel instructions is set by the size of the execute packet. This is further described herein.

One part of the dispatch task of instruction dispatch unit 112 is determining whether the instruction is to execute on a functional unit in scalar data path side A 115 or vector data path side B 116. An instruction bit within each instruction called the s bit determines which data path the instruction controls. This is further described herein.

Instruction decode unit 113 decodes each instruction in a current execute packet. Decoding includes identification of the functional unit performing the instruction, identification of registers used to supply data for the corresponding data processing operation from among possible register files, and identification of the register destination of the results of the corresponding data processing operation. As further explained below, instructions can include a constant field in place of one register number operand field. The result of this decoding are signals for control of the target functional unit to perform the data processing operation specified by the corresponding instruction on the specified data.

Processing unit core 110 includes control registers 114. Control registers 114 store information for control of the functional units in scalar data path side A 115 and vector data path side B 116. This information may include mode information or the like.

The decoded instructions from instruction decode 113 and information stored in control registers 114 are supplied to scalar data path side A 115 and vector data path side B 116. As a result, functional units within scalar data path side A 115 and vector data path side B 116 perform instruction specified data processing operations upon instruction specified data and store the results in an instruction specified data register or registers. Each of scalar data path side A 115 and vector data path side B 116 includes multiple functional units that operate in parallel. These are further described below in conjunction with FIG. 2. There is a data path 117 between scalar data path side A 115 and vector data path side B 116 permitting data exchange.

Processing unit core 110 includes further non-instruction-based modules. Emulation unit 118 permits determination of the machine state of processing unit core 110 in response to instructions. This capability can be employed for algorithmic development. Interrupts/exceptions unit 119 enables processing unit core 110 to be responsive to external, asynchronous events (interrupts) and to respond to attempts to perform improper operations (exceptions).

Processor 100 includes streaming engine 125. Streaming engine 125 supplies two data streams from predetermined addresses cached in L2 combined cache 130 to register files of vector data path side B of processing unit core 110. This provides controlled data movement from memory (as cached in L2 combined cache 130) directly to functional unit operand inputs. This is further described herein.

FIG. 1 illustrates example data widths of busses between various parts. L1I cache 121 supplies instructions to instruction fetch unit 111 via bus 141. Bus 141 is a 512-bit bus in this example. Bus 141 is unidirectional from L1I cache 121 to processing unit 110. L2 combined cache 130 supplies instructions to L1I cache 121 via bus 142. Bus 142 is a 512-bit bus in this example. Bus 142 is unidirectional from L2 combined cache 130 to L1I cache 121.

L1D cache 123 exchanges data with register files in scalar data path side A 115 via bus 143. Bus 143 is a 64-bit bus in this example. L1D cache 123 exchanges data with register files in vector data path side B 116 via bus 144. Bus 144 is a 512-bit bus in this example. Busses 143 and 144 are illustrated as bidirectional supporting both processing unit core 110 data reads and data writes. L1D cache 123 exchanges data with L2 combined cache 130 via bus 145. Bus 145 is a 512-bit bus in this example. Bus 145 is illustrated as bidirectional supporting cache service for both processing unit core 110 data reads and data writes.

Processor data requests are directly fetched from L1D cache 123 upon a cache hit (if the requested data is stored in L1D cache 123). Upon a cache miss (the specified data is not stored in L1D cache 123), the data is sought in L2 combined cache 130. The memory locations of the requested data are either a hit in L2 combined cache 130 or a miss. A hit is serviced from L2 combined cache 130. A miss is serviced from another level of cache (not illustrated) or from main memory (not illustrated). The requested data may be simultaneously supplied to both L1D cache 123 and processing unit core 110 to speed use.

L2 combined cache 130 supplies data of a first data stream to streaming engine 125 via bus 146. Bus 146 is a 512-bit bus in this example. Streaming engine 125 supplies data of the first data stream to functional units of vector data path side B 116 via bus 147. Bus 147 is a 512-bit bus in this example. L2 combined cache 130 supplies data of a second data stream to streaming engine 125 via bus 148. Bus 148 is a 512-bit bus in this example. Streaming engine 125 supplies data of this second data stream to functional units of vector data path side B 116 via bus 149, which is a 512-bit bus in this example. Busses 146, 147, 148 and 149 are illustrated as unidirectional from L2 combined cache 130 to streaming engine 125 and to vector data path side B 116 in accordance with this example.

Streaming engine data requests are directly fetched from L2 combined cache 130 upon a cache hit (if the requested data is stored in L2 combined cache 130). Upon a cache miss (the specified data is not stored in L2 combined cache 130), the data is sought from another level of cache (not illustrated) or from main memory (not illustrated). It is technically feasible in some examples for L1D cache 123 to cache data not stored in L2 combined cache 130. If such operation is supported, then upon a streaming engine data request that is a miss in L2 combined cache 130, L2 combined cache 130 snoops L1D cache 123 for the streaming engine requested data. If L1D cache 123 stores the data, the snoop response includes the data, which is then supplied to service the streaming engine request. If L1D cache 123 does not store the data, the snoop response indicates this and L2 combined cache 130 services the streaming engine request from another level of cache (not illustrated) or from main memory (not illustrated).

In this example, both L1D cache 123 and L2 combined cache 130 can be configured as selected amounts of cache or directly addressable memory in accordance with U.S. Pat. No. 6,606,686 entitled Unified Memory System Architecture Including Cache and Directly Addressable Static Random Access Memory, which is incorporated by reference herein.

In this example, processor 100 is fabricated on an integrated chip (IC) that is mounted on a ball grid array (BGA) substrate. A BGA substrate and IC die together may be referred to as "BGA package," "IC package," "integrated circuit," "IC," "chip," "microelectronic device," or similar terminology. The BGA package may include encapsulation material to cover and protect the IC die from damage. In another example, other types of known or later developed packaging techniques may be used with processor 100.

Figure 2:
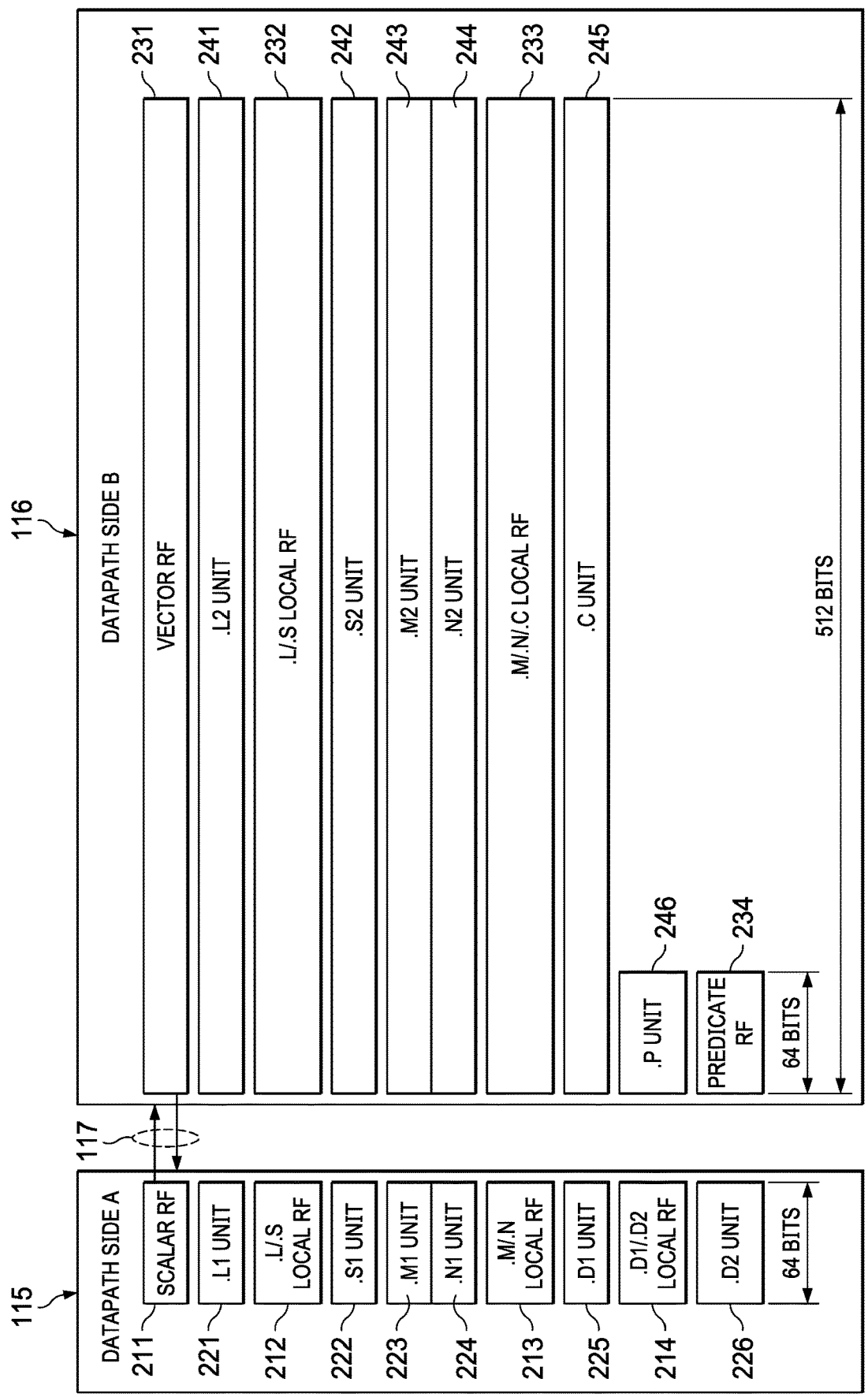
FIG. 2 illustrates the registers and functional units in the dual scalar/vector data path processor illustrated in FIG. 1.

FIG. 2 illustrates further details of functional units and register files within scalar data path side A 115 and vector data path side B 116. Scalar data path side A 115 includes L1 unit 221, S1 unit 222, M1 unit 223, N1 unit 224, D1 unit 225 and D2 unit 226. Scalar data path side A 115 includes global scalar register file 211, L1/S1 local register file 212, M1/N1 local register file 213 and D1/D2 local register file 214. Vector data path side B 116 includes L2 unit 241, S2 unit 242, M2 unit 243, N2 unit 244, C unit 245 and P unit 246. Vector data path side B 116 includes global vector register file 231, L2/S2 local register file 232, M2/N2/C local register file 233 and predicate register file 234. Which functional units can read from or write to which register files is described in more detail herein.

Scalar data path side A 115 includes L1 unit 221. L1 unit 221 generally accepts two 64-bit operands and produces one 64-bit result. The two operands are each recalled from an instruction specified register in either global scalar register file 211 or L1/S1 local register file 212. L1 unit 221 performs the following instruction selected operations: 64-bit add/subtract operations; 32-bit min/max operations; 8-bit Single Instruction Multiple Data (SIMD) instructions such as sum of absolute value, minimum and maximum determinations; circular min/max operations; and various move operations between register files. The result is written into an instruction specified register of global scalar register file 211, L1/S1 local register file 212, M1/N1 local register file 213 or D1/D2 local register file 214.

Scalar data path side A 115 includes S1 unit 222. S1 unit 222 generally accepts two 64-bit operands and produces one 64-bit result. The two operands are each recalled from an instruction specified register in either global scalar register file 211 or L1/S1 local register file 212. In this example, S1 unit 222 performs the same type operations as L1 unit 221. In another example, there may be slight variations between the data processing operations supported by L1 unit 221 and S1 unit 222. The result is written into an instruction specified register of global scalar register file 211, L1/S1 local register file 212, M1/N1 local register file 213 or D1/D2 local register file 214.

Scalar data path side A 115 includes M1 unit 223. M1 unit 223 generally accepts two 64-bit operands and produces one 64-bit result. The two operands are each recalled from an instruction specified register in either global scalar register file 211 or M1/N1 local register file 213. Examples of the instruction selected operations performed by the example M1 unit 223 include 8-bit, 16-bit, and 32-bit multiply operations, Galois field multiplication, complex multiplication with and without rounding, IEEE floating point multiply operations, complex dot product operations, 32-bit bit count operations, complex conjugate multiply operations, and bit-wise logical operations, moves, adds and subtracts. The result is written into an instruction specified register of global scalar register file 211, L1/S1 local register file 212, M1/N1 local register file 213 or D1/D2 local register file 214.

Scalar data path side A 115 includes N1 unit 224. N1 unit 224 generally accepts two 64-bit operands and produces one 64-bit result. The two operands are each recalled from an instruction specified register in either global scalar register file 211 or M1/N1 local register file 213. In this example, N1 unit 224 performs the same type operations as M1 unit 223. There are also double operations referred to as dual issue instructions that employ both the M1 unit 223 and the N1 unit 224 together. The result is written into an instruction specified register of global scalar register file 211, L1/S1 local register file 212, M1/N1 local register file 213 or D1/D2 local register file 214.

Scalar data path side A 115 includes D1 unit 225 and D2 unit 226. D1 unit 225 and D2 unit 226 generally each accept two 64-bit operands and each produce one 64-bit result. D1 unit 225 and D2 unit 226 generally perform address calculations and corresponding load and store operations. D1 unit 225 is used for scalar loads and stores of 64 bits. D2 unit 226 is used for vector loads and stores of 512 bits. In this example, D1 unit 225 and D2 unit 226 also perform: swapping, pack and unpack on the load and store data; 64-bit SIMD arithmetic operations; and 64-bit bit-wise logical operations. D1/D2 local register file 214 stores base and offset addresses used in address calculations for the corresponding loads and stores. The two operands are each recalled from an instruction specified register in either global scalar register file 211 or D1/D2 local register file 214. The calculated result is written into an instruction specified register of global scalar register file 211, L1/S1 local register file 212, M1/N1 local register file 213 or D1/D2 local register file 214.

Vector data path side B 116 includes L2 unit 241. L2 unit 241 generally accepts two 512-bit operands and produces one 512-bit result. The two operands are each recalled from an instruction specified register in either global vector register file 231, L2/S2 local register file 232 or predicate register file 234. In this example, L2 unit 241 performs instructions similar to L1 unit 221 except on wider 512-bit data. The result may be written into an instruction specified register of global vector register file 231, L2/S2 local register file 232, M2/N2/C local register file 233 or predicate register file 234.

Vector data path side B 116 includes S2 unit 242. S2 unit 242 generally accepts two 512-bit operands and produces one 512-bit result. The two operands are each recalled from an instruction specified register in either global vector register file 231, L2/S2 local register file 232 or predicate register file 234. In this example, S2 unit 242 performs instructions similar to S1 unit 222. The result is written into an instruction specified register of global vector register file 231, L2/S2 local register file 232, M2/N2/C local register file 233 or predicate register file 234.

Vector data path side B 116 includes M2 unit 243. M2 unit 243 generally accepts two 512-bit operands and produces one 512-bit result. The two operands are each recalled from an instruction specified register in either global vector register file 231 or M2/N2/C local register file 233. In this example, M2 unit 243 performs instructions similar to M1 unit 223 except on wider 512-bit data. The result is written into an instruction specified register of global vector register file 231, L2/S2 local register file 232 or M2/N2/C local register file 233.

Vector data path side B 116 includes N2 unit 244. N2 unit 244 generally accepts two 512-bit operands and produces one 512-bit result. The two operands are each recalled from an instruction specified register in either global vector register file 231 or M2/N2/C local register file 233. In this example, N2 unit 244 performs the same type operations as M2 unit 243. There are also double operations referred to as dual issue instructions that employ both M2 unit 243 and the N2 unit 244 together. The result is written into an instruction specified register of global vector register file 231, L2/S2 local register file 232 or M2/N2/C local register file 233.

Vector data path side B 116 includes correlation (C) unit 245. C unit 245 generally accepts two 512-bit operands and produces one 512-bit result. The two operands are each recalled from an instruction specified register in either global vector register file 231 or M2/N2/C local register file 233. In this example, C unit 245 performs "Rake" and "Search" instructions that are used for WCDMA (wideband code division multiple access) encoding/decoding. In this example, C unit 245 can perform up to 512 multiplies per clock cycle of a 2-bit PN (pseudorandom number) and 8-bit I/Q (complex number), 8-bit and 16-bit Sum-of-Absolute-Difference (SAD) calculations, up to 512 SADs per clock cycle, horizontal add and horizontal min/max instructions, and vector permutes instructions. C unit 245 also contains 4 vector control registers (CUCR0 to CUCR3) used to control certain operations of C unit 245 instructions. Control registers CUCR0 to CUCR3 are used as operands in certain C unit 245 operations. In some examples, control registers CUCR0 to CUCR3 are used in control of a general permutation instruction (VPERM), and as masks for SIMD multiple DOT product operations (DOTPM) and SIMD multiple Sum-of-Absolute-Difference (SAD) operations. In further examples, control register CUCR0 is used to store the polynomials for Galois Field Multiply operations (GFMPY) and control register CUCR1 is used to store the Galois field polynomial generator function.

Vector data path side B 116 includes P unit 246. Vector predicate (P) unit 246 performs basic logic operations on registers of local predicate register file 234. P unit 246 has direct access to read from and write to predication register file 234. The logic operations include single register unary operations such as NEG (negate) which inverts each bit of the single register, BITCNT (bit count) which returns a count of the number of bits in the single register having a predetermined digital state (1 or 0), RMBD (right most bit detect) which returns a number of bit positions from the least significant bit position (right most) to a first bit position having a predetermined digital state (1 or 0), DECIMATE which selects every instruction specified Nth (1, 2, 4, etc.) bit to output, and EXPAND which replicates each bit an instruction specified N times (2, 4, etc.). The logic operations also include two register binary operations such as AND which is a bitwise AND of data of the two registers, NAND which is a bitwise AND and negate of data of the two registers, OR which is a bitwise OR of data of the two registers, NOR which is a bitwise OR and negate of data of the two registers, and XOR which is exclusive OR of data of the two registers. The logic operations include transfer of data from a predicate register of predicate register file 234 to another specified predicate register or to a specified data register in global vector register file 231. One use of P unit 246 is manipulation of the SIMD vector comparison results for use in control of a further SIMD vector operation. The BITCNT instruction can be used to count the number of 1's in a predicate register to determine the number of valid data elements from a predicate register.

Figure 3:
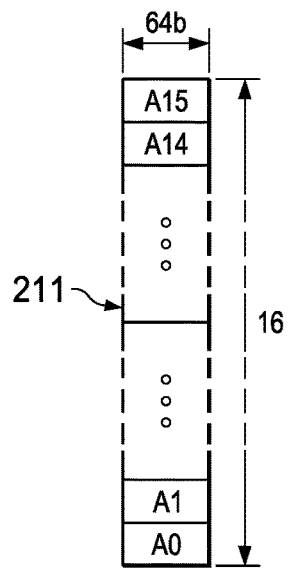
FIG. 3 illustrates a global scalar register file.

FIG. 3 illustrates global scalar register file 211. There are 16 independent 64-bit wide scalar registers designated A0 to A15. Each register of global scalar register file 211 can be read from or written to as 64-bits of scalar data. All scalar data path side A 115 functional units (L1 unit 221, S1 unit 222, M1 unit 223, N1 unit 224, D1 unit 225 and D2 unit 226) can read or write to global scalar register file 211. Global scalar register file 211 can be read from as 32-bits or as 64-bits and written to as 64-bits. The instruction executing determines the read data size. Vector data path side B 116 functional units (L2 unit 241, S2 unit 242, M2 unit 243, N2 unit 244, C unit 245 and P unit 246) can read from global scalar register file 211 via cross path 117 under restrictions that are described below.

Figure 4:
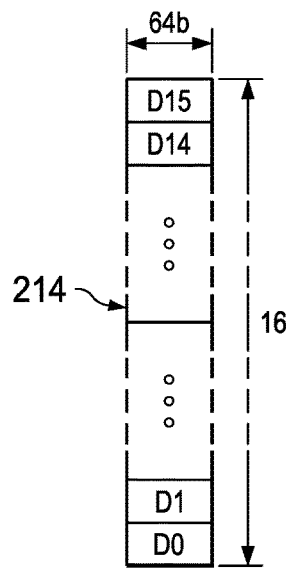
FIG. 4 illustrates a local scalar register file shared by arithmetic functional units.

FIG. 4 illustrates D1/D2 local register file 214. There are sixteen independent 64-bit wide scalar registers designated D0 to D16. Each register of D1/D2 local register file 214 is read from or written to as 64-bits of scalar data. All scalar data path side A 115 functional units (L1 unit 221, S1 unit 222, M1 unit 223, N1 unit 224, D1 unit 225 and D2 unit 226) can write to global scalar register file 211. Only D1 unit 225 and D2 unit 226 can read from D1/D2 local scalar register file 214. Data stored in D1/D2 local scalar register file 214 can include base addresses and offset addresses used in address calculation.

Figure 5:
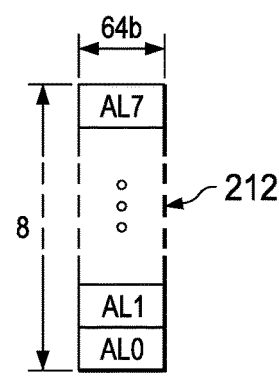
FIG. 5 illustrates a local scalar register file shared by multiply functional units.

FIG. 5 illustrates L1/S1 local register file 212. In this example, L1/S1 local register file 212 includes eight independent 64-bit wide scalar registers designated AL0 to AL7. In this example, the instruction coding permits L1/S1 local register file 212 to include up to 16 registers. In this example, eight registers are implemented to reduce circuit size and complexity. Each register of L1/S1 local register file 212 can be read from or written to as 64-bits of scalar data. All scalar data path side A 115 functional units (L1 unit 221, S1 unit 222, M1 unit 223, N1 unit 224, D1 unit 225 and D2 unit 226) can write to L1/S1 local scalar register file 212. L1 unit 221 and S1 unit 222 can read from L1/S1 local scalar register file 212.

Figure 6:
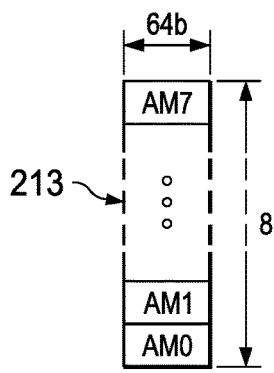
FIG. 6 illustrates a local scalar register file shared by load/store units.

FIG. 6 illustrates M1/N1 local register file 213. In this example, eight independent 64-bit wide scalar registers designated AM0 to AM7 are implemented. In this example, the instruction coding permits M1/N1 local register file 213 to include up to 16 registers. In this example, eight registers are implemented to reduce circuit size and complexity. Each register of M1/N1 local register file 213 can be read from or written to as 64-bits of scalar data. All scalar data path side A 115 functional units (L1 unit 221, S1 unit 222, M1 unit 223, N1 unit 224, D1 unit 225 and D2 unit 226) can write to M1/N1 local scalar register file 213. M1 unit 223 and N1 unit 224 can read from M1/N1 local scalar register file 213.

Figure 7:
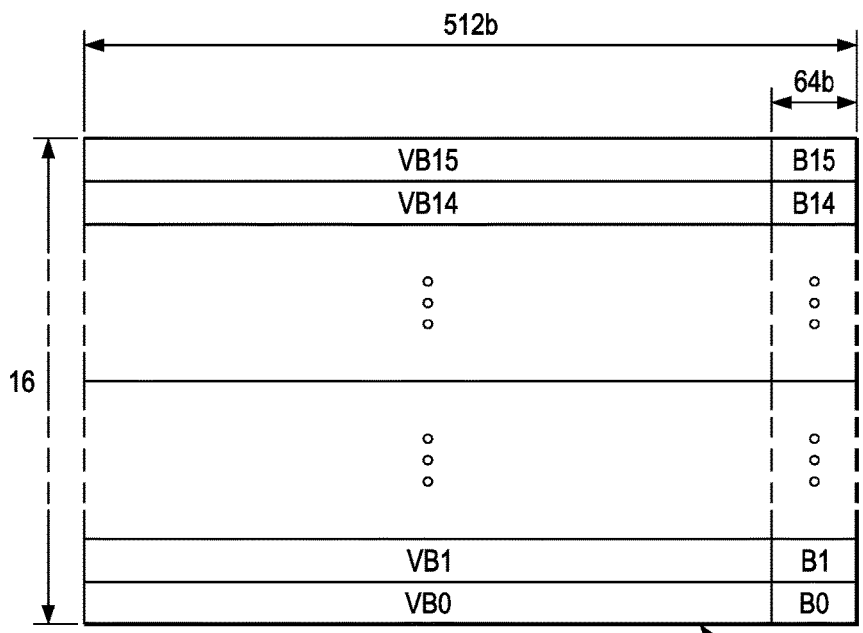
FIG. 7 illustrates a global vector register file.

FIG. 7 illustrates global vector register file 231. There are sixteen independent 512-bit wide vector registers. Each register of global vector register file 231 can be read from or written to as 64-bits of scalar data designated B0 to B15. Each register of global vector register file 231 can be read from or written to as 512-bits of vector data designated VB0 to VB15. The instruction type determines the data size. All vector data path side B 116 functional units (L2 unit 241, S2 unit 242, M2 unit 243, N2 unit 244, C unit 245 and P unit 246) can read or write to global vector register file 231. Scalar data path side A 115 functional units (L1 unit 221, S1 unit 222, M1 unit 223, N1 unit 224, D1 unit 225 and D2 unit 226) can read from global vector register file 231 via cross path 117 under restrictions that are described below.

Figure 8:
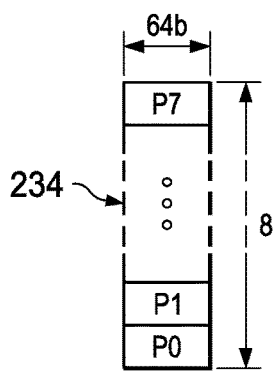
FIG. 8 illustrates a predicate register file.

FIG. 8 illustrates predicate (P) local register file 234. There are eight independent 64-bit wide registers designated P0 to P7. Each register of P local register file 234 can be read from or written to as 64-bits of scalar data. Vector data path side B 116 functional units L2 unit 241, S2 unit 242, C unit 244 and P unit 246 can write to P local register file 234. L2 unit 241, S2 unit 242 and P unit 246 can read from P local scalar register file 234. One use of P local register file 234 is writing one-bit SIMD vector comparison results from L2 unit 241, S2 unit 242 or C unit 244, manipulation of the SIMD vector comparison results by P unit 246, and use of the manipulated results in control of a further SIMD vector operation.

Figure 9:
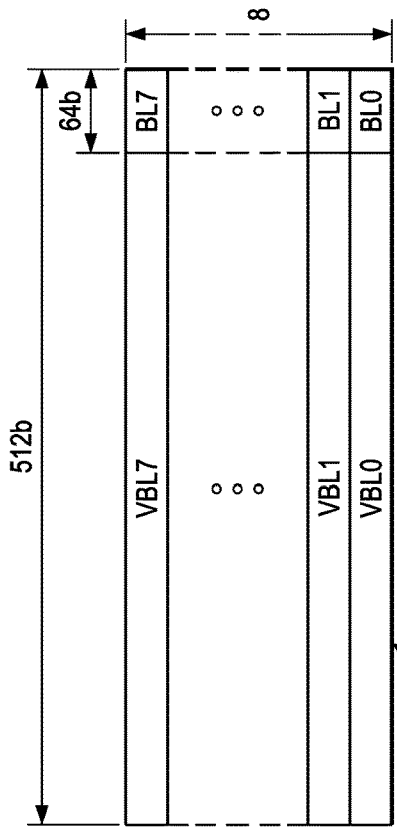
FIG. 9 illustrates a local vector register file shared by arithmetic functional units.

FIG. 9 illustrates L2/S2 local register file 232. In this example, eight independent 512-bit wide vector registers are implemented. In this example, the instruction coding permits L2/S2 local register file 232 to include up to sixteen registers. In this example, eight registers are implemented to reduce circuit size and complexity. Each register of L2/S2 local vector register file 232 can be read from or written to as 64-bits of scalar data designated BL0 to BL7. Each register of L2/S2 local vector register file 232 can be read from or written to as 512-bits of vector data designated VBL0 to VBL7. The instruction type determines the data size. All vector data path side B 116 functional units (L2 unit 241, S2 unit 242, M2 unit 243, N2 unit 244, C unit 245 and P unit 246) can write to L2/S2 local vector register file 232. L2 unit 241 and S2 unit 242 can read from L2/S2 local vector register file 232.

Figure 10:
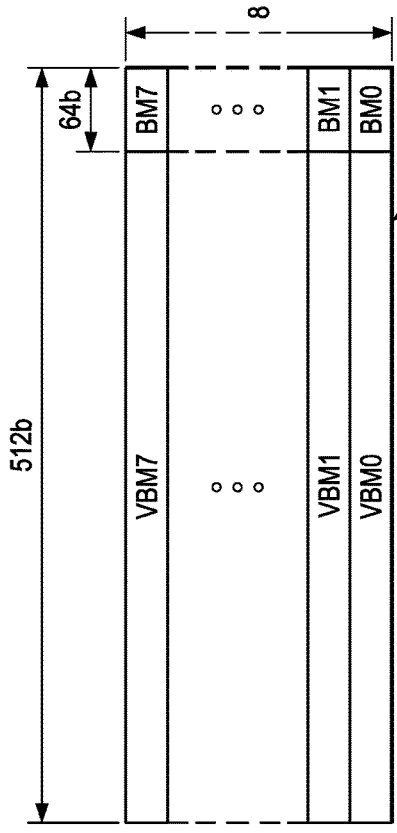
FIG. 10 illustrates a local vector register file shared by multiply and correlation functional units.

FIG. 10 illustrates M2/N2/C local register file 233. In this example, eight independent 512-bit wide vector registers are implemented. In this example, the instruction coding permits M2/N2/C local register file 233 to include up to sixteen registers. In this example, eight registers are implemented to reduce circuit size and complexity. Each register of M2/N2/C local vector register file 233 can be read from or written to as 64-bits of scalar data designated BM0 to BM7. Each register of M2/N2/C local vector register file 233 can be read from or written to as 512-bits of vector data designated VBM0 to VBM7. All vector data path side B 116 functional units (L2 unit 241, S2 unit 242, M2 unit 243, N2 unit 244, C unit 245 and P unit 246) can write to M2/N2/C local vector register file 233. M2 unit 243, N2 unit 244 and C unit 245 can read from M2/N2/C local vector register file 233.

The provision of global register files accessible by all functional units of a side and local register files accessible by some of the functional units of a side is a design choice. In another example, a different accessibility provision could be made, such as employing one type of register file corresponding to the global register files described herein.

Cross path 117 permits limited exchange of data between scalar data path side A 115 and vector data path side B 116. During each operational cycle one 64-bit data word can be recalled from global scalar register file A 211 for use as an operand by one or more functional units of vector data path side B 116 and one 64-bit data word can be recalled from global vector register file 231 for use as an operand by one or more functional units of scalar data path side A 115. Any scalar data path side A 115 functional unit (L1 unit 221, S1 unit 222, M1 unit 223, N1 unit 224, D1 unit 225 and D2 unit 226) can read a 64-bit operand from global vector register file 231. This 64-bit operand is the least significant bits of the 512-bit data in the accessed register of global vector register file 231. Multiple scalar data path side A 115 functional units can employ the same 64-bit cross path data as an operand during the same operational cycle. In one example, a single 64-bit operand is transferred from vector data path side B 116 to scalar data path side A 115 in a single operational cycle. Any vector data path side B 116 functional unit (L2 unit 241, S2 unit 242, M2 unit 243, N2 unit 244, C unit 245 and P unit 246) can read a 64-bit operand from global scalar register file 211. If the corresponding instruction is a scalar instruction, the cross-path operand data is treated as a 64-bit operand. If the corresponding instruction is a vector instruction, the upper 448 bits of the operand are zero filled. Multiple vector data path side B 116 functional units can employ the same 64-bit cross path data as an operand during the same operational cycle. In one example, a single 64-bit operand is transferred from scalar data path side A 115 to vector data path side B 116 in a single operational cycle.

Streaming engine 125 (FIG. 1) transfers data in certain restricted circumstances. Streaming engine 125 controls two data streams. A stream includes of a sequence of elements of a particular type. Programs that operate on streams read the data sequentially, operating on each element in turn. Every stream has the following basic properties: the stream data have a well-defined beginning and ending in time; the stream data have fixed element size and type throughout the stream; and, the stream data have a fixed sequence of elements. Once a stream is opened, streaming engine 125 performs the following operations: calculates the address; fetches the defined data type from L2 unified cache 130 (which may require cache service from a higher level memory, e.g., in the event of a cache miss in L2); performs data type manipulation such as zero extension, sign extension, data element sorting/swapping such as matrix transposition; and delivers the data directly to the programmed data register file within processor core 110. Streaming engine 125 is thus useful for real-time digital filtering operations on well-behaved data. Streaming engine 125 frees the corresponding processor from these memory fetch tasks, thus enabling other processing functions.

Streaming engine 125 provides several benefits. For example, streaming engine 125 permits multi-dimensional memory accesses, increases the available bandwidth to the functional units minimizes the number of cache miss stalls since the stream buffer bypasses L1D cache 123, and reduces the number of scalar operations required to maintain a loop. Streaming engine 125 also manages address pointers and handles address generation which frees up the address generation instruction slots and D1 unit 225 and D2 unit 226 for other computations.

Processor core 110 (FIG. 1) operates on an instruction pipeline. Instructions are fetched in instruction packets of fixed length as further described below. All instructions require the same number of pipeline phases for fetch and decode but require a varying number of execute phases.

Figure 11:
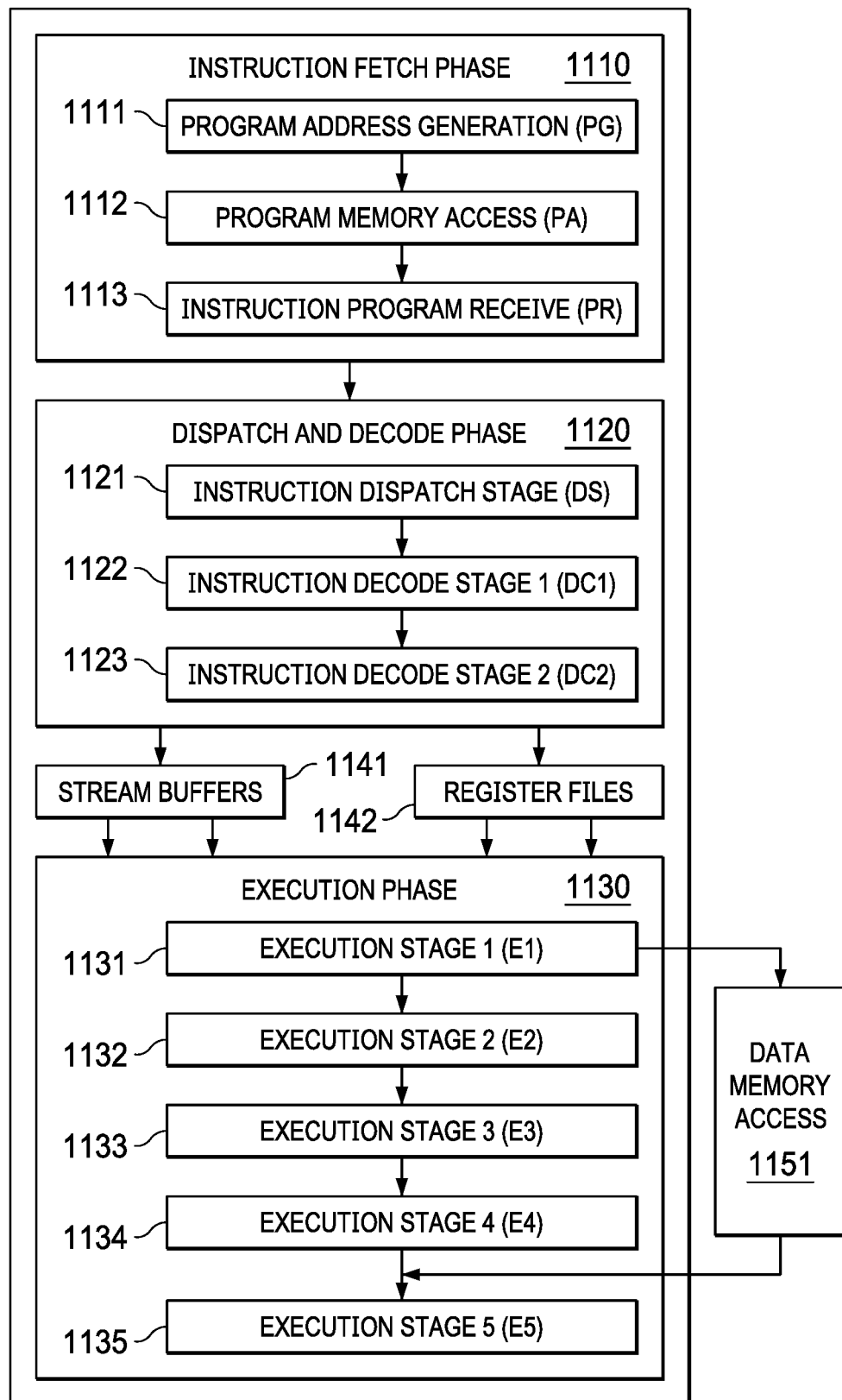
FIG. 11 illustrates pipeline phases of a processing unit.

FIG. 11 illustrates the following pipeline phases: program fetch phase 1110, dispatch and decode phases 1120, and execution phases 1130. Program fetch phase 1110 includes three stages for all instructions. Dispatch and decode phases 1120 include three stages for all instructions. Execution phase 1130 includes one to four stages depending on the instruction.

Fetch phase 1110 includes program address generation (PG) stage 1111, program access (PA) stage 1112 and program receive (PR) stage 1113. During program address generation stage 1111, the program address is generated in the processor and the read request is sent to the memory controller for the L1I cache. During the program access stage 1112, the L1I cache processes the request, accesses the data in its memory and sends a fetch packet to the processor boundary. During the program receive stage 1113, the processor registers the fetch packet.

Figure 12:
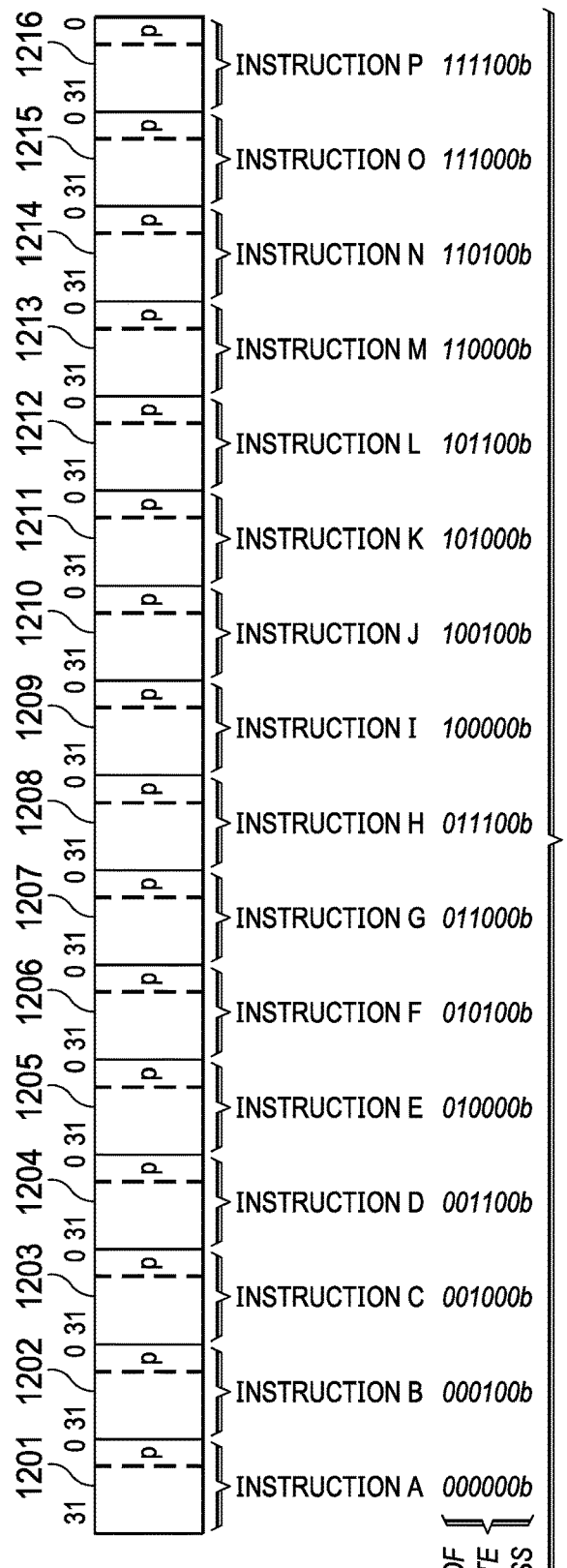
FIG. 12 illustrates sixteen instructions of a single fetch packet.

Instructions are fetched in a fetch packet that includes sixteen 32-bit wide words. FIG. 12 illustrates sixteen instructions 1201 to 1216 of a single fetch packet. Fetch packets are aligned on 512-bit (16-word) boundaries. This example employs a fixed 32-bit instruction length which enables decoder alignment. A properly aligned instruction fetch can load multiple instructions into parallel instruction decoders. Such a properly aligned instruction fetch can be achieved by predetermined instruction alignment when stored in memory by having fetch packets aligned on 512-bit boundaries coupled with a fixed instruction packet fetch. Conversely, variable length instructions require an initial step of locating each instruction boundary before decoding. A fixed length instruction set generally permits more regular layout of instruction fields which simplifies the construction of each decoder which is an advantage for a wide issue VLIW processor.

The execution of the individual instructions is partially controlled by a p bit in each instruction. In this example, the p bit is bit 0 of the 32-bit wide slot. The p bit determines whether an instruction executes in parallel with the next instruction. In this example, instructions are scanned from lower to higher address. If the p bit of an instruction is 1, then the next following instruction (higher memory address) is executed in parallel with (in the same cycle as) that instruction. If the p bit of an instruction is 0, then the next following instruction is executed in the cycle after the instruction.

Processor core 110 (FIG. 1) and L1I cache 121 pipelines (FIG. 1) are de-coupled from each other. Fetch packet returns from L1I cache can take a different number of clock cycles, depending on external circumstances such as whether there is a hit in L1I cache 121 or a hit in L2 combined cache 130. Therefore, program access stage 1112 can take several clock cycles instead of one clock cycle as in the other stages.

The instructions executing in parallel constitute an execute packet. In this example, an execute packet can contain up to sixteen 32-bit wide slots for sixteen instructions. No two instructions in an execute packet can use the same functional unit. A slot is one of five types: 1) a self-contained instruction executed on one of the functional units of processor core 110 (L1 unit 221, S1 unit 222, M1 unit 223, N1 unit 224, D1 unit 225, D2 unit 226, L2 unit 241, S2 unit 242, M2 unit 243, N2 unit 244, C unit 245 and P unit 246); 2) a unitless instruction such as a NOP (no operation) instruction or multiple NOP instructions; 3) a branch instruction; 4) a constant field extension; and 5) a conditional code extension. Some of these slot types are further explained herein.

Dispatch and decode phases 1120 (FIG. 11) include instruction dispatch to appropriate execution unit (DS) stage 1121, instruction pre-decode (DC1) stage 1122, and instruction decode, operand read (DC2) stage 1123. During instruction dispatch to appropriate execution unit stage 1121, the fetch packets are split into execute packets and assigned to the appropriate functional units. During the instruction pre-decode stage 1122, the source registers, destination registers, and associated paths are decoded for the execution of the instructions in the functional units. During the instruction decode, operand read stage 1123, more detailed unit decodes are performed and operands are read from the register files.

Execution phase 1130 includes execution (E1 to E5) stages 1131 to 1135. Different types of instructions require different numbers of such stages to complete execution. The execution stages of the pipeline play an important role in understanding the device state at processor cycle boundaries.

During E1 stage 1131, the conditions for the instructions are evaluated and operands are operated on. As illustrated in FIG. 11, E1 stage 1131 can receive operands from a stream buffer 1141 and one of the register files shown schematically as 1142. For load and store instructions, address generation is performed, and address modifications are written to a register file. For branch instructions, the branch fetch packet in PG phase is affected. As illustrated in FIG. 11, load and store instructions access memory here shown schematically as memory 1151. For single-cycle instructions, results are written to a destination register file when any conditions for the instructions are evaluated as true. If a condition is evaluated as false, the instruction does not write any results or have any pipeline operation after E1 stage 1131.

During E2 stage 1132, load instructions send the address to memory. Store instructions send the address and data to memory. Single-cycle instructions that saturate results set the SAT bit in the control status register (CSR) if saturation occurs. For 2-cycle instructions, results are written to a destination register file.

During E3 stage 1133, data memory accesses are performed. Any multiply instructions that saturate results set the SAT bit in the control status register (CSR) if saturation occurs. For 3-cycle instructions, results are written to a destination register file.

During E4 stage 1134, load instructions bring data to the processor boundary. For 4-cycle instructions, results are written to a destination register file.

During E5 stage 1135, load instructions write data into a register as illustrated schematically in FIG. 11 with input from memory 1151 to E5 stage 1135.

FIG. 13 illustrates an example of instruction coding 1300 used by processing unit core 110. The illustrated instruction format is for a two source arithmetic instruction. Other instruction coding may also be used. In general, instructions include 32 bits and control the operation of one of the individually controllable functional units (L1 unit 221, S1 unit 222, M1 unit 223, N1 unit 224, D1 unit 225, D2 unit 226, L2 unit 241, S2 unit 242, M2 unit 243, N2 unit 244, C unit 245 and P unit 246).

In the example of FIG. 13, the dst field 1301 specifies a register in a corresponding register file as the destination of the instruction results. The src2/cst field 1302 (bits 18 to 22) has several meanings depending on the instruction opcode field 1304 and the unit field 1305. One meaning specifies a register of a corresponding register file as the second operand. Another meaning is an immediate constant. Depending on the instruction type, the field 1302 is treated as an unsigned integer and zero extended to a specified data length or is treated as a signed integer and sign extended to the specified data length.

The src1 field 1303 specifies a register in a corresponding register file as the first source operand. The opcode field 1304 specifies the type of instruction. The unit field 1305 in combination with the side bit ("s" bit) 1306 indicates which of the functional units to be used to execute the instruction. A detailed explanation of the opcode is beyond the scope of this description except for the instruction options described below.

The s bit 1306 designates scalar data path side A 115 or vector data path side B 116. If s=0, then scalar data path side A 115 is selected which limits the functional unit to L1 unit 221, S1 unit 222, M1 unit 223, N1 unit 224, D1 unit 225 and D2 unit 226 and the corresponding register files illustrated in FIG. 2. Similarly, s=1 selects vector data path side B 116 which limits the functional unit to L2 unit 241, S2 unit 242, M2 unit 243, N2 unit 244, P unit 246 and the corresponding register files illustrated in FIG. 2.

The p bit 1307 marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to sixteen instructions. Each instruction in an execute packet uses a different functional unit.

Most instructions of the processing unit core 110 do not include direct encoding for conditional execution. However, instructions can be made conditional. The act of making an instruction conditional is called predication and the register storing the condition is referred to as a predicate register. An execute packet can include two 32-bit condition code extension slots which encode 4-bit condition information for instructions in the same execute packet. The condition code slots are referred to as condition code extension slot 0 and condition code extension slot 1 and the 4-bit condition information is referred to as a creg/z field herein.

Table 1 shows the encodings of a creg/z field. The creg bits identify the predicate register and the z bit indicates whether the predication is based on zero or not zero in the predicate register. Execution of a conditional instruction is conditional upon the value stored in the specified data register. If z=1, the test is for equality with zero. If z=0, the test is for nonzero. The case of creg=0 and z=0 is treated as true to allow unconditional instruction execution. Note that "z" in the z bit column refers to the zero/not zero comparison selection noted above and "x" is a don't care state.

TABLE 1

| Meaning | creg | | | z |
|---|---|---|---|---|
| Unconditional | 0 | 0 | 0 | 0 |
| Reserved | 0 | 0 | 0 | 1 |
| A0 | 0 | 0 | 1 | z |
| A1 | 0 | 1 | 0 | z |
| A2 | 0 | 1 | 1 | z |
| A3 | 1 | 0 | 0 | z |
| A4 | 1 | 0 | 1 | z |
| A5 | 1 | 1 | 0 | z |
| Reserved | 1 | 1 | x | x |

FIG. 14 illustrates the coding for condition code extension slot 0 1400. Field 1401 specifies four creg/z bits assigned to the L1 unit 221 instruction, field 1402 specifies four creg/z bits assigned to the L2 unit 241 instruction, field 1403 specifies four creg/z bits assigned to the S1 unit 222 instruction, field 1404 specifies four creg/z bits assigned to the S2 unit 242 instruction, field 1405 specifies four creg/z bits assigned to the D1 unit 225 instruction, field 1406 specifies four creg/z bits assigned to the D2 unit 226 instruction, field 1407 is unused/reserved, and field 1408 is coded as a set of unique bits (CCEX0) that identify the condition code extension slot 0. When the unique ID of condition code extension slot 0 is detected, the creg/z bits are employed to control conditional execution of any corresponding L1 unit 221, L2 unit 241, S1 unit 222, S2 unit 242, D1 unit 225, and D2 unit 226 instruction in the same execution packet. Note that a properly coded condition code extension slot 0 can make some instructions in an execute packet conditional and some unconditional.

FIG. 15 illustrates the coding for condition code extension slot 1 1500. Field 1501 specifies four creg/z bits assigned to the M1 unit 223 instruction, field 1502 specifies four creg/z bits assigned to the M2 unit 243 instruction, field 1503 specifies four creg/z bits assigned to the C unit 245 instruction, field 1504 specifies four creg/z bits assigned to the N1 unit 224 instruction, field 1505 specifies four creg/z bits assigned to the N2 unit 244 instruction, field 1506 is unused/reserved, and field 1507 is coded as a set of unique bits (CCEX1) that identify the condition code extension slot 1. When the unique ID of condition code extension slot 1 is detected, the corresponding creg/z bits are employed to control conditional execution of any M1 unit 223, M2 unit 243, C unit 245, N1 unit 224 and N2 unit 244 instruction in the same execution packet.

Referring again to FIG. 13, in some instructions, a bit in the opcode field 1304 referred to as the constant extension bit can be encoded to indicate that a constant in the src2/CST field 1302 is to be extended. An execute packet can include two 32-bit constant extension slots that can each store 27-bits to be concatenated as high order bits with a 5-bit constant in the field 1302 to form a 32-bit constant. FIG. 16 illustrates the fields of constant extension slot 0 1600. Field 1601 stores the most significant 27 bits of an extended 32-bit constant. Field 1602 is coded as a set of unique bits (CSTX0) to identify the constant extension slot 0. In this example, constant extension slot 0 1600 can be used to extend the constant of one of an L1 unit 221 instruction, data in a D1 unit 225 instruction, an S2 unit 242 instruction, an offset in a D2 unit 226 instruction, an M2 unit 243 instruction, an N2 unit 244 instruction, a branch instruction, or a C unit 245 instruction in the same execute packet. Constant extension slot 1 is similar to constant extension slot 0 except the slot is coded with a set of unique bits (CSTX1) to identify the constant extension slot 1. In this example, constant extension slot 1 can be used to extend the constant of one of an L2 unit 241 instruction, data in a D2 unit 226 instruction, an S1 unit 222 instruction, an offset in a D1 unit 225 instruction, an M1 unit 223 instruction or an N1 unit 224 instruction in the same execute packet.

Constant extension slot 0 and constant extension slot 1 are used as follows. Instruction decoder 113 determines that a constant is in field 1302, referred to as an immediate field, from the instruction opcode bits and whether or not the constant is to be extended from the previously mentioned constant extension bit in the opcode field 1304. If instruction decoder 113 detects a constant extension slot 0 or a constant extension slot 1, instruction decoder 113 checks the instructions within the execute packet for an instruction corresponding to the detected constant extension slot. A constant extension is made if one corresponding instruction has a constant extension bit equal to 1.

Figure 17:
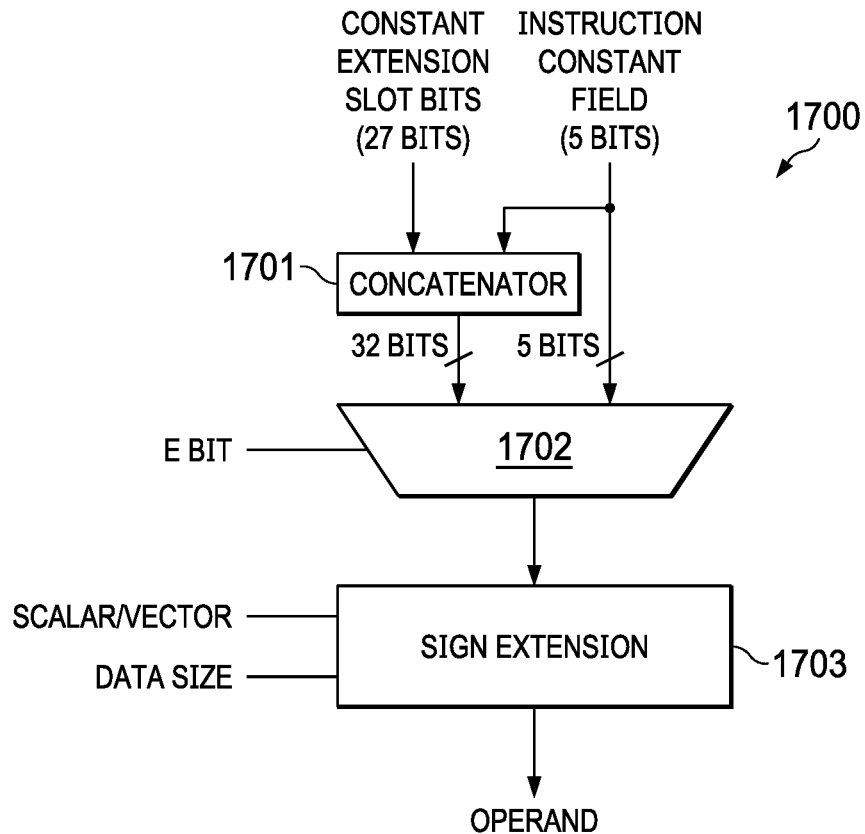
FIG. 17 is a partial block diagram illustrating constant extension.

FIG. 17 is a partial block diagram 1700 illustrating constant extension. FIG. 17 assumes that instruction decoder 113 (FIG. 1) detects a constant extension slot and a corresponding instruction in the same execute packet. Instruction decoder 113 supplies the twenty-seven extension bits from field 1601 of the constant extension slot and the five constant bits from field 1302 from the corresponding instruction to concatenator 1701. Concatenator 1701 forms a single 32-bit word from these two parts. In this example, the twenty-seven extension bits from field 1601 of the constant extension slot are the most significant bits and the five constant bits from field 1302 are the least significant bits. The combined 32-bit word is supplied to one input of multiplexer 1702. The five constant bits from the corresponding instruction field 1302 supply a second input to multiplexer 1702. Selection of multiplexer 1702 is controlled by the status of the constant extension bit. If the constant extension bit is 1, multiplexer 1702 selects the concatenated 32-bit input. If the constant extension bit is 0, multiplexer 1702 selects the five constant bits from the corresponding instruction field 1302. The output of multiplexer 1702 supplies an input of sign extension unit 1703.

Sign extension unit 1703 forms the final operand value from the input from multiplexer 1703. Sign extension unit 1703 receives control inputs scalar/vector and data size. The scalar/vector input indicates whether the corresponding instruction is a scalar instruction or a vector instruction. The functional units of data path side A 115 (L1 unit 221, S1 unit 222, M1 unit 223, N1 unit 224, D1 unit 225 and D2 unit 226) perform scalar instructions. Any instruction directed to one of these functional units is a scalar instruction. Data path side B functional units L2 unit 241, S2 unit 242, M2 unit 243, N2 unit 244 and C unit 245 can perform scalar instructions or vector instructions. Instruction decoder 113 determines whether the instruction is a scalar instruction or a vector instruction from the opcode bits. P unit 246 may perform scalar instructions. The data size can be eight bits (byte B), sixteen bits (half-word H), 32 bits (word W), or 64 bits (double word D). Table 2 lists the operation of sign extension unit 1703 for the various options.

TABLE 2

| Instruction Type | Operand Size | Constant Length | Action |
|---|---|---|---|
| Scalar | B/H/W/D | 5 bits | Sign extend to 64 bits |
| Scalar | B/H/W/D | 32 bits | Sign extend to 64 bits |
| Vector | B/H/W/D | 5 bits | Sign extend to operand size and replicate across whole vector |
| Vector | B/H/W | 32 bits | Replicate 32-bit constant across each 32-bit (W) lane |
| Vector | D | 32 bits | Sign extend to 64 bits and replicate across each 64-bit (D) lane |

An execute packet can include a constant extension slot 0 or 1 and more than one corresponding instruction marked constant extended. For such an occurrence, for constant extension slot 0, more than one of an L1 unit 221 instruction, data in a D1 unit 225 instruction, an S2 unit 242 instruction, an offset in a D2 unit 226 instruction, an M2 unit 243 instruction or an N2 unit 244 instruction in an execute packet can indicate constant extension. For such an occurrence, for constant extension slot 1, more than one of an L2 unit 241 instruction, data in a D2 unit 226 instruction, an S1 unit 222 instruction, an offset in a D1 unit 225 instruction, an M1 unit 223 instruction or an N1 unit 224 instruction in an execute packet can indicate constant extension. In one example, instruction decoder 113 determines that such an occurrence is an invalid operation and not supported. Alternately, the combination can be supported with extension bits of the constant extension slot applied to each corresponding functional unit instruction marked constant extended.

L1 unit 221, S1 unit 222, L2 unit 241, S2 unit 242 and C unit 245 often operate in a single instruction multiple data (SIMD) mode. In this SIMD mode, the same instruction is applied to packed data from the two operands. Each operand holds multiple data elements disposed in predetermined slots. SIMD operation is enabled by carry control at the data boundaries. Such carry control enables operations on varying data widths.

Figure 18:
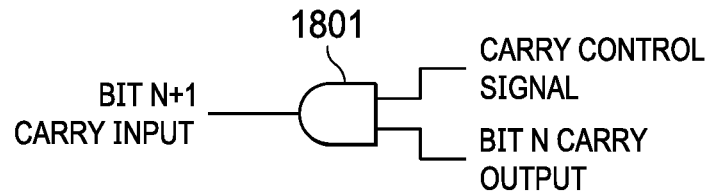
FIG. 18 illustrates carry control for SIMD operations.

FIG. 18 illustrates the carry control logic. AND gate 1801 receives the carry output of bit N within the operand wide arithmetic logic unit (64 bits for scalar data path side A 115 functional units and 512 bits for vector data path side B 116 functional units). AND gate 1801 also receives a carry control signal which is further explained below. The output of AND gate 1801 is supplied to the carry input of bit N+1 of the operand wide arithmetic logic unit. AND gates such as AND gate 1801 are disposed between every pair of bits at a possible data boundary. For example, for 8-bit data such an AND gate will be between bits 7 and 8, bits 15 and 16, bits 23 and 24, etc. Each such AND gate receives a corresponding carry control signal. If the data size is the minimum size, each carry control signal is 0, effectively blocking carry transmission between the adjacent bits. The corresponding carry control signal is 1 if the selected data size requires both arithmetic logic unit sections. Table 3 below shows example carry control signals for the case of a 512-bit wide operand as used by vector data path side B 116 functional units which can be divided into sections of 8 bits, 16 bits, 32 bits, 64 bits, 128 bits or 256 bits. In Table 3, the upper 32 bits control the upper bits (bits 128 to 511) carries and the lower 32 bits control the lower bits (bits 0 to 127) carries. No control of the carry output of the most significant bit is needed, thus only 63 carry control signals are required.

TABLE 3

| Data Size | Carry Control Signals |
|---|---|
| 8 bits (B) | –000 0000 0000 0000 0000 0000 0000 0000 0000 0000 0000 0000 0000 0000 0000 0000 |
| 16 bits (H) | –101 0101 0101 0101 0101 0101 0101 0101 0101 0101 0101 0101 0101 0101 0101 0101 |
| 32 bits (W) | –111 0111 0111 0111 0111 0111 0111 0111 0111 0111 0111 0111 0111 0111 0111 0111 |
| 64 bits (D) | –111 1111 0111 1111 0111 1111 0111 1111 0111 1111 0111 1111 0111 1111 0111 1111 |
| 128 bits | –111 1111 1111 1111 0111 1111 1111 1111 0111 1111 1111 1111 0111 1111 1111 1111 |
| 256 bits | –111 1111 1111 1111 1111 1111 1111 1111 0111 1111 1111 1111 1111 1111 1111 1111 |

Operation on data sizes that are integer powers of 2 ($2^N$) is common. However, the carry control technique is not limited to integer powers of 2 and can be applied to other data sizes and operand widths.

In this example, at least L2 unit 241 and S2 unit 242 employ two types of SIMD instructions using registers in predicate register file 234. In this example, the SIMD vector predicate instructions operate on an instruction specified data size. The data sizes include byte (8 bit) data, half word (16 bit) data, word (32 bit) data, double word (64 bit) data, quad word (128 bit) data and half vector (256 bit) data. In the first of these instruction types, the functional unit (L2 unit 241 or S2 unit 242) performs a SIMD comparison on packed data in two general data registers and supplies results to a predicate data register. The instruction specifies a data size, the two general data register operands, and the destination predicate register. In this example, each predicate data register includes one bit corresponding to each minimal data size portion of the general data registers. In the current example, the general data registers are 512 bits (64 bytes) and the predicate data registers are 64 bits (8 bytes). Each bit of a predicate data register corresponds to eight bits of a general data register. The comparison is performed on a specified data size (8, 16, 32, 64, 128 or 256 bits). If the comparison is true, then the functional unit supplies 1's to all predicate register bits corresponding to that data size portion. If the comparison is false, the functional unit supplies zeroes to the predicate register bits corresponding to that data size portion. In this example, the enabled comparison operations include: less than, greater than, and equal to.

In the second of the instruction types, the functional unit (L2 unit 241 or S2 unit 242) separately performs a first SIMD operation or a second SIMD operation on packed data in general data registers based upon the state of data in a predicate data register. The instruction specifies a data size, one or two general data register operands, a controlling predicate register, and a general data register destination. For example, a functional unit can select, for each data sized portion of two vector operands, a first data element of a first operand or a second data element of a second operand dependent upon the 1/0 state of corresponding bits in the predicate data register to store in the destination register. In another example, the data elements of a single vector operand can be saved to memory or not saved dependent upon the data of the corresponding bits of the predicate register.

The operations of P unit 245 permit a variety of compound vector SIMD operations based upon more than one vector comparison. For example, a range determination can be made using two comparisons. In a SIMD operation, a candidate vector is compared with a vector reference having the minimum of the range packed within a data register. The greater than result is scalar data with bits corresponding to the SIMD data width set to 0 or 1 depending upon the SIMD comparison and is stored in a predicate data register. Another SIMD comparison of the candidate vector is performed with another reference vector having the maximum of the range packed within a different data register produces another scalar with less than results stored in another predicate register. The P unit then ANDs the two predicate registers. The AND result indicates whether each SIMD data part of the candidate vector is within range or out of range. A P unit BITCNT instruction of the AND result can produce a count of the data elements within the comparison range. The P unit NEG function can be used to convert: a less than comparison result to a greater than or equal comparison result; a greater than comparison result to a less than or equal to comparison result; or, an equal to comparison result to a not equal to comparison result.

Figure 19:
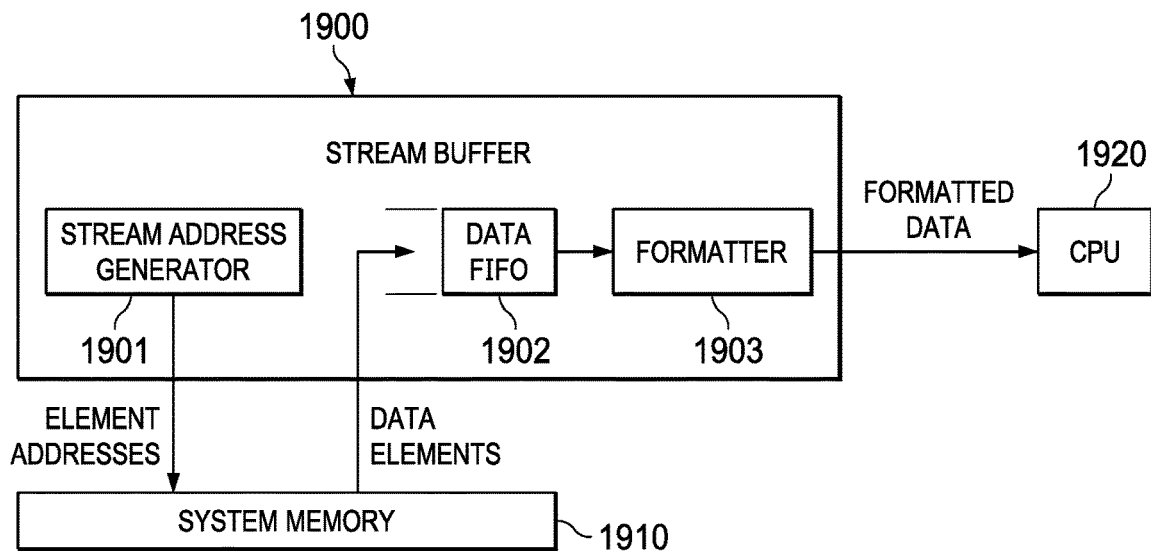
FIG. 19 illustrates a conceptual view of streaming engines.

FIG. 19 is a conceptual view of the streaming engine 125 of the example processor 100 of FIG. 1. FIG. 19 illustrates the processing of a single stream representative of the two streams controlled by streaming engine 125. Streaming engine 1900 includes stream address generator 1901. Stream address generator 1901 sequentially generates addresses of the elements of the stream and supplies these element addresses to system memory 1910. Memory 1910 recalls data stored at the element addresses (data elements) and supplies these data elements to data first-in-first-out (FIFO) buffer 1902. Data FIFO buffer 1902 provides buffering between memory 1910 and processor 1920. Data formatter 1903 receives the data elements from data FIFO memory 1902 and provides data formatting according to the stream definition. This process is described in more detail herein. Streaming engine 1900 supplies the formatted data elements from data formatter 1903 to the processor 1920. A program executing on processor 1920 consumes the data and generates an output.

Stream elements typically reside in system memory. The memory imposes no particular structure upon the stream. Programs define streams and thereby impose structure by specifying the stream attributes such as address of the first element of the stream, size and type of the elements in the stream, formatting for data in the stream, and the address sequence associated with the stream.

The streaming engine defines an address sequence for elements of the stream in terms of a pointer walking through memory. A multiple-level nested loop controls the path the pointer takes. An iteration count for a loop level indicates the number of times the level repeats. A dimension gives the distance between pointer positions of the loop level.

In a basic forward stream, the innermost loop consumes physically contiguous elements from memory as the implicit dimension of the innermost loop is one element. The pointer moves from element to element in consecutive, increasing order. In each level outside the inner loop, that loop moves the pointer to a new location based on the size of the dimension of the loop level. This form of addressing allows programs to specify regular paths through memory using a small number of parameters. Table 4 lists the addressing parameters of a basic stream. In this example, ELEM_BYTES ranges from 1 to 64 bytes as shown in Table 5.

TABLE 4

| Parameter | Definition |
| --- | --- |
| ELEM_BYTES | Size of each element in bytes |
| ICNT0 | Number of iterations for the innermost loop level 0. At loop level 0 all elements are physically contiguous. Implied DIM0 = ELEM_BYTES |
| ICNT1 | Number of iterations for loop level 1 |
| DIM1 | Number of bytes between the starting points for consecutive iterations of loop level 1 |
| ICNT2 | Number of iterations for loop level 2 |
| DIM2 | Number of bytes between the starting points for consecutive iterations of loop level 2 |
| ICNT3 | Number of iterations for loop level 3 |
| DIM3 | Number of bytes between the starting points for consecutive iterations of loop level 3 |
| ICNT4 | Number of iterations for loop level 4 |
| DIM4 | Number of bytes between the starting points for consecutive iterations of loop level 4 |
| ICNT5 | Number of iterations for loop level 5 |
| DIM5 | Number of bytes between the starting points for consecutive iterations of loop level 5 |

TABLE 5

| ELEM_BYTES | Stream Element Length |
| --- | --- |
| 000 | 1 byte |
| 001 | 2 bytes |
| 010 | 4 bytes |
| 011 | 8 bytes |
| 100 | 16 bytes |
| 101 | 32 bytes |
| 110 | 64 bytes |
| 111 | Reserved |

The definition above maps consecutive elements of the stream to increasing addresses in memory which is appropriate for many algorithms. Some algorithms are better served by reading elements in decreasing memory address order or reverse stream addressing. For example, a discrete convolution computes vector dot-products as per $$(f*g)[t]=\Sigma_{x=-\infty}^{\infty}f[x]g[t-x]$$

where f[ ] and g[ ] represent arrays in memory. For each output, the algorithm reads f[ ] in the forward direction and reads g[ ] in the reverse direction. Practical filters limit the range of indices for [x] and [t−x] to a finite number of elements. To support this pattern, the streaming engine supports reading elements in decreasing address order.

Matrix multiplication presents a unique problem to the streaming engine. Each element in the matrix product is a vector dot product between a row from the first matrix and a column from the second. Programs typically store matrices in row-major or column-major order. Row-major order stores all the elements of a single row contiguously in memory. Column-major order stores all elements of a single column contiguously in memory. Matrices are typically stored in the same order as the default array order for the language. As a result, only one of the two matrices in a matrix multiplication map on to the 2-dimensional stream definition of the streaming engine. In a typical example, an index steps through columns on one array and rows of the other array. The streaming engine supports implicit matrix transposition with transposed streams. Transposed streams avoid the cost of explicitly transforming the data in memory. Instead of accessing data in strictly consecutive-element order, the streaming engine effectively interchanges the inner two loop dimensions of the traversal order, fetching elements along the second dimension into contiguous vector lanes.

This algorithm works but is impractical to implement for small element sizes. Some algorithms work on matrix tiles which are multiple columns and rows together. Therefore, the streaming engine defines a separate transposition granularity. The hardware imposes a minimum granularity. The transpose granularity needs to be at least as large as the element size. Transposition granularity causes the streaming engine to fetch one or more consecutive elements from dimension 0 before moving along dimension 1. When the granularity equals the element size, a single column from a row-major array is fetched. Otherwise, the granularity specifies fetching two, four or more columns at a time from a row-major array. This is also applicable for column-major layout by exchanging row and column in the description. A parameter GRANULE indicates the transposition granularity in bytes.

Another common matrix multiplication technique exchanges the innermost two loops of the matrix multiply. The resulting inner loop no longer reads down the column of one matrix while reading across the row of another. For example, the algorithm may hoist one term outside the inner loop, replacing it with the scalar value. The innermost loop can be implemented with a single scalar by vector multiply followed by a vector add. Or, the scalar value can be duplicated across the length of the vector and a vector by vector multiply used. The streaming engine of this example directly supports the latter case and related use models with an element duplication mode. In this mode, the streaming engine reads a granule smaller than the full vector size and replicates that granule to fill the next vector output.

The streaming engine treats each complex number as a single element with two sub-elements that give the real and imaginary (rectangular) or magnitude and angle (polar) portions of the complex number. Not all programs or peripherals agree what order these sub-elements should appear in memory. Therefore, the streaming engine offers the ability to swap the two sub-elements of a complex number with no cost. The feature swaps the halves of an element without interpreting the contents of the element and can be used to swap pairs of sub-elements of any type, not just complex numbers.

Algorithms generally prefer to work at high precision, but high precision values require more storage and bandwidth than lower precision values. Commonly, programs store data in memory at low precision, promote those values to a higher precision for calculation, and then demote the values to lower precision for storage. The streaming engine supports such operations directly by allowing algorithms to specify one level of type promotion. In this example, every sub-element can be promoted to a larger type size with either sign or zero extension for integer types. In some examples, the streaming engine supports floating point promotion, promoting 16-bit and 32-bit floating point values to 32-bit and 64-bit formats, respectively.

While the streaming engine defines a stream as a discrete sequence of data elements, the processing unit core 110 consumes data elements packed contiguously in vectors. The vectors resemble streams as the vectors contain multiple homogeneous elements with some implicit sequence. Because the streaming engine reads streams, but the processing unit core 110 consumes vectors, the streaming engine maps streams onto vectors in a consistent way.

Vectors are divided into equal-sized lanes, each lane allocated to storing a sub-element. The processing unit core 110 designates the rightmost lane of the vector as lane 0, regardless of current endian mode. Lane numbers increase right-to-left. The actual number of lanes within a vector varies depending on the length of the vector and the data size of the sub-element. Further, the lanes may be referred to as lanes, vector lanes, or SIMD lanes herein.

Figure 20:
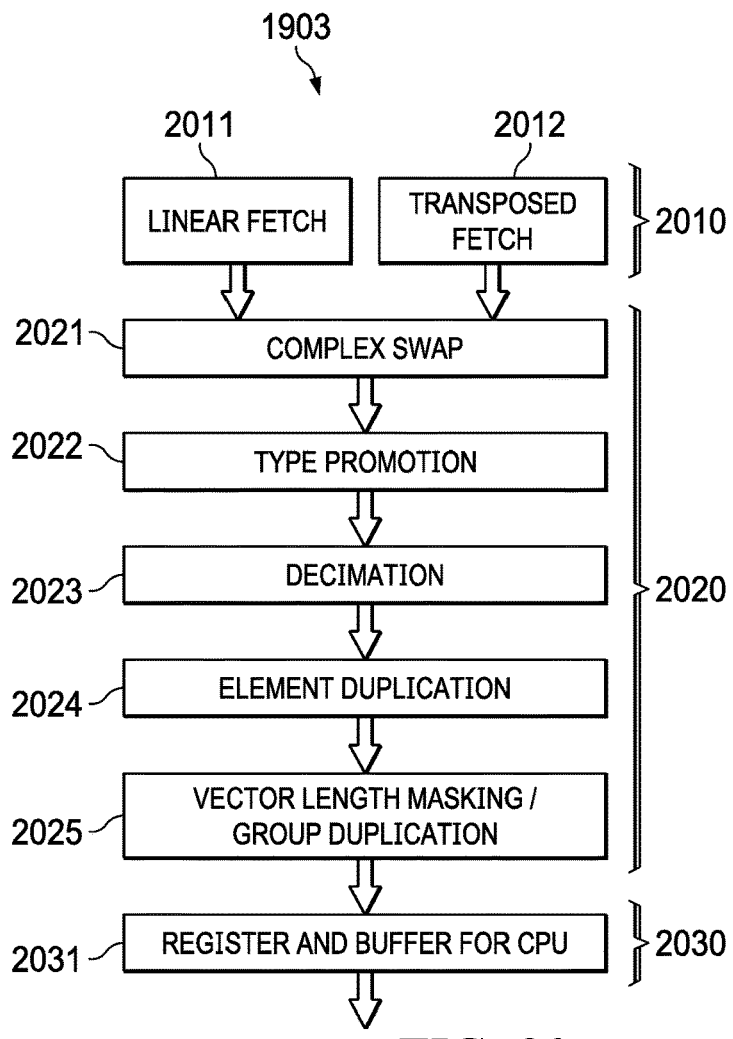
FIG. 20 illustrates a sequence of formatting operations.

FIG. 20 illustrates the sequence of the formatting operations of formatter 1903. Formatter 1903 includes three sections: input section 2010, formatting section 2020, and output section 2030. Input section 2010 receives the data recalled from system memory 1910 as accessed by stream address generator 1901. The data can be via linear fetch stream 2011 or transposed fetch stream 2012.

Formatting section 2020 includes various formatting blocks. The formatting performed within formatter 1903 by the blocks is further described below. Complex swap block 2021 optionally swaps two sub-elements forming a complex number element. Type promotion block 2022 optionally promotes each data element into a larger data size. Promotion includes zero extension for unsigned integers and sign extension for signed integers. Decimation block 2023 optionally decimates the data elements. In this example, decimation can be 2:1 retaining every other data element or 4:1 retaining every fourth data element. Element duplication block 2024 optionally duplicates individual data elements. In this example, the data element duplication is an integer power of 2 ($2^N$, where N is an integer) including 2×, 4×, 8×, 16×, 32× and 64×. In this example, data duplication can extend over multiple destination vectors. Vector length masking/group duplication block 2025 has two primary functions. An independently specified vector length VECLEN controls the data elements supplied to each output data vector. When group duplication is off, excess lanes in the output data vector are zero filled and these lanes are marked invalid. When group duplication is on, input data elements of the specified vector length are duplicated to fill the output data vector.

Output section 2030 holds the data for output to the corresponding functional units. Register and buffer for processor 2031 stores a formatted vector of data to be used as an operand by the functional units of processing unit core 110 (FIG. 1).

FIG. 21 illustrates an example of lane allocation in a vector. Vector 2100 is divided into eight 64-bit lanes (8×64 bits=512 bits, the vector length). Lane 0 includes bits 0 to 63, lane 1 includes bits 64 to 127, lane 2 includes bits 128 to 191, lane 3 includes bits 192 to 255, lane 4 includes bits 256 to 319, lane 5 includes bits 320 to 383, lane 6 includes bits 384 to 447, and lane 7 includes bits 448 to 511.

FIG. 22 illustrates another example of lane allocation in a vector. Vector 2210 is divided into sixteen 32-bit lanes (16×32 bits=512 bits, the vector length). Lane 0 includes bits 0 to 31, lane 1 includes bits 32 to 63, lane 2 includes bits 64 to 95, lane 3 includes bits 96 to 127, lane 4 includes bits 128 to 159, lane 5 includes bits 160 to 191, lane 6 includes bits 192 to 223, lane 7 includes bits 224 to 255, lane 8 includes bits 256 to 287, lane 9 includes bits 288 to 319, lane 10 includes bits 320 to 351, lane 11 includes bits 352 to 383, lane 12 includes bits 384 to 415, lane 13 includes bits 416 to 447, lane 14 includes bits 448 to 479, and lane 15 includes bits 480 to 511.

The streaming engine maps the innermost stream dimension directly to vector lanes. The streaming engine maps earlier elements within the innermost stream dimension to lower lane numbers and later elements to higher lane numbers, regardless of whether the stream advances in increasing or decreasing address order. Whatever order the stream defines, the streaming engine deposits elements in vectors in increasing-lane order. For non-complex data, the streaming engine places the first element in lane 0 of the vector processing unit core 110 (FIG. 1) fetches, the second in lane 1, and so on. For complex data, the streaming engine places the first element in lanes 0 and 1, the second element in lanes 2 and 3, and so on. Sub-elements within an element retain the same relative ordering regardless of the stream direction. For non-swapped complex elements, the sub-elements with the lower address of each pair are placed in the even numbered lanes, and the sub-elements with the higher address of each pair are placed in the odd numbered lanes. For swapped complex elements, the placement is reversed.

The streaming engine fills each vector processing unit core 110 fetches with as many elements as possible from the innermost stream dimension. If the innermost dimension is not a multiple of the vector length, the streaming engine zero pads the dimension to a multiple of the vector length. As noted below, the streaming engine also marks the lanes invalid. Thus, for higher-dimension streams, the first element from each iteration of an outer dimension arrives in lane 0 of a vector. The streaming engine maps the innermost dimension to consecutive lanes in a vector. For transposed streams, the innermost dimension includes groups of sub-elements along dimension 1, not dimension 0, as transposition exchanges these two dimensions.

Two-dimensional (2D) streams exhibit greater variety as compared to one-dimensional streams. A basic 2D stream extracts a smaller rectangle from a larger rectangle. A transposed 2D stream reads a rectangle column-wise instead of row-wise. A looping stream, where the second dimension overlaps first, executes a finite impulse response (FIR) filter taps which loops repeatedly over FIR filter samples providing a sliding window of input samples.

Figure 23:
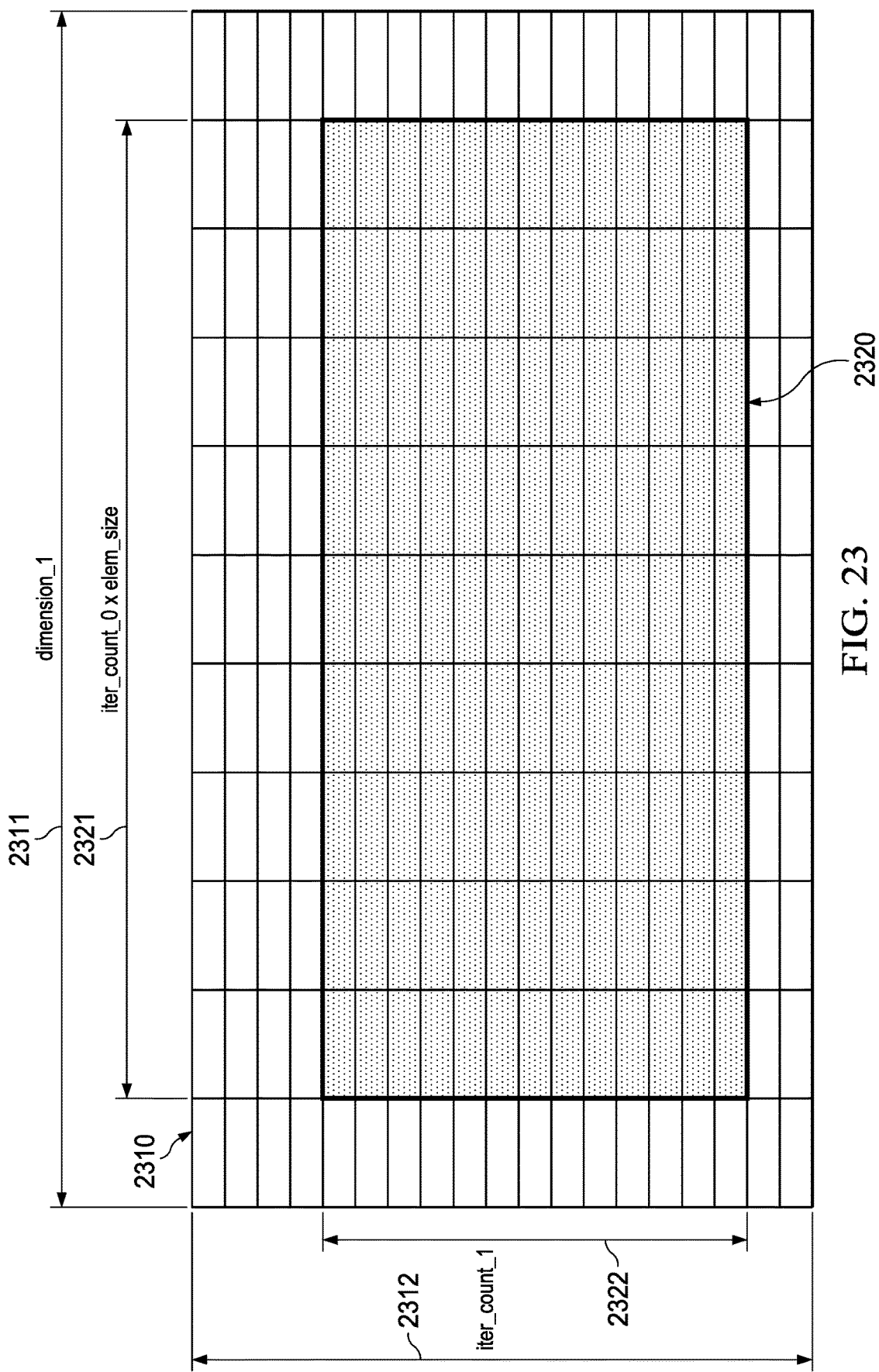
FIG. 23 illustrates a basic two-dimensional (2D) stream.

FIG. 23 illustrates a region of memory that can be accessed using a basic two-dimensional stream. The inner two dimensions, represented by ELEM_BYTES, ICNT0, DIM1 and ICNT1 (refer to Table 4), give sufficient flexibility to describe extracting a smaller rectangle 2320 having dimensions 2321 and 2322 from a larger rectangle 2310 having dimensions 2311 and 2312. In this example, rectangle 2320 is a 9 by 13 rectangle of 64-bit values and rectangle 2310 is a larger 11 by 19 rectangle. The following stream parameters define this stream:

ICNT0=9, ELEM_BYTES=8, ICNT1=13, and DIM1=88 (11 times 8).

Thus, the iteration count in the 0-dimension 2321 is nine and the iteration count in the 1-dimension 2322 is thirteen. Note that the ELEM_BYTES scales the innermost dimension. The first dimension has ICNT0 elements of size ELEM_BYTES. The stream address generator does not scale the outer dimensions. Therefore, DIM1=88, which is eleven elements scaled by eight bytes per element.

Figure 24:
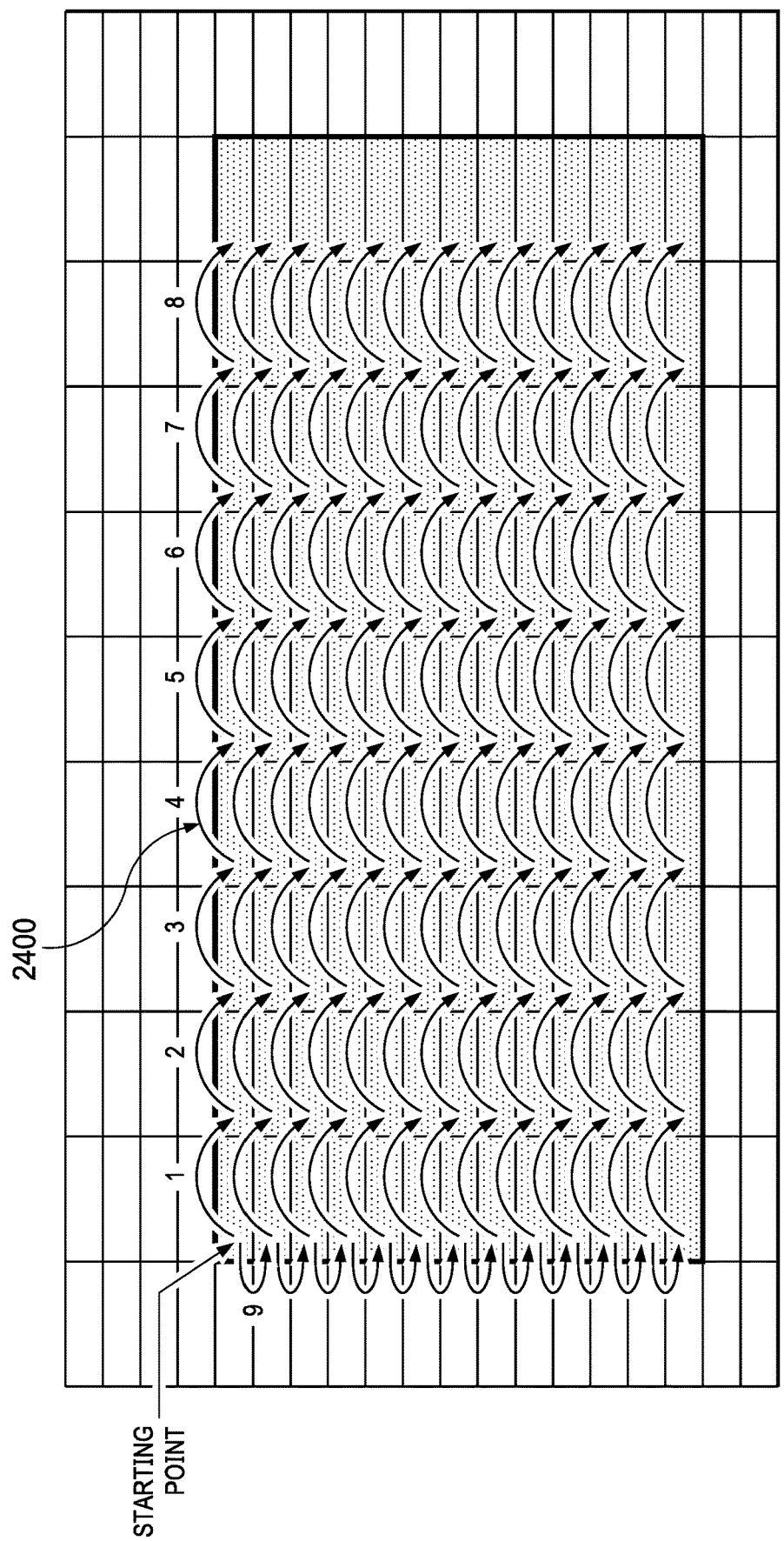
FIG. 24 illustrates the order of elements within the example stream of FIG. 23.

FIG. 24 illustrates the order of elements within the example stream of FIG. 23. The streaming engine fetches elements for the stream in the order illustrated in order 2400. The first nine elements come from the first row of rectangle 2320, left-to-right in hops 1 to 8. The 10th through 24th elements comes from the second row, and so on. When the stream moves from the 9th element to the 10th element (hop 9 in FIG. 24), the streaming engine computes the new location based on the position of the pointer at the start of the inner loop, not the position of the pointer at the end of the first dimension. Thus, DIM1 is independent of ELEM_BYTES and ICNT0. DIM1 represents the distance between the first bytes of each consecutive row.

Figure 25:
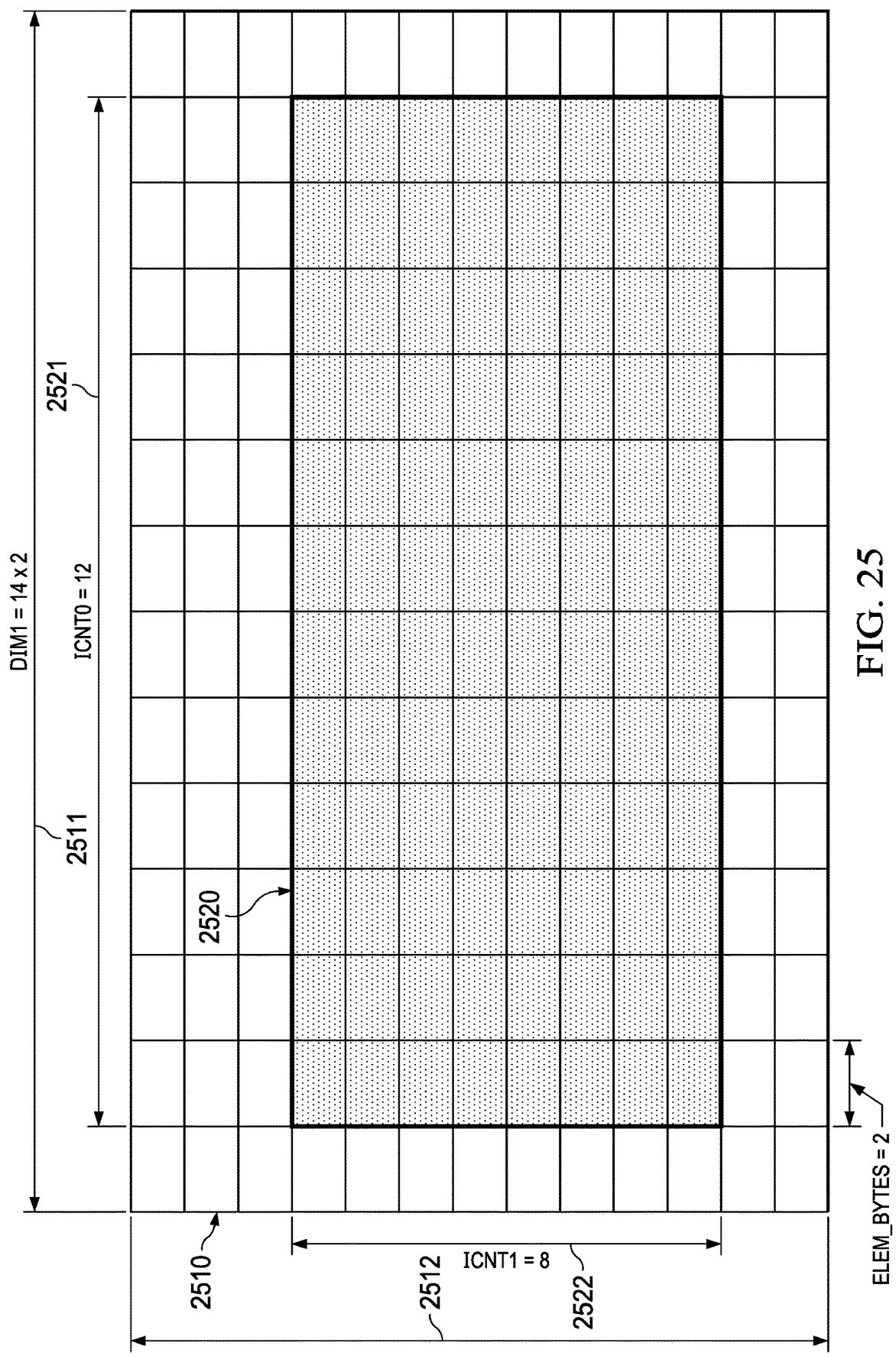
FIG. 25 illustrates extracting a smaller rectangle from a larger rectangle.

Transposed streams are accessed along dimension 1 before dimension 0. The following examples illustrate transposed streams with varying transposition granularity. FIG. 25 illustrates extracting a smaller rectangle 2520 (12×8) having dimensions 2521 and 2522 from a larger rectangle 2510 (14×13) having dimensions 2511 and 2512. In FIG. 25, ELEM_BYTES equal 2.

Figure 26:
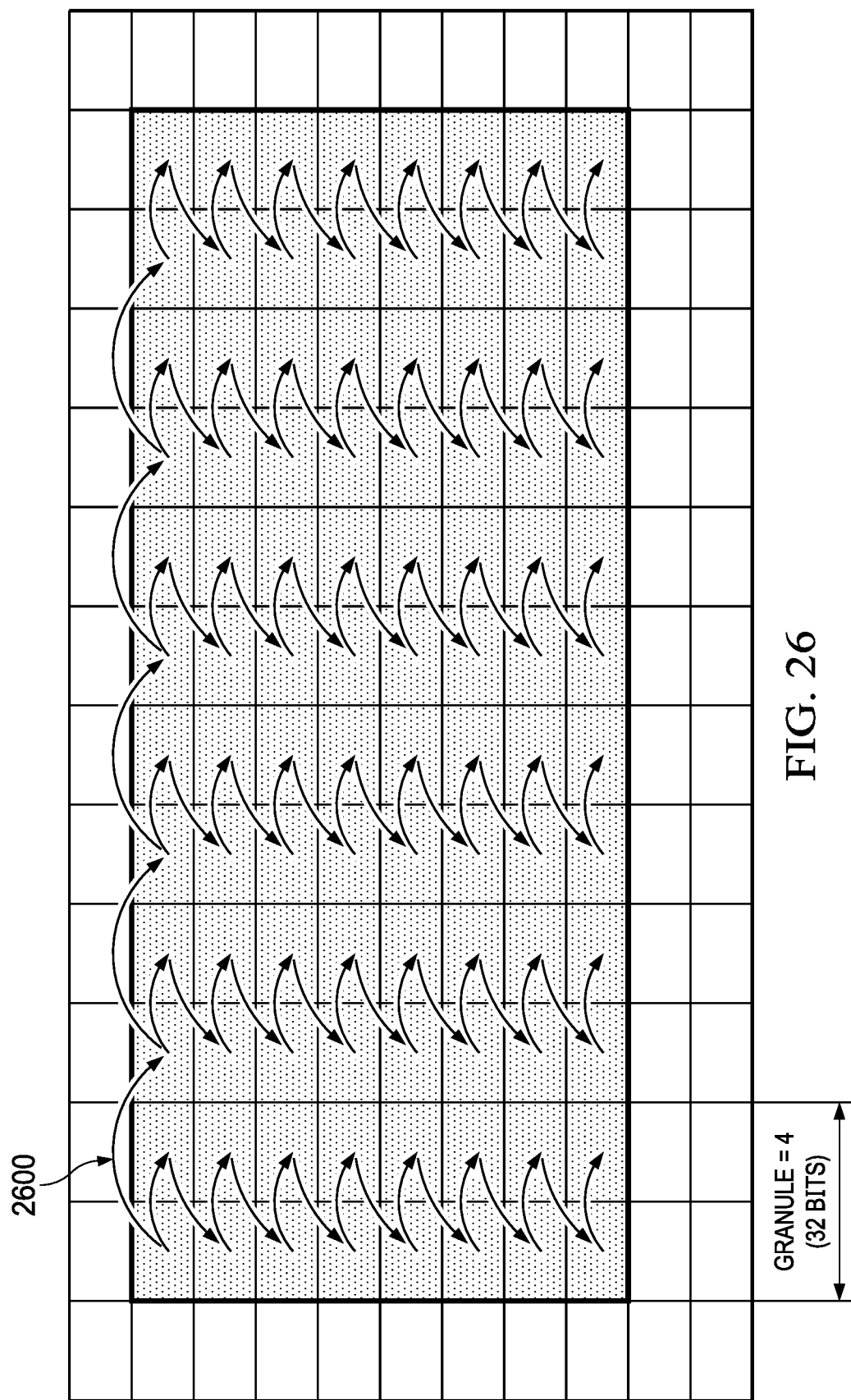
FIG. 26 illustrates how an example streaming engine fetches a stream with a transposition granularity of 4 bytes.

FIG. 26 illustrates how the streaming engine fetches the stream of the example stream of FIG. 25 with a transposition granularity of four bytes. Fetch pattern 2600 fetches pairs of elements from each row (because the granularity of four is twice the ELEM_BYTES of two), but otherwise moves down the columns. Once the streaming engine reaches the bottom of a pair of columns, the streaming engine repeats the pattern with the next pair of columns.

Figure 27:
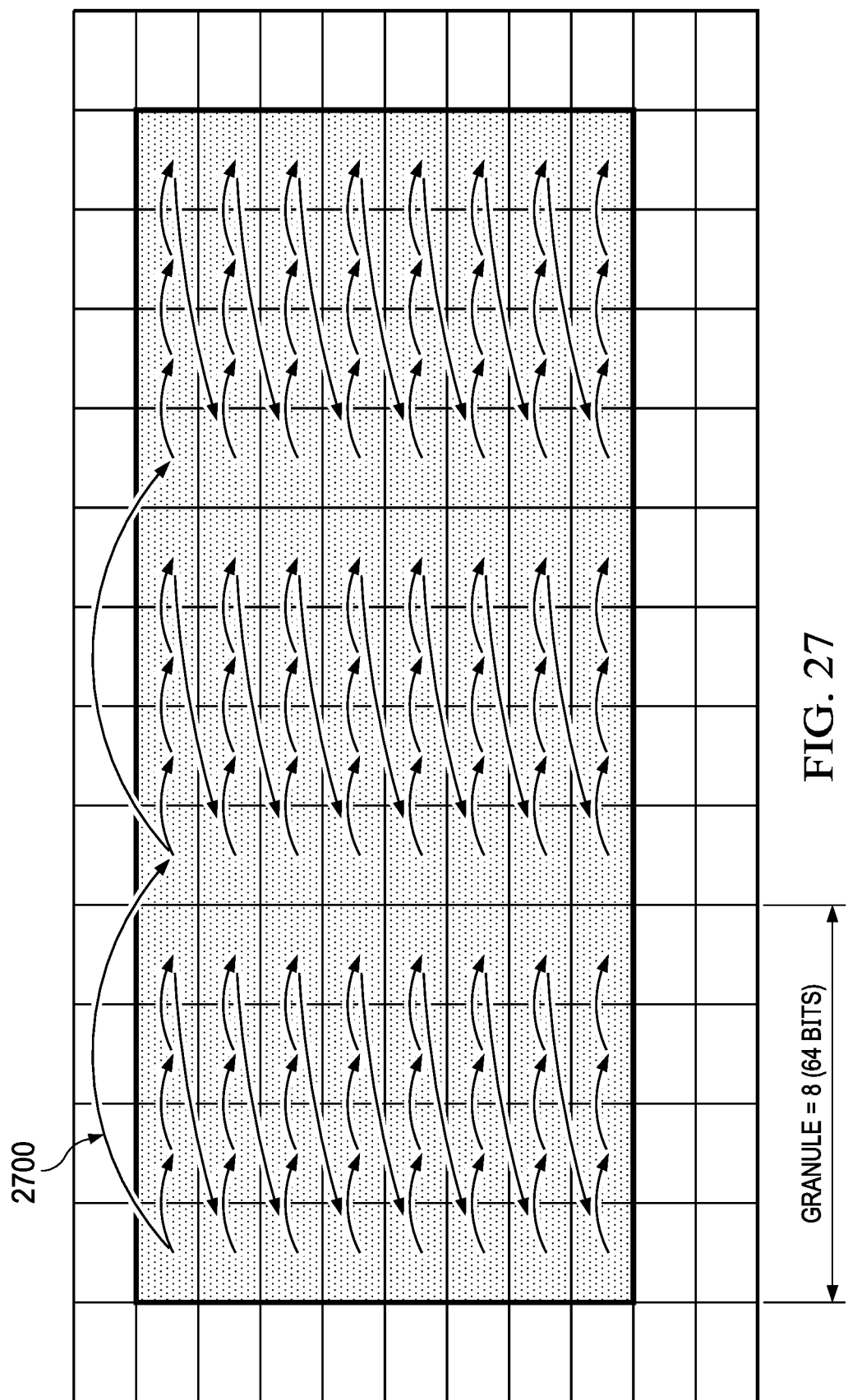
FIG. 27 illustrates how an example streaming engine fetches a stream with a transposition granularity of 8 bytes.

FIG. 27 illustrates how the streaming engine fetches the stream of the example stream of FIG. 25 with a transposition granularity of eight bytes. The overall structure remains the same. The streaming engine fetches four elements from each row (because the granularity of eight is four times the ELEM_BYTES of two) before moving to the next row in the column as shown in fetch pattern 2700.

The streams examined so far read each element from memory exactly once. A stream can read a given element from memory multiple times, in effect looping over a portion of memory. FIR filters exhibit two common looping patterns: re-reading the same filter taps for each output and reading input samples from a sliding window. Two consecutive outputs need inputs from two overlapping windows.

Figure 28:
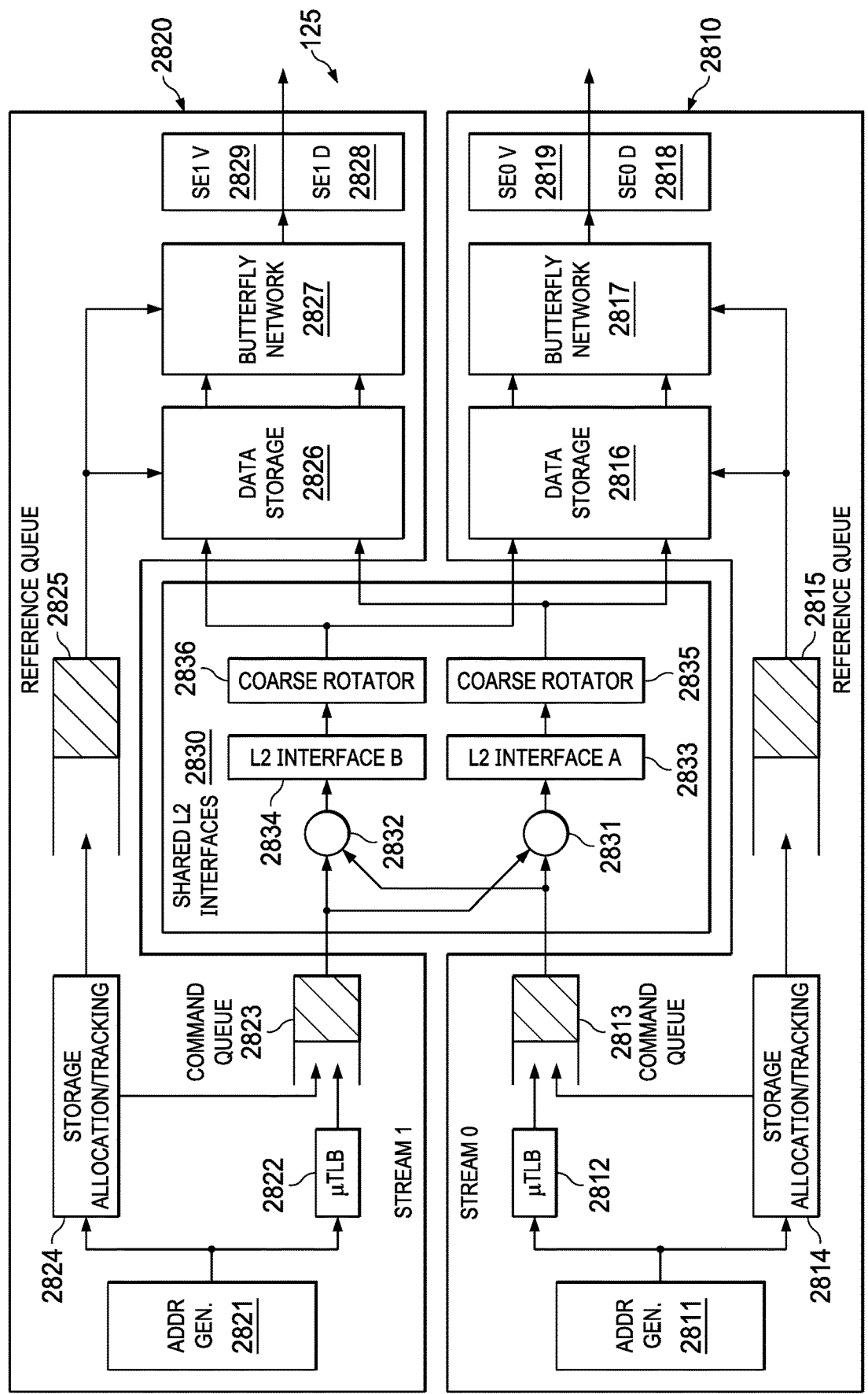
FIG. 28 illustrates the details of an example streaming engine.

FIG. 28 illustrates the details of streaming engine 125 of FIG. 1. Streaming engine 125 contains three major sections: Stream 0 2810; Stream 1 2820; and Shared L2 Interfaces 2830. Stream 0 2810 and Stream 1 2820 both contain identical hardware that operates in parallel. Stream 0 2810 and Stream 1 2820 both share L2 interfaces 2830. Each stream 2810 and 2820 provides processing unit core 110 (FIG. 1) data at a rate of up to 512 bits/cycle, every cycle, which is enabled by the dedicated stream paths and shared dual L2 interfaces.

Each streaming engine 125 includes a respective dedicated 6-dimensional (6D) stream address generator 2811/2821 that can each generate one new non-aligned request per cycle. As is further described herein, address generators 2811/2821 output 512-bit aligned addresses that overlap the elements in the sequence defined by the stream parameters.

Each address generator 2811/2821 connects to a respective dedicated micro table look-aside buffer (μTLB) 2812/2822. The μTLB 2812/2822 converts a single 48-bit virtual address to a 44-bit physical address each cycle. Each μTLB 2812/2822 has 8 entries, covering a minimum of 32 kB with 4 kB pages or a maximum of 16 MB with 2 MB pages. Each address generator 2811/2821 generates 2 addresses per cycle. The μTLB 2812/2822 only translates one address per cycle. To maintain throughput, streaming engine 125 operates under the assumption that most stream references are within the same 4 kB page. Thus, the address translation does not modify bits 0 to 11 of the address. If aout0 and aout1 line in the same 4 kB page (aout0[47:12] are the same aout1[47:12]), then the μTLB 2812/2822 only translates aout0 and reuses the translation for the upper bits of both addresses.

Translated addresses are queued in respective command queue 2813/2823. These addresses are aligned with information from the respective corresponding Storage Allocation and Tracking block 2814/2824. Streaming engine 125 does not explicitly manage μTLB 2812/2822. The system memory management unit (MMU) invalidates μTLBs as necessary during context switches.

Storage Allocation and Tracking 2814/2824 manages the internal storage of the stream, discovering data reuse and tracking the lifetime of each piece of data. The block accepts two virtual addresses per cycle and binds those addresses to slots in the internal storage if the addresses are not already allocated to slots. The data store is organized as an array of slots. The streaming engine maintains the following metadata to track the contents and lifetime of the data in each slot: a 49-bit virtual address associated with the slot, a valid bit indicating whether the tag address is valid, a ready bit indicating data has arrived for the address, an active bit indicating if there are any references outstanding to this data, and a last reference value indicating the most recent reference to this slot in the reference queue. The storage allocation and tracking are further described herein.

Respective reference queue 2815/2825 stores the sequence of references generated by the respective corresponding address generator 2811/2821. The reference sequence enables the data formatting network to present data to processing unit core 110 in the correct order. Each entry in respective reference queue 2815/2825 contains the information necessary to read data out of the data store and align the data for processing unit core 110. Respective reference queue 2815/2825 maintains the information listed in Table 6 in each slot.

TABLE 6

| | |
|---|---|
| Data Slot Low | Slot number for the lower half of data associated with aout0 |
| Data Slot High | Slot number for the upper half of data associated with aout1 |
| Rotation | Number of bytes to rotate data to align next element with lane 0 |
| Length | Number of valid bytes in this reference |

Storage allocation and tracking 2814/2824 inserts references in reference queue 2815/2825 as address generator 2811/2821 generates new addresses. Storage allocation and tracking 2814/2824 removes references from reference queue 2815/2825 when the data becomes available and there is room in the stream head registers. As storage allocation and tracking 2814/2824 removes slot references from reference queue 2815/2825 and formats data, the references are checked for the last reference to the corresponding slots. Storage allocation and tracking 2814/2824 compares reference queue 2815/2825 removal pointer against the recorded last reference of the slot. If the pointer and the recorded last reference match, then storage allocation and tracking 2814/2824 marks the slot inactive once the data is no longer needed.

Streaming engine 125 has respective data storage 2816/2826 for a selected number of elements. Deep buffering allows the streaming engine to fetch far ahead in the stream, hiding memory system latency. Each data storage 2816/2826 accommodates two simultaneous read operations and two simultaneous write operations per cycle and each is therefore referred to a two-read, two-write (2r2w) data storage. In other examples, the amount of buffering can be different. In the current example, streaming engine 125 dedicates 32 slots to each stream with each slot tagged by the previously described metadata. Each slot holds 64 bytes of data in eight banks of eight bytes.

Data storage 2816/2826 and the respective storage allocation/tracking logic 2814/2824 and reference queues 2815/2825 implement the data FIFO 1902 discussed with reference to FIG. 19.

Respective butterfly network 2817/2827 includes a seven-stage butterfly network that implements the formatter 1903 (FIG. 19, FIG. 20). Butterfly network 2817/2827 receives 128 bytes of input and generates 64 bytes of output. The first stage of the butterfly is actually a half-stage that collects bytes from both slots that match a non-aligned fetch and merges the collected bytes into a single, rotated 64-byte array. The remaining six stages form a standard butterfly network. Respective butterfly network 2817/2827 performs the following operations: rotates the next element down to byte lane 0; promotes data types by a power of two, if requested; swaps real and imaginary components of complex numbers, if requested; and converts big endian to little endian if processing unit core 110 is presently in big endian mode. The user specifies element size, type promotion, and real/imaginary swap as part of the parameters of the stream.

Streaming engine 125 attempts to fetch and format data ahead of processing unit core 110's demand in order to maintain full throughput. Respective stream head registers 2818/2828 provide a small amount of buffering so that the process remains fully pipelined. Respective stream head registers 2818/2828 are not directly architecturally visible. Each stream also has a respective stream valid register 2819/2829. Valid registers 2819/2829 indicate which elements in the corresponding stream head registers 2818/2828 are valid.

The two streams 2810/2820 share a pair of independent L2 interfaces 2830: L2 Interface A (IFA) 2833 and L2 Interface B (IFB) 2834. Each L2 interface provides 512 bits/cycle throughput direct to the L2 controller 130 (FIG. 1) via respective buses 147/149 for an aggregate bandwidth of 1024 bits/cycle. The L2 interfaces use the credit-based multicore bus architecture (MBA) protocol. The MBA protocol is described in more detail in U.S. Pat. No. 9,904,645, "Multicore Bus Architecture with Non-Blocking High Performance Transaction Credit System," which is incorporated by reference herein. The L2 controller assigns a pool of command credits to each interface. The pool has sufficient credits so that each interface can send sufficient requests to achieve full read-return bandwidth when reading L2 RAM, L2 cache and multicore shared memory controller (MSMC) memory, as described in more detail herein.

To maximize performance, in this example both streams can use both L2 interfaces, allowing a single stream to send a peak command rate of two requests per cycle. Each interface prefers one stream over the other, but this preference changes dynamically from request to request. IFA 2833 and IFB 2834 prefer opposite streams, when IFA 2833 prefers Stream 0, IFB 2834 prefers Stream 1 and vice versa.

Respective arbiter 2831/2832 ahead of each respective interface 2833/2834 applies the following basic protocol on every cycle having credits available. Arbiter 2831/2832 checks if the preferred stream has a command ready to send. If so, arbiter 2831/2832 chooses that command. Arbiter 2831/2832 next checks if an alternate stream has at least two requests ready to send, or one command and no credits. If so, arbiter 2831/2832 pulls a command from the alternate stream. If either interface issues a command, the notion of preferred and alternate streams swap for the next request. Using this algorithm, the two interfaces dispatch requests as quickly as possible while retaining fairness between the two streams. The first rule ensures that each stream can send a request on every cycle that has available credits. The second rule provides a mechanism for one stream to borrow the interface of the other when the second interface is idle. The third rule spreads the bandwidth demand for each stream across both interfaces, ensuring neither interface becomes a bottleneck.

Respective coarse grain rotator 2835/2836 enables streaming engine 125 to support a transposed matrix addressing mode. In this mode, streaming engine 125 interchanges the two innermost dimensions of the multidimensional loop to access an array column-wise rather than row-wise. Respective rotators 2835/2836 are not architecturally visible.

Figure 29:
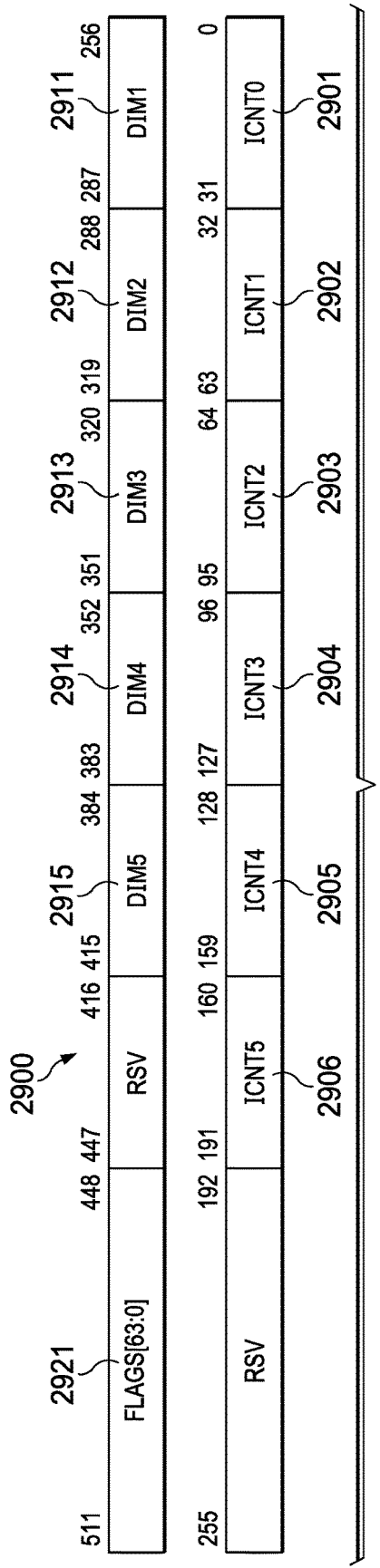
FIG. 29 illustrates an example stream template register.

FIG. 29 illustrates an example stream template register 2900. The stream definition template provides the full structure of a stream that contains data. The iteration counts and dimensions provide most of the structure, while the various flags provide the rest of the details. In this example, a single stream template 2900 is defined for all data-containing streams. All stream types supported by the streaming engine are covered by the template 2900. The streaming engine supports a six-level loop nest for addressing elements within the stream. Most of the fields in the stream template 2900 map directly to the parameters in that algorithm. The numbers above the fields are bit numbers within a 256-bit vector. Table 7 shows the stream field definitions of a stream template.

TABLE 7

| Field Name | FIG. 29 Reference Number | Description | Size Bits |
|---|---|---|---|
| ICNT0 | 2901 | Iteration count for loop 0 | 32 |
| ICNT1 | 2902 | Iteration count for loop 1 | 32 |
| ICNT2 | 2903 | Iteration count for loop 2 | 32 |
| ICNT3 | 2904 | Iteration count for loop 3 | 32 |
| ICNT4 | 2905 | Iteration count for loop 4 | 32 |
| ICNT5 | 2906 | Iteration count for loop 5 | 32 |
| DIM1 | 2911 | Signed dimension for loop 1 | 32 |
| DIM2 | 2912 | Signed dimension for loop 2 | 32 |
| DIM3 | 2913 | Signed dimension for loop 3 | 32 |

TABLE 7-continued

| Field Name | FIG. 29 Reference Number | Description | Size Bits |
|---|---|---|---|
| DIM4 | 2914 | Signed dimension for loop 4 | 32 |
| DIM5 | 2915 | Signed dimension for loop 5 | 32 |
| FLAGS | 2921 | Stream modifier flags | 64 |

Loop 0 is the innermost loop and loop 5 is the outermost loop. In the current example, DIM0 is equal to ELEM_BYTES defining physically contiguous data. Thus, the stream template register 2900 does not define DIM0. Streaming engine 125 interprets iteration counts as unsigned integers and dimensions as unscaled signed integers. An iteration count of zero at any level (ICNT0, ICNT1, ICNT2, ICNT3, ICNT4 or ICNT5) indicates an empty stream. Each iteration count must be at least one to define a valid stream. The template above specifies the type of elements, length and dimensions of the stream. The stream instructions separately specify a start address, e.g., by specification of a scalar register in scalar register file 211 which stores the start address. Thus, a program can open multiple streams using the same template but different registers storing the start address.

Figure 30:
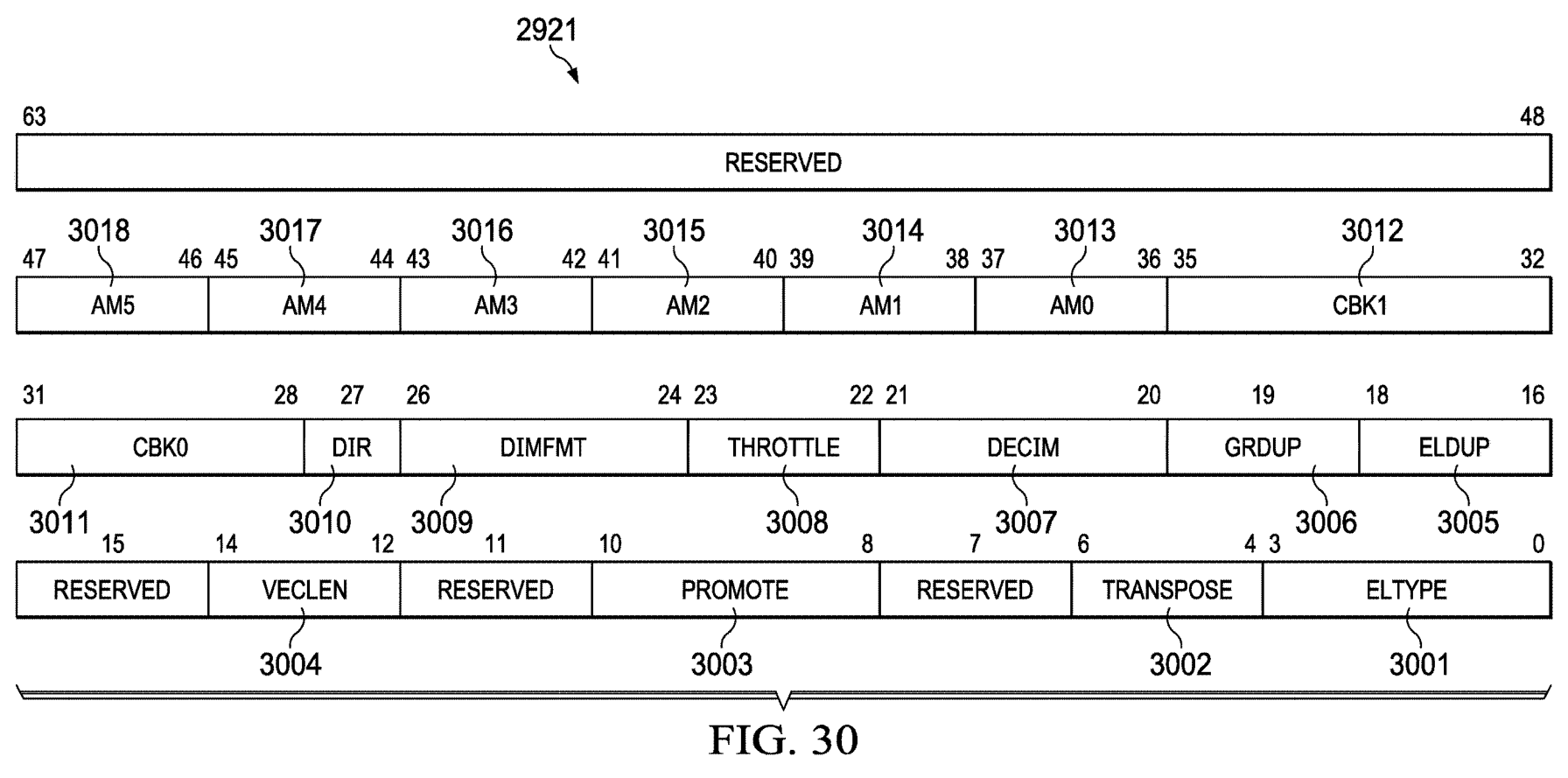

FIG. 30 illustrates an example of sub-field definitions of the flags field 2921 shown in FIG. 29. As shown in FIG. 30, the flags field 2911 is 6 bytes or 48 bits. FIG. 30 shows bit numbers of the fields. Table 8 shows the definition of these fields.

TABLE 8

| Field Name | FIG. 30 Reference Number | Description | Size Bits |
|---|---|---|---|
| ELTYPE | 3001 | Type of data element | 4 |
| TRANSPOSE | 3002 | Two-dimensional transpose mode | 3 |
| PROMOTE | 3003 | Promotion mode | 3 |
| VECLEN | 3004 | Stream vector length | 3 |
| ELDUP | 3005 | Element duplication | 3 |
| GRDUP | 3006 | Group duplication | 1 |
| DECIM | 3007 | Element decimation | 2 |
| THROTTLE | 3008 | Fetch ahead throttle mode | 2 |
| DIMFMT | 3009 | Stream dimensions format | 3 |
| DIR | 3010 | Stream direction 0 forward direction 1 reverse direction | 1 |
| CBK0 | 3011 | First circular block size number | 4 |
| CBK1 | 3012 | Second circular block size number | 4 |
| AM0 | 3013 | Addressing mode for loop 0 | 2 |
| AM1 | 3014 | Addressing mode for loop 1 | 2 |
| AM2 | 3015 | Addressing mode for loop 2 | 2 |
| AM3 | 3016 | Addressing mode for loop 3 | 2 |
| AM4 | 3017 | Addressing mode for loop 4 | 2 |
| AM5 | 3018 | Addressing mode for loop 5 | 2 |

The Element Type (ELTYPE) field 3001 defines the data type of the elements in the stream. The coding of the four bits of the ELTYPE field 3001 is defined as shown in Table 9.

TABLE 9

| ELTYPE | Real/Complex | Sub-element Size Bits | Total Element Size Bits |
|---|---|---|---|
| 0000 | real | 8 | 8 |
| 0001 | real | 16 | 16 |
| 0010 | real | 32 | 32 |
| 0011 | real | 64 | 64 |

TABLE 9-continued

| ELTYPE | Real/Complex | Sub-element Size Bits | Total Element Size Bits |
|---|---|---|---|
| 0100 | | reserved | |
| 0101 | | reserved | |
| 0110 | | reserved | |
| 0111 | | reserved | |
| 1000 | complex no swap | 8 | 16 |
| 1001 | complex no swap | 16 | 32 |
| 1010 | complex no swap | 32 | 64 |
| 1011 | complex no swap | 64 | 128 |
| 1100 | complex swapped | 8 | 16 |
| 1101 | complex swapped | 16 | 32 |
| 1110 | complex swapped | 32 | 64 |
| 1111 | complex swapped | 64 | 128 |

Real/Complex Type determines whether the streaming engine treats each element as a real number or two parts (real/imaginary or magnitude/angle) of a complex number and also specifies whether to swap the two parts of complex numbers. Complex types have a total element size twice the sub-element size. Otherwise, the sub-element size equals the total element size.

Sub-Element Size determines the type for purposes of type promotion and vector lane width. For example, 16-bit sub-elements get promoted to 32-bit sub-elements or 64-bit sub-elements when a stream requests type promotion. The vector lane width matters when processing unit core 110 (FIG. 1) operates in big endian mode, as the core 110 lays out vectors in little endian order.

Total Element Size specifies the minimal granularity of the stream which determines the number of bytes the stream fetches for each iteration of the innermost loop. Streams read whole elements, either in increasing or decreasing order. Therefore, the innermost dimension of a stream spans ICNT0×total-element-size bytes.

The TRANSPOSE field 3002 determines whether the streaming engine accesses the stream in a transposed order. The transposed order exchanges the inner two addressing levels. The TRANSPOSE field 3002 also indicated the granularity for transposing the stream. The coding of the three bits of the TRANSPOSE field 3002 is defined as shown in Table 10 for normal 2D operations.

TABLE 10

| Transpose | Meaning |
|---|---|
| 000 | Transpose disabled |
| 001 | Transpose on 8-bit boundaries |
| 010 | Transpose on 16-bit boundaries |
| 011 | Transpose on 32-bit boundaries |
| 100 | Transpose on 64-bit boundaries |
| 101 | Transpose on 128-bit boundaries |
| 110 | Transpose on 256-bit boundaries |
| 111 | Reserved |

Streaming engine 125 can transpose data elements at a different granularity than the element size thus allowing programs to fetch multiple columns of elements from each row. The transpose granularity cannot be smaller than the element size. The TRANSPOSE field 3002 interacts with the DIMFMT field 3009 in a manner further described below.

The PROMOTE field 3003 controls whether the streaming engine promotes sub-elements in the stream and the type of promotion. When enabled, streaming engine 125 promotes types by powers-of-2 sizes. The coding of the three bits of the PROMOTE field 3003 is defined as shown in Table 11.

TABLE 11

| PROMOTE | Promotion Factor | Promotion Type | Resulting Sub-element Size | | | |
|---|---|---|---|---|---|---|
| | | | 8-bit | 16-bit | 32-bit | 64-bit |
| 000 | 1x | N/A | 8-bit | 16-bit | 32-bit | 64-bit |
| 001 | 2x | zero extend | 16-bit | 32-bit | 64-bit | Invalid |
| 010 | 4x | zero extend | 32-bit | 64-bit | Invalid | Invalid |
| 011 | 8x | zero extend | 64-bit | Invalid | Invalid | Invalid |
| 100 | | | reserved | | | |
| 101 | 2x | sign extend | 16-bit | 32-bit | 64-bit | Invalid |
| 110 | 4x | sign extend | 32-bit | 64-bit | Invalid | Invalid |
| 111 | 8x | sign extend | 64-bit | Invalid | Invalid | Invalid |

When PROMOTE is 000, corresponding to a 1× promotion, each sub-element is unchanged and occupies a vector lane equal in width to the size specified by ELTYPE. When PROMOTE is 001, corresponding to a 2× promotion and zero extend, each sub-element is treated as an unsigned integer and zero extended to a vector lane twice the width specified by ELTYPE. A 2× promotion is invalid for an initial sub-element size of 64 bits. When PROMOTE is 010, corresponding to a 4× promotion and zero extend, each sub-element is treated as an unsigned integer and zero extended to a vector lane four times the width specified by ELTYPE. A 4× promotion is invalid for an initial sub-element size of 32 or 64 bits. When PROMOTE is 011, corresponding to an 8× promotion and zero extend, each sub-element is treated as an unsigned integer and zero extended to a vector lane eight times the width specified by ELTYPE. An 8× promotion is invalid for an initial sub-element size of 16, 32 or 64 bits. When PROMOTE is 101, corresponding to a 2× promotion and sign extend, each sub-element is treated as a signed integer and sign extended to a vector lane twice the width specified by ELTYPE. A 2× promotion is invalid for an initial sub-element size of 64 bits. When PROMOTE is 110, corresponding to a 4× promotion and sign extend, each sub-element is treated as a signed integer and sign extended to a vector lane four times the width specified by ELTYPE. A 4× promotion is invalid for an initial sub-element size of 32 or 64 bits. When PROMOTE is 111, corresponding to an 8× promotion and zero extend, each sub-element is treated as a signed integer and sign extended to a vector lane eight times the width specified by ELTYPE. An 8× promotion is invalid for an initial sub-element size of 16, 32 or 64 bits.

The VECLEN field 3004 defines the stream vector length for the stream in bytes. Streaming engine 125 breaks the stream into groups of elements that are VECLEN bytes long. The coding of the three bits of the VECLEN field 3004 is defined as shown in Table 12.

TABLE 12

| VECLEN | Stream Vector Length |
|---|---|
| 000 | 1 byte |
| 001 | 2 bytes |
| 010 | 4 bytes |
| 011 | 8 bytes |
| 100 | 16 bytes |

TABLE 12-continued

| VECLEN | Stream Vector Length |
|---|---|
| 101 | 32 bytes |
| 110 | 64 bytes |
| 111 | Reserved |

VECLEN cannot be less than the product of the element size in bytes and the duplication factor. As shown in Table 11, the maximum VECLEN of 64 bytes equals the preferred vector size of vector data path side B 116. When VECLEN is shorter than the native vector width of processing unit core 110, streaming engine 125 pads the extra lanes in the vector provided to processing unit core 110. The GRDUP field 3006 determines the type of padding. The VECLEN field 3004 interacts with ELDUP field 3005 and GRDUP field 3006 in a manner detailed below.

The ELDUP field 3005 specifies the number of times to duplicate each element. The element size multiplied with the element duplication amount cannot exceed the 64 bytes. The coding of the three bits of the ELDUP field 3005 is defined as shown in Table 13.

TABLE 13

| ELDUP | Duplication Factor |
|---|---|
| 000 | No Duplication |
| 001 | 2 times |
| 010 | 4 times |
| 011 | 8 times |
| 100 | 16 times |
| 101 | 32 times |
| 110 | 64 times |
| 111 | Reserved |

The ELDUP field 3005 interacts with VECLEN field 3004 and GRDUP field 3006 in a manner detailed below. The nature of the relationship between the permitted element size, the element duplication factor, and the destination vector length requires that a duplicated element that overflows the first destination register fills an integer number of destination registers upon completion of duplication. The data of the additional destination registers eventually supplies the respective stream head register 2818/2828. Upon completion of duplication of a first data element, the next data element is rotated down to the least significant bits of source register 3100 discarding the first data element. The process then repeats for the new data element.

The GRDUP bit 3006 determines whether group duplication is enabled. If GRDUP bit 3006 is 0, then group duplication is disabled. If the GRDUP bit 3006 is 1, then group duplication is enabled. When enabled by GRDUP bit 3006, streaming engine 125 duplicates a group of elements to fill the vector width. VECLEN field 3004 defines the length of the group to replicate. When VECLEN field 3004 is less than the vector length of processing unit core 110 and GRDUP bit 3006 enables group duplication, streaming engine 125 fills the extra lanes (see FIGS. 21 and 22) with additional copies of the stream vector. Because stream vector length and vector length of processing unit core 110 are integer powers of two, group duplication produces an integer number of duplicate copies. Note GRDUP and VECLEN do not specify the number of duplications. The number of duplications performed is based upon the ratio of VECLEN to the native vector length, which is 64 bytes/512 bits in this example.

The GRDUP field 3006 specifies how streaming engine 125 pads stream vectors for bits following the VECLEN length to the vector length of processing unit core 110. When GRDUP bit 3006 is 0, streaming engine 125 fills the extra lanes with zeros and marks the extra vector lanes invalid. When GRDUP bit 3006 is 1, streaming engine 125 fills extra lanes with copies of the group of elements in each stream vector. Setting GRDUP bit 3006 to 1 has no effect when VECLEN is set to the native vector width of processing unit core 110. VECLEN must be at least as large as the product of ELEM_BYTES and the element duplication factor ELDUP. That is, an element or the duplication factor number of elements cannot be separated using VECLEN.

Group duplication operates to the destination vector size. Group duplication does not change the data supplied when the product of the element size ELEM_BYTES and element duplication factor ELDUP equals or exceeds the destination vector width. Under such conditions, the states of the GRDUP bit 3006 and the VECLEN field 3004 have no effect on the supplied data.

The set of examples below illustrate the interaction between VECLEN and GRDUP. Each of the following examples show how the streaming engine maps a stream onto vectors across different stream vector lengths and the vector size of vector data path side B 116. The stream of this example includes twenty-nine elements (E0 to E28) of 64 bits/8 bytes. The stream can be a linear stream of twenty-nine elements or an inner loop of 29 elements. The tables illustrate eight byte lanes such as shown in FIG. 21. Each illustrated vector is stored in the respective stream head register 2818/2828 in turn.

Table 14 illustrates how the example stream maps onto bits within the 64-byte processor vectors when VECLEN is 64 bytes. As shown in Table 14, the stream extends over four vectors. As previously described, the lanes within vector 4 that extend beyond the stream are zero filled. When VECLEN has a size equal to the native vector length, the value of GRDUP does not matter as no duplication can take place with such a VECLEN.

TABLE 14

| Processor Vectors | Lane 7 | Lane 6 | Lane 5 | Lane 4 | Lane 3 | Lane 2 | Lane 1 | Lane 0 |
|---|---|---|---|---|---|---|---|---|
| 1 | E7 | E6 | E5 | E4 | E3 | E2 | E1 | E0 |
| 2 | E15 | E14 | E13 | E12 | E11 | E10 | E9 | E8 |
| 3 | E23 | E22 | E21 | E20 | E19 | E18 | E17 | E16 |
| 4 | 0 | 0 | 0 | E28 | E27 | E26 | E25 | E24 |

Table 15 shows the same parameters as shown in Table 14, except with VECLEN of 32 bytes. Group duplicate is disabled (GRDUP=0). The twenty-nine elements of the stream are distributed over lanes 0 to 3 in eight vectors. Extra lanes 4 to 7 in vectors 1-7 are zero filled. In vector 8, lane 1 has a stream element (E28) and the other lanes are zero filled.

TABLE 15

| Processor Vectors | Lane 7 | Lane 6 | Lane 5 | Lane 4 | Lane 3 | Lane 2 | Lane 1 | Lane 0 |
|---|---|---|---|---|---|---|---|---|
| 1 | 0 | 0 | 0 | 0 | E3 | E2 | E1 | E0 |
| 2 | 0 | 0 | 0 | 0 | E7 | E6 | E5 | E4 |
| 3 | 0 | 0 | 0 | 0 | E11 | E10 | E9 | E8 |
| 4 | 0 | 0 | 0 | 0 | E15 | E14 | E13 | E12 |
| 5 | 0 | 0 | 0 | 0 | E19 | E18 | E17 | E16 |
| 6 | 0 | 0 | 0 | 0 | E23 | E22 | E21 | E20 |

TABLE 15-continued

| Processor Vectors | Lane 7 | Lane 6 | Lane 5 | Lane 4 | Lane 3 | Lane 2 | Lane 1 | Lane 0 |
|---|---|---|---|---|---|---|---|---|
| 7 | 0 | 0 | 0 | 0 | E27 | E26 | E25 | E24 |
| 8 | 0 | 0 | 0 | 0 | 0 | 0 | 0 | E28 |

Table 16 shows the same parameters as shown in Table 14, except with VECLEN of sixteen bytes. Group duplicate is disabled (GRDUP=0). The twenty-nine elements of the stream are distributed over lane 0 and lane 1 in fifteen vectors. Extra lanes 2 to 7 in vectors 1-14 are zero filled. In vector 15, lane 1 has a stream element (E28) and the other lanes are zero filled.

TABLE 16

| Processor Vectors | Lane 7 | Lane 6 | Lane 5 | Lane 4 | Lane 3 | Lane 2 | Lane 1 | Lane 0 |
|---|---|---|---|---|---|---|---|---|
| 1 | 0 | 0 | 0 | 0 | 0 | 0 | E1 | E0 |
| 2 | 0 | 0 | 0 | 0 | 0 | 0 | E3 | E2 |
| 3 | 0 | 0 | 0 | 0 | 0 | 0 | E5 | E4 |
| 4 | 0 | 0 | 0 | 0 | 0 | 0 | E7 | E6 |
| 5 | 0 | 0 | 0 | 0 | 0 | 0 | E9 | E8 |
| 6 | 0 | 0 | 0 | 0 | 0 | 0 | E11 | E10 |
| 7 | 0 | 0 | 0 | 0 | 0 | 0 | E13 | E12 |
| 8 | 0 | 0 | 0 | 0 | 0 | 0 | E15 | E14 |
| 9 | 0 | 0 | 0 | 0 | 0 | 0 | E17 | E16 |
| 10 | 0 | 0 | 0 | 0 | 0 | 0 | E19 | E18 |
| 11 | 0 | 0 | 0 | 0 | 0 | 0 | E21 | E20 |
| 12 | 0 | 0 | 0 | 0 | 0 | 0 | E23 | E22 |
| 13 | 0 | 0 | 0 | 0 | 0 | 0 | E25 | E24 |
| 14 | 0 | 0 | 0 | 0 | 0 | 0 | E27 | E26 |
| 15 | 0 | 0 | 0 | 0 | 0 | 0 | 0 | E28 |

Table 17 shows the same parameters as shown in Table 14, except with VECLEN of eight bytes. Group duplicate is disabled (GRDUP=0). The twenty-nine elements of the stream appear in lane 0 in twenty-nine vectors. Extra lanes 1-7 in vectors 1-29 are zero filled.

TABLE 17

| Processor Vectors | Lane 7 | Lane 6 | Lane 5 | Lane 4 | Lane 3 | Lane 2 | Lane 1 | Lane 0 |
|---|---|---|---|---|---|---|---|---|
| 1 | 0 | 0 | 0 | 0 | 0 | 0 | 0 | E0 |
| 2 | 0 | 0 | 0 | 0 | 0 | 0 | 0 | E1 |
| 3 | 0 | 0 | 0 | 0 | 0 | 0 | 0 | E2 |
| 4 | 0 | 0 | 0 | 0 | 0 | 0 | 0 | E3 |
| 5 | 0 | 0 | 0 | 0 | 0 | 0 | 0 | E4 |
| 6 | 0 | 0 | 0 | 0 | 0 | 0 | 0 | E5 |
| 7 | 0 | 0 | 0 | 0 | 0 | 0 | 0 | E6 |
| 8 | 0 | 0 | 0 | 0 | 0 | 0 | 0 | E7 |
| 9 | 0 | 0 | 0 | 0 | 0 | 0 | 0 | E8 |
| 10 | 0 | 0 | 0 | 0 | 0 | 0 | 0 | E9 |
| 11 | 0 | 0 | 0 | 0 | 0 | 0 | 0 | E10 |
| 12 | 0 | 0 | 0 | 0 | 0 | 0 | 0 | E11 |
| 13 | 0 | 0 | 0 | 0 | 0 | 0 | 0 | E12 |
| 14 | 0 | 0 | 0 | 0 | 0 | 0 | 0 | E13 |
| 15 | 0 | 0 | 0 | 0 | 0 | 0 | 0 | E14 |
| 16 | 0 | 0 | 0 | 0 | 0 | 0 | 0 | E15 |
| 17 | 0 | 0 | 0 | 0 | 0 | 0 | 0 | E16 |
| 18 | 0 | 0 | 0 | 0 | 0 | 0 | 0 | E17 |
| 19 | 0 | 0 | 0 | 0 | 0 | 0 | 0 | E18 |
| 20 | 0 | 0 | 0 | 0 | 0 | 0 | 0 | E19 |
| 21 | 0 | 0 | 0 | 0 | 0 | 0 | 0 | E20 |
| 22 | 0 | 0 | 0 | 0 | 0 | 0 | 0 | E21 |
| 23 | 0 | 0 | 0 | 0 | 0 | 0 | 0 | E22 |
| 24 | 0 | 0 | 0 | 0 | 0 | 0 | 0 | E23 |
| 25 | 0 | 0 | 0 | 0 | 0 | 0 | 0 | E24 |
| 26 | 0 | 0 | 0 | 0 | 0 | 0 | 0 | E25 |
| 27 | 0 | 0 | 0 | 0 | 0 | 0 | 0 | E26 |
| 28 | 0 | 0 | 0 | 0 | 0 | 0 | 0 | E27 |
| 29 | 0 | 0 | 0 | 0 | 0 | 0 | 0 | E28 |

Table 18 shows the same parameters as shown in Table 15, except with VECLEN of thirty-two bytes and group duplicate is enabled (GRDUP=1). The twenty-nine elements of the stream are distributed over lanes 0-7 in eight vectors. Each vector 1-7 includes four elements duplicated. The duplication factor (2) results because VECLEN (32 bytes) is half the native vector length of 64 bytes. In vector 8, lane 0 has a stream element (E28) and lanes 1-3 are zero filled. Lanes 4-7 of vector 9 duplicate this pattern.

TABLE 18

| Processor Vectors | Lane 7 | Lane 6 | Lane 5 | Lane 4 | Lane 3 | Lane 2 | Lane 1 | Lane 0 |
|---|---|---|---|---|---|---|---|---|
| 1 | E3 | E2 | E1 | E0 | E3 | E2 | E1 | E0 |
| 2 | E7 | E6 | E5 | E4 | E7 | E6 | E5 | E4 |
| 3 | E11 | E10 | E9 | E8 | E11 | E10 | E9 | E8 |
| 4 | E15 | E14 | E13 | E12 | E15 | E14 | E13 | E12 |
| 5 | E19 | E18 | E17 | E16 | E19 | E18 | E17 | E16 |
| 6 | E23 | E22 | E21 | E20 | E23 | E22 | E21 | E20 |
| 7 | E27 | E26 | E25 | E24 | E27 | E26 | E25 | E24 |
| 8 | 0 | 0 | 0 | E28 | 0 | 0 | 0 | E28 |

Table 19 shows the same parameters as shown in Table 16, except with VECLEN of sixteen bytes. Group duplicate is enabled (GRDUP=1). The twenty-nine elements of the stream are distributed over lanes 0-7 in fifteen vectors. Each vector 1-7 includes two elements duplicated four times. The duplication factor (4) results because VECLEN (16 bytes) is one quarter the native vector length of 64 bytes. In vector 15, lane 0 has a stream element (E28) and lane 1 is zero filled. This pattern is duplicated in lanes 2 and 3, lanes 4 and 5, and lanes 6 and 7 of vector 15.

TABLE 19

| Processor Vectors | Lane 7 | Lane 6 | Lane 5 | Lane 4 | Lane 3 | Lane 2 | Lane 1 | Lane 0 |
|---|---|---|---|---|---|---|---|---|
| 1 | E1 | E0 | E1 | E0 | E1 | E0 | E1 | E0 |
| 2 | E3 | E2 | E3 | E2 | E3 | E2 | E3 | E2 |
| 3 | E5 | E4 | E5 | E4 | E5 | E4 | E5 | E4 |
| 4 | E7 | E6 | E7 | E6 | E7 | E6 | E7 | E6 |
| 5 | E9 | E8 | E9 | E8 | E9 | E8 | E9 | E8 |
| 6 | E11 | E10 | E11 | E10 | E11 | E10 | E11 | E10 |
| 7 | E13 | E12 | E13 | E12 | E13 | E12 | E13 | E12 |
| 8 | E15 | E14 | E15 | E14 | E15 | E14 | E15 | E14 |
| 9 | E17 | E16 | E17 | E16 | E17 | E16 | E17 | E16 |
| 10 | E19 | E18 | E19 | E18 | E19 | E18 | E19 | E18 |
| 11 | E21 | E20 | E21 | E20 | E21 | E20 | E21 | E20 |
| 12 | E23 | E22 | E23 | E22 | E23 | E22 | E23 | E22 |
| 13 | E25 | E24 | E25 | E24 | E25 | E24 | E25 | E24 |
| 14 | E27 | E26 | E27 | E26 | E27 | E26 | E27 | E26 |
| 15 | 0 | E28 | 0 | E28 | 0 | E28 | 0 | E28 |

Table 20 shows the same parameters as shown in Table 17, except with VECLEN of eight bytes. Group duplicate is enabled (GRDUP=1). The twenty-nine elements of the stream all appear on lanes 0 to 7 in twenty-nine vectors. Each vector includes one element duplicated eight times. The duplication factor (8) results because VECLEN (8 bytes) is one eighth the native vector length of 64 bytes. Thus, each lane is the same in vectors 1-29.

TABLE 20

| Processor Vectors | Lane 7 | Lane 6 | Lane 5 | Lane 4 | Lane 3 | Lane 2 | Lane 1 | Lane 0 |
|---|---|---|---|---|---|---|---|---|
| 1 | E0 | E0 | E0 | E0 | E0 | E0 | E0 | E0 |
| 2 | E1 | E1 | E1 | E1 | E1 | E1 | E1 | E1 |
| 3 | E2 | E2 | E2 | E2 | E2 | E2 | E2 | E2 |
| 4 | E3 | E3 | E3 | E3 | E3 | E3 | E3 | E3 |
| 5 | E4 | E4 | E4 | E4 | E4 | E4 | E4 | E4 |
| 6 | E5 | E5 | E5 | E5 | E5 | E5 | E5 | E5 |
| 7 | E6 | E6 | E6 | E6 | E6 | E6 | E6 | E6 |
| 8 | E7 | E7 | E7 | E7 | E7 | E7 | E7 | E7 |
| 9 | E8 | E8 | E8 | E8 | E8 | E8 | E8 | E8 |
| 10 | E9 | E9 | E9 | E9 | E9 | E9 | E9 | E9 |
| 11 | E10 | E10 | E10 | E10 | E10 | E10 | E10 | E10 |
| 12 | E11 | E11 | E11 | E11 | E11 | E11 | E11 | E11 |
| 13 | E12 | E12 | E12 | E12 | E12 | E12 | E12 | E12 |
| 14 | E13 | E13 | E13 | E13 | E13 | E13 | E13 | E13 |
| 15 | E14 | E14 | E14 | E14 | E14 | E14 | E14 | E14 |
| 16 | E15 | E15 | E15 | E15 | E15 | E15 | E15 | E15 |
| 17 | E16 | E16 | E16 | E16 | E16 | E16 | E16 | E16 |
| 18 | E17 | E17 | E17 | E17 | E17 | E17 | E17 | E17 |
| 19 | E18 | E18 | E18 | E18 | E18 | E18 | E18 | E18 |
| 20 | E19 | E19 | E19 | E19 | E19 | E19 | E19 | E19 |
| 21 | E20 | E20 | E20 | E20 | E20 | E20 | E20 | E20 |
| 22 | E21 | E21 | E21 | E21 | E21 | E21 | E21 | E21 |
| 23 | E22 | E22 | E22 | E22 | E22 | E22 | E22 | E22 |
| 24 | E23 | E23 | E23 | E23 | E23 | E23 | E23 | E23 |
| 25 | E24 | E24 | E24 | E24 | E24 | E24 | E24 | E24 |
| 26 | E25 | E25 | E25 | E25 | E25 | E25 | E25 | E25 |
| 27 | E26 | E26 | E26 | E26 | E26 | E26 | E26 | E26 |
| 28 | E27 | E27 | E27 | E27 | E27 | E27 | E27 | E27 |
| 29 | E28 | E28 | E28 | E28 | E28 | E28 | E28 | E28 |

Figure 31:
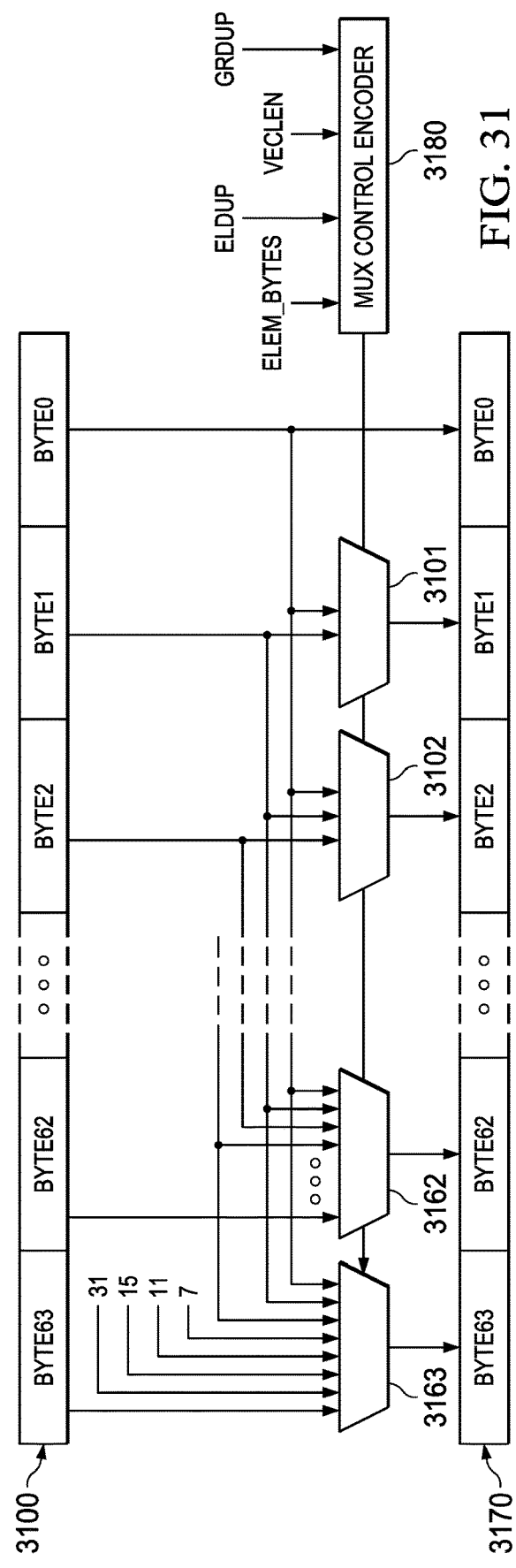
FIG. 31 illustrates an example of a vector length masking/group duplication block.

FIG. 31 illustrates an example of vector length masking/group duplication block 2025 (see FIG. 20) that is included within formatter block 1903 of FIG. 19. Input register 3100 receives a vector input from element duplication block 2024 shown in FIG. 20. Input register 3100 includes 64 bytes arranged in 64 1-byte blocks byte0 to byte63. Note that bytes byte0 to byte63 are each equal in length to the minimum of ELEM_BYTES. A set of multiplexers 3101 to 3163 couple input bytes from source register 3100 to output register 3170. Each respective multiplexer 3101 to 3163 supplies an input to a respective byte1 to byte63 of output register 3170. Not all input bytes byte0 to byte63 of input register 3100 are coupled to every multiplexer 3101 to 3163. Note there is no multiplexer supplying byte0 of output register 3170. In this example, byte0 of output register 3170 is supplied by byte0 of input register 3100.

Multiplexers 3101 to 3163 are controlled by multiplexer control encoder 3180. Multiplexer control encoder 3180 receives ELEM_BYTES, VECLEN and GRDUP input signals and generates respective control signals for multiplexers 3101 to 3163. ELEM_BYTES and ELDUP are supplied to multiplexer control encoder 3180 to check to see that VECLEN is at least as great as the product of ELEM_BYTES and ELDUP. In operation, multiplexer control encoder 3180 controls multiplexers 3101 to 3163 to transfer least significant bits equal in number to VECLEN from input register 3100 to output register 3170. If GRDUP=0 indicating group duplication disabled, then multiplexer control encoder 3180 controls the remaining multiplexers 3101 to 3163 to transfer zeros to all bits in the remaining most significant lanes of output register 3170. If GRDUP=1 indicating group duplication enabled, then multiplexer control encoder 3180 controls the remaining multiplexers 3101 to 3163 to duplicate the VECLEN number of least significant bits of input register 3100 into the most significant lanes of output register 3170. This control is similar to the element duplication control described above and fills the output register 3170 with the first vector. For the next vector, data within input register 3100 is rotated down by VECLEN, discarding the previous VECLEN least significant bits. The rate of data movement in formatter 1903 (FIG. 19) is set by the rate of consumption of data by processing unit core 110 (FIG. 1) via stream read and advance instructions described below. The group duplication formatting repeats as long as the stream includes additional data elements.

Element duplication (ELDUP) and group duplication (GRDUP) are independent. Note these features include independent specification and parameter setting. Thus, element duplication and group duplication can be used together or separately. Because of how these are specified, element duplication permits overflow to the next vector while group duplication does not.

Referring again to FIG. 30, the DECIM field 3007 controls data element decimation of the corresponding stream. Streaming engine 125 deletes data elements from the stream upon storage in respective stream head registers 2818/2828 for presentation to the requesting functional unit. Decimation removes whole data elements, not sub-elements. The DECIM field 3007 is defined as listed in Table 21.

TABLE 21

| DECIM | Decimation Factor |
|---|---|
| 00 | No Decimation |
| 01 | 2 times |
| 10 | 4 times |
| 11 | Reserved |

If DECIM field 3007 equals 00, then no decimation occurs. The data elements are passed to the corresponding stream head registers 2818/2828 without change. If DECIM field 3007 equals 01, then 2:1 decimation occurs. Streaming engine 125 removes odd number elements from the data stream upon storage in the stream head registers 2818/2828. Limitations in the formatting network require 2:1 decimation to be employed with data promotion by at least 2× (PROMOTE cannot be 000), ICNT0 must be multiple of 2, and the total vector length (VECLEN) must be large enough to hold a single promoted, duplicated element. For transposed streams (TRANSPOSE≠0), the transpose granule must be at least twice the element size in bytes before promotion. If DECIM field 3007 equals 10, then 4:1 decimation occurs. Streaming engine 125 retains every fourth data element removing three elements from the data stream upon storage in the stream head registers 2818/2828. Limitations in the formatting network require 4:1 decimation to be employed with data promotion by at least 4× (PROMOTE cannot be 000, 001 or 101), ICNT0 must be a multiple of 4 and the total vector length (VECLEN) must be large enough to hold a single promoted, duplicated element. For transposed streams (TRANSPOSE≠0), in one example, decimation removes columns, and does not remove rows. Thus, in such cases, the transpose granule must be at least twice the element size in bytes before promotion for 2:1 decimation (GRANULE≥2×ELEM_BYTES) and at least four times the element size in bytes before promotion for 4:1 decimation (GRANULE≥4×ELEM_BYTES).

The THROTTLE field 3008 controls how aggressively the streaming engine fetches ahead of processing unit core 110. The coding of the two bits of this field is defined as shown in Table 22.

TABLE 22

| THROTTLE | Description |
| --- | --- |
| 00 | Minimum throttling, maximum fetch ahead |
| 01 | Less throttling, more fetch ahead |
| 10 | More throttling, less fetch ahead |
| 11 | Maximum throttling, minimum fetch ahead |

THROTTLE does not change the meaning of the stream and serves only as a hint. The streaming engine can ignore this field. Programs should not rely on the specific throttle behavior for program correctness, because the architecture does not specify the precise throttle behavior. THROTTLE allows programmers to provide hints to the hardware about the program behavior. By default, the streaming engine attempts to get as far ahead of processing unit core 110 as possible to hide as much latency as possible (equivalent to THROTTLE=11), while providing full stream throughput to processing unit core 110. While some applications need this level of throughput, such throughput can cause bad system level behavior for others. For example, the streaming engine discards all fetched data across context switches. Therefore, aggressive fetch-ahead can lead to wasted bandwidth in a system with large numbers of context switches.

The DIMFMT field 3009 defines which of the loop count fields ICNT0 2901, ICNT1 2902, ICNT2 2903, ICNT3 2804, ICNT4 2905 and ICNT5 2906, of the loop dimension fields DIM1 2911, DIM2 2912, DIM3 2913, DIM4 2914 and DIM5 2915 and of the addressing mode fields AM0 3013, AM1 3014, AM2 3015, AM3 3016, AM4 3017 and AM5 3018 (part of FLAGS field 2921) of the stream template register 2900 are active for the particular stream. Table 23 lists the active loops for various values of the DIMFMT field 3009. Each active loop count must be at least 1 and the outer active loop count must be greater than 1.

TABLE 23

| DIMFMT | Loop5 | Loop4 | Loop3 | Loop2 | Loop1 | Loop0 |
| --- | --- | --- | --- | --- | --- | --- |
| 000 | Inactive | Inactive | Inactive | Inactive | Inactive | Active |
| 001 | Inactive | Inactive | Inactive | Inactive | Active | Active |
| 010 | Inactive | Inactive | Inactive | Active | Active | Active |
| 011 | Inactive | Inactive | Active | Active | Active | Active |
| 100 | Inactive | Active | Active | Active | Active | Active |
| 101 | Active | Active | Active | Active | Active | Active |
| 110-111 | Reserved | | | | | |

The DIR bit 3010 determines the direction of fetch of the inner loop (Loop0). If the DIR bit 3010 is 0, Loop0 fetches are in the forward direction toward increasing addresses. If the DIR bit 3010 is 1, Loop0 fetches are in the backward direction toward decreasing addresses. The fetch direction of other loops is determined by the sign of the corresponding loop dimension DIM1, DIM2, DIM3, DIM4 and DIM5.

The CBK0 field 3011 and the CBK1 field 3012 control the circular block size upon selection of circular addressing. The manner of determining the circular block size is described herein.

The AM0 field 3013, AM1 field 3014, AM2 field 3015, AM3 field 3016, AM4 field 3017 and AM5 field 3018 control the addressing mode of a corresponding loop, thus permitting the addressing mode to be independently specified for each loop. Each of AM0 field 3013, AM1 field 3014, AM2 field 3015, AM3 field 3016, AM4 field 3017 and AM5 field 3018 are three bits and are decoded as listed in Table 24.

TABLE 24

| AMx field | Meaning |
| --- | --- |
| 00 | Linear addressing |
| 01 | Circular addressing block size set by CBK0 |
| 10 | Circular addressing block size set by CBK0 + CBK1 + 1 |
| 11 | reserved |

In linear addressing, the address advances according to the address arithmetic whether forward or reverse. In circular addressing, the address remains within a defined address block. Upon reaching the end of the circular address block the address wraps around to the beginning limit of the block. Circular addressing blocks are limited to 2N addresses where N is an integer. Circular address arithmetic can operate by cutting the carry chain between bits and not allowing a selected number of most significant bits to change. Thus, arithmetic beyond the end of the circular block changes only the least significant bits. The block size is set as listed in Table 25.

TABLE 25

| Encoded Block Size CBK0 or CBK0 + CBK1 + 1 | Block Size (bytes) |
| --- | --- |
| 0 | 512 |
| 1 | 1K |
| 2 | 2K |
| 3 | 4K |
| 4 | 8K |
| 5 | 16K |
| 6 | 32K |
| 7 | 64K |
| 8 | 128K |
| 9 | 256K |
| 10 | 512K |
| 11 | 1M |
| 12 | 2M |
| 13 | 4M |
| 14 | 8M |
| 15 | 16M |
| 16 | 32M |
| 17 | 64M |
| 18 | 128M |
| 19 | 256M |
| 20 | 512M |
| 21 | 1 G |
| 22 | 2 G |
| 23 | 4 G |
| 24 | 8 G |
| 25 | 16 G |
| 26 | 32 G |
| 27 | 64 G |
| 28 | Reserved |
| 29 | Reserved |
| 30 | Reserved |
| 31 | Reserved |

In this example, the circular block size is set by the number encoded by CBK0 (first circular address mode 01) or the number encoded by CBK0+CBK1+1 (second circular address mode 10). For example, in the first circular address mode, the circular address block size can range from 512 bytes to 16 M bytes. For the second circular address mode, the circular address block size can range from 1 K bytes to 64 G bytes. Thus, the encoded block size is $2^{(B+9)}$ bytes, where B is the encoded block number which is CBK0 for the first block size (AMx of 01) and CBK0+CBK1+1 for the second block size (AMx of 10).

The processing unit 110 (FIG. 1) exposes the streaming engine 125 (FIG. 28) to programs through a small number of instructions and specialized registers. Programs start and end streams with SEOPEN and SECLOSE. SEOPEN opens a new stream and the stream remains open until terminated explicitly by SECLOSE or replaced by a new stream with SEOPEN. The SEOPEN instruction specifies a stream number indicating opening stream 0 or stream 1. The SEOPEN instruction specifies a data register storing the start address of the stream. The SEOPEN instruction also specifies a stream template register that stores the stream template as described above. The arguments of the SEOPEN instruction are listed in Table 26.

TABLE 26

| Argument | Description |
| --- | --- |
| Stream Start Address Register | Scalar register storing stream start address |
| Stream Number | Stream 0 or Stream 1 |
| Stream Template Register | Vector register storing stream template data |

The stream start address register is a register in general scalar register file 211 (FIG. 2) in this example. The SEOPEN instruction can specify the stream start address register via src1 field 1303 (FIG. 13) of example instruction coding 1300 (FIG. 13). The SEOPEN instruction specifies stream 0 or stream 1 in the opcode. The stream template register is a vector register in general vector register file 221 in this example. The SEOPEN instruction can specify the stream template register via src2/cst field 1302 (FIG. 13). If the specified stream is active, the SEOPEN instruction closes the prior stream and replaces the stream with the specified stream.

SECLOSE explicitly marks a stream inactive, flushing any outstanding activity. Any further references to the stream trigger exceptions. SECLOSE also allows a program to prematurely terminate one or both streams.

An SESAVE instruction saves the state of a stream by capturing sufficient state information of a specified stream to restart that stream in the future. An SERSTR instruction restores a previously saved stream. An SESAVE instruction saves the stream metadata and does not save any of the stream data. The stream re-fetches stream data in response to an SERSTR instruction.

Each stream can be in one of three states: inactive, active, or frozen after reset. Both streams begin in the inactive state. Opening a stream moves the stream to the active state. Closing the stream returns the stream to the inactive state. In the absence of interrupts and exceptions, streams ordinarily do not make other state transitions. To account for interrupts, the streaming engine adds a third state: frozen. The frozen state represents an interrupted active stream.

In this example, four bits, two bits per stream, define the state of both streams. One bit per stream resides within the streaming engine, and the other bit resides within the processor core 110. The streaming engine internally tracks whether each stream holds a parameter set associated with an active stream. This bit distinguishes an inactive stream from a not-inactive stream. The processor core 110 separately tracks the state of each stream with a dedicated bit per stream in the Task State Register (TSR): TSR.SE0 for stream 0, and TSR.SE1 for stream 1. These bits distinguish between active and inactive streams.

Opening a stream moves the stream to the active state. Closing a stream moves the stream to the inactive state. If a program opens a new stream over a frozen stream, the new stream replaces the old stream and the streaming engine discards the contents of the previous stream. The streaming engine supports opening a new stream on a currently active stream. The streaming engine discards the contents of the previous stream, flushes the pipeline, and starts fetching data for the new opened stream. Data to the processor is asserted once the data has returned. If a program closes an already closed stream, nothing happens. If a program closes an open or frozen stream, the streaming engine discards all state related to the stream, clears the internal stream-active bit, and clears the counter, tag and address registers. Closing a stream serves two purposes. Closing an active stream allows a program to specifically state the stream and the resources associated with the stream are no longer needed. Closing a frozen stream also allows context switching code to clear the state of the frozen stream, so that other tasks do not see it.

As noted above, there are circumstances when some data within a stream holding register 2818 or 2828 is not valid. As described above, such a state can occur at the end of an inner loop when the number of stream elements is less than the respective stream holding register 2818/2828 size or at the end of an inner loop when the number of stream elements remaining is less than the lanes defined by VECLEN. For times not at the end of an inner loop, if VECLEN is less than the width of stream holding register 2818/2828 and GRDUP is disabled, then lanes in stream holding register 2818/2828 in excess of VECLEN are invalid.

Referring again to FIG. 28, in this example streaming engine 125 further includes valid registers 2819 and 2829. Valid register 2819 indicates the valid lanes in stream head register 2818. Valid register 2829 indicates the valid lanes in stream head register 2828. Respective valid registers 2819/2829 include one bit for each minimum ELEM_BYTES lane within the corresponding stream head register 2818/2828. In this example, the minimum ELEM_BYTES is 1 byte. The preferred data path width of processor 100 and the data length of stream head registers 2818/2828 is 64 bytes (512 bits). Valid registers 2819/2829 accordingly have a data width of 64 bits. Each bit in valid registers 2819/2829 indicates whether a corresponding byte in stream head registers 2818/2828 is valid. In this example, a 0 indicates the corresponding byte within the stream head register is invalid, and a 1 indicates the corresponding byte is valid.

In this example, upon reading a respective one of the stream head registers 2818/2828 and transferring of data to the requesting functional unit, the invalid/valid data in the respective valid register 2819/2829 is automatically transferred to a data register within predicate register file 234 (FIG. 2) corresponding to the particular stream. In this example the valid data for stream 0 is stored in predicate register P0 and the valid data for stream 1 is stored in predicate register P1.

The valid data stored in the predicate register file 234 can be used in a variety of ways. The functional unit can combine the vector stream data with another set of vectors and then store the combined data to memory using the valid data indications as a mask, thus enabling the same process to be used for the end of loop data as is used for cases where all the lanes are valid which avoids storing invalid data. The valid indication stored in predicate register file 234 can be used as a mask or an operand in other processes. P unit 246 (FIG. 2) can have an instruction to count the number of 1's in a predicate register (BITCNT), which can be used to determine the count of valid data elements from a predicate register.

Figure 32:
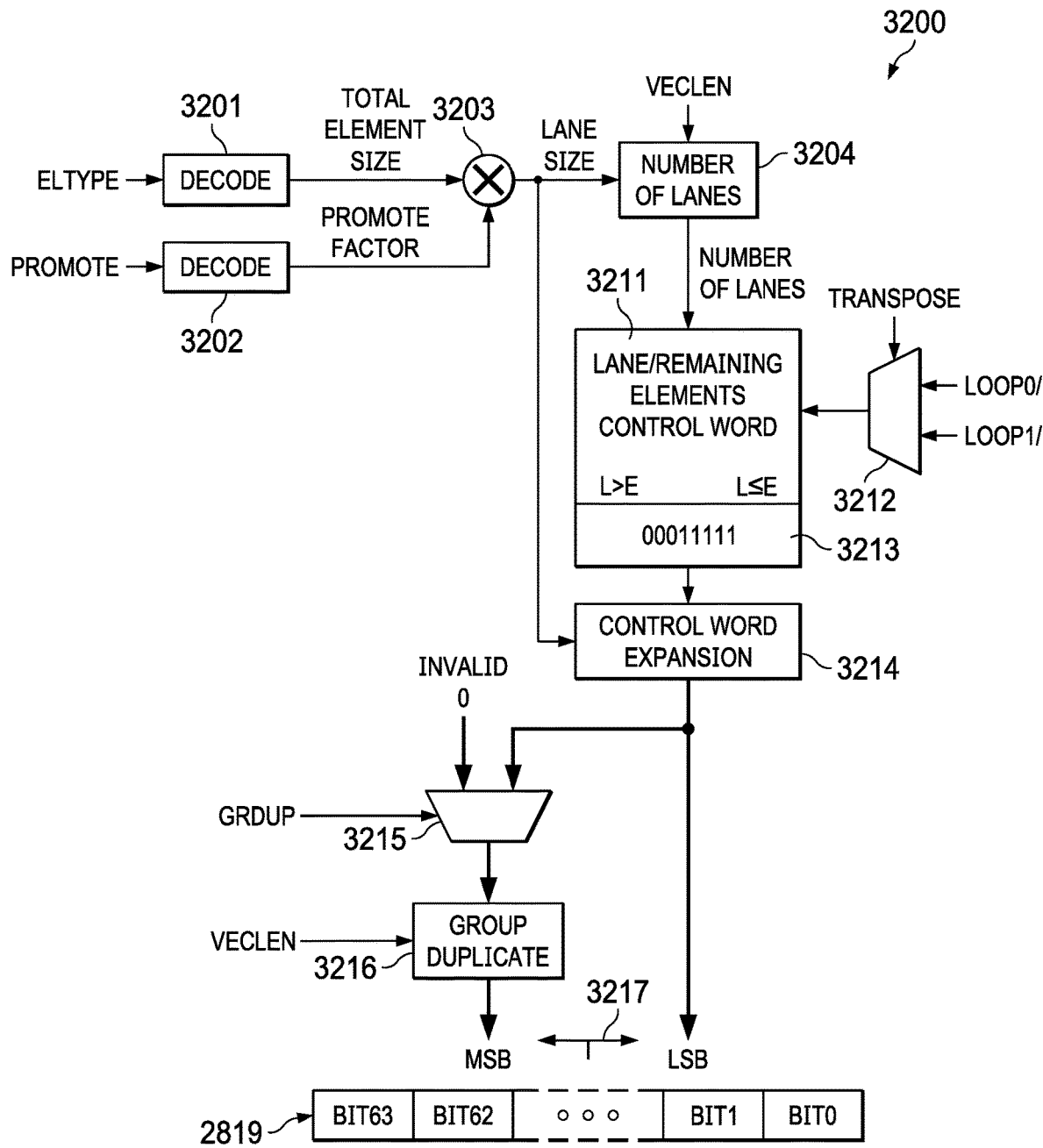
FIG. 32 is a partial schematic diagram of an example of the generation of the streaming engine valid or invalid indication.

FIG. 32 illustrates example hardware 3200 to produce the valid/invalid indications stored in the valid register 2819 (FIG. 28). FIG. 32 illustrates hardware for stream 0; stream 1 includes corresponding hardware. Hardware 3200 operates to generate one valid word each time data is updated in stream head register 2818 (FIG. 28). A first input ELTYPE is supplied to decoder 3201. Decoder 3201 produces an output TOTAL ELEMENT SIZE corresponding to the minimum data size based upon the element size ELEM_BYTES and whether the elements are real numbers or complex numbers. The meanings of various codings of ELTYPE are shown in Table 9. Table 27 shows an example output of decoder 3201 in bytes for the various ELTYPE codings. Note Table 9 lists bits and Table 27 lists bytes. As shown in Table 27, TOTAL ELEMENT SIZE is 1, 2, 4 or 8 bytes if the element is real and 2, 4, 8 or 16 bytes if the element is complex.

TABLE 27

| ELTYPE | Real/Complex | Total Element Size Bytes |
|---|---|---|
| 0000 | Real | 1 |
| 0001 | Real | 2 |
| 0010 | Real | 4 |
| 0011 | Real | 8 |
| 0100 | Reserved | Reserved |
| 0101 | Reserved | Reserved |
| 0110 | Reserved | Reserved |
| 0110 | Reserved | Reserved |
| 1000 | Complex, Not Swapped | 2 |
| 1001 | Complex, Not Swapped | 4 |
| 1010 | Complex, Not Swapped | 8 |
| 1011 | Complex, Not Swapped | 16 |
| 1100 | Complex, Swapped | 2 |
| 1101 | Complex, Swapped | 4 |
| 1110 | Complex, Swapped | 8 |
| 1111 | Complex, Swapped | 16 |

A second input PROMOTE is supplied to decoder 3202. Decoder 3202 produces an output promotion factor corresponding to the PROMOTE input. The meaning of various codings of PROMOTE are shown in Table 28, which shows an example output of decoder 3202 in bytes for the various PROMOTE codings. The difference in extension type (zero extension or sign extension) is not relevant to decoder 3202.

TABLE 28

| PROMOTE | Promotion Factor |
|---|---|
| 000 | 1 |
| 001 | 2 |
| 010 | 4 |
| 011 | 8 |
| 100 | Reserved |
| 101 | 2 |
| 110 | 4 |
| 111 | 8 |

The outputs of decoders 3201 and 3202 are supplied to multiplier 3203. The product produced by multiplier 3203 is the lane size corresponding to the TOTAL ELEMENT SIZE and the promotion factor. Because the promotion factor is an integer power of 2 ($2^N$), the multiplication can be achieved by corresponding shifting of the TOTAL ELEMENT SIZE, e.g., no shift for a promotion factor of 1, a one-bit shift for a promotion factor of 2, a two-bit shift for a promotion factor of 4, and a three-bit shift for a promotion factor of 8.

NUMBER OF LANES unit 3204 receives the vector length VECLEN and the LANE SIZE and generates the NUMBER OF LANES. Table 29 shows an example decoding of the number of lanes for lane size in bytes and the vector length VECLEN.

TABLE 29

| LANE SIZE | VECLEN | | | | | | |
|---|---|---|---|---|---|---|---|
| | 000 | 001 | 010 | 011 | 100 | 101 | 110 |
| 1 | 1 | 2 | 4 | 8 | 16 | 32 | 64 |
| 2 | — | 1 | 2 | 4 | 8 | 16 | 32 |
| 4 | — | — | 1 | 2 | 4 | 8 | 16 |
| 8 | — | — | — | 1 | 2 | 4 | 8 |
| 16 | — | — | — | — | 1 | 2 | 4 |
| 32 | — | — | — | — | — | 1 | 2 |
| 64 | — | — | — | — | — | — | 1 |

As previously stated, VECLEN must be greater than or equal to the product of the element size and the duplication factor. As shown in Table 29, VECLEN must also be greater than or equal to the product of the element size and the promotion factor. This means that VECLEN must be large enough to guarantee that an element cannot be separated from its extension produced by type promotion block 2022 (FIG. 20). The cells below the diagonal in Table 29 marked "-" indicate an unpermitted combination of parameters.

The NUMBER OF LANES output of unit 3204 serves as one input to LANE/REMAINING ELEMENTS CONTROL WORD unit 3211. A second input comes from multiplexer 3212. Multiplexer 3212 receives a Loop0 input and a Loop1 input. The Loop0 input and the Loop1 input represent the number of remaining elements in the current iteration of the corresponding loop.

Figure 33:
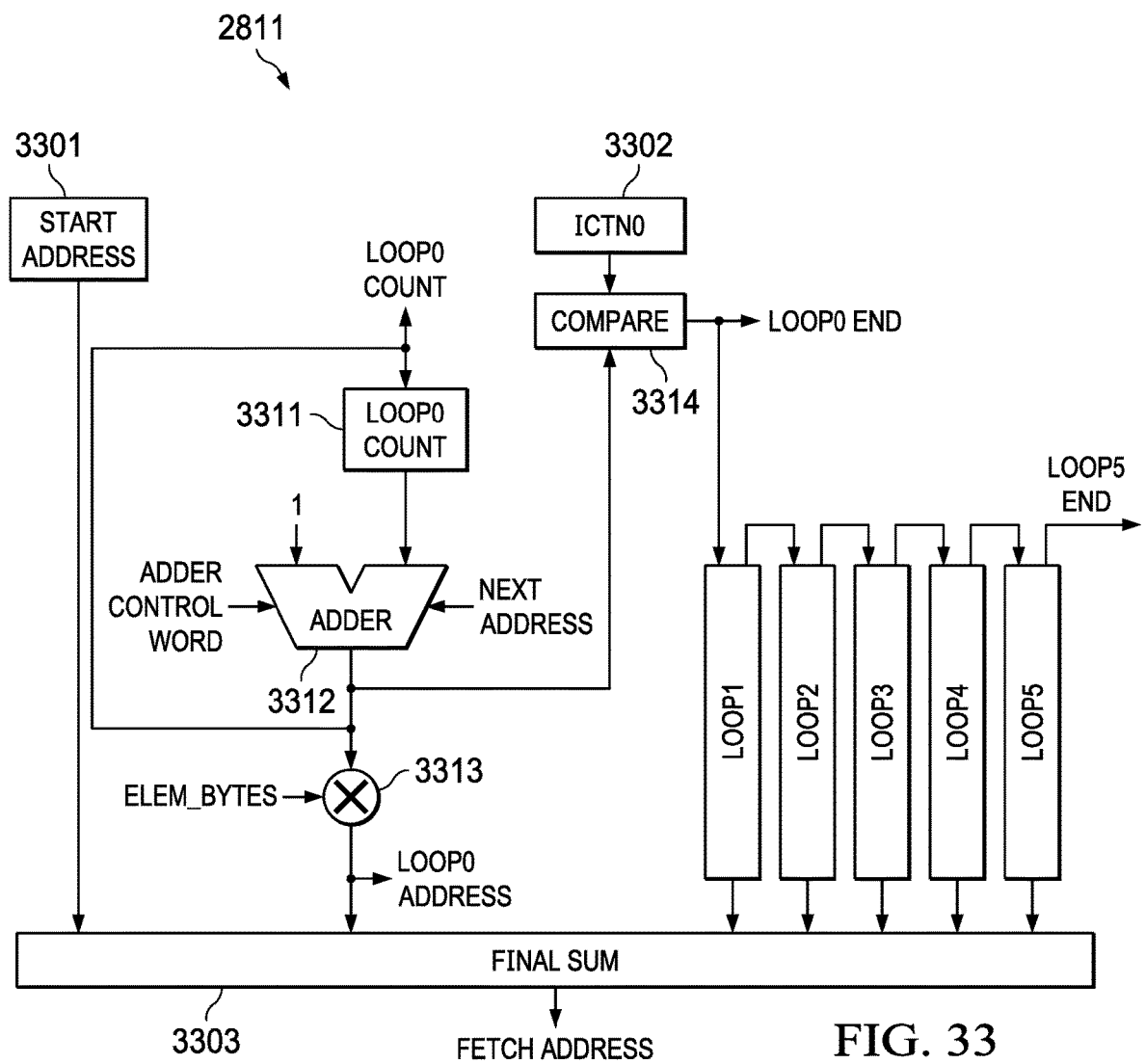
FIG. 33 is a partial schematic diagram of a streaming engine address generator illustrating generation of the loop address and loop count.

FIG. 33 illustrates a partial schematic view of address generator 2811 shown in FIG. 28. Address generator 2811 forms an address for fetching the next element in the defined stream of the corresponding streaming engine. Start address register 3301 stores a start address of the data stream. As previously described above, in this example, start address register 3301 is a scalar register in global scalar register file 211 designated by the SEOPEN instruction that opened the corresponding stream. The start address can be copied from the specified scalar register and stored locally at the respective address generator 2811/2821 by control logic included with address generator 2811. The first loop of the stream employs Loop0 count register 3311, adder 3312, multiplier 3313 and comparator 3314. Loop0 count register 3311 stores the working copy of the iteration count of the first loop (Loop0). For each iteration of Loop0, adder 3312, as triggered by the Next Address signal, adds 1 to the loop count, which is stored back in Loop0 count register 3311. Multiplier 3313 multiplies the current loop count and the quantity ELEM_BYTES. ELEM_BYTES is the size of each data element in loop0 in bytes. Loop0 traverses data elements physically contiguous in memory with an iteration step size of ELEM_BYTES.

Comparator 3314 compares the count stored in Loop0 count register 3311 (after incrementing by adder 3313) with the value of ICNT0 2901 (FIG. 29) from the corresponding stream template register 2900 (FIG. 29). When the output of adder 3312 equals the value of ICNT0 2901 of the stream template register 2900, an iteration of Loop0 is complete. Comparator 3314 generates an active Loop0 End signal. Loop0 count register 3311 is reset to 0 and an iteration of the next higher loop, in this case Loop1, is triggered.

Circuits for the higher loops (Loop1, Loop2, Loop3, Loop4 and Loop5) are similar to that illustrated in FIG. 33. Each loop includes a respective working loop count register, adder, multiplier and comparator. The adder of each loop is triggered by the loop end signal of the prior loop. The second input to each multiplier is the corresponding dimension DIM1, DIM2, DIM3, DIM4 and DIM5 from the corresponding stream template. The comparator of each loop compares the working loop register count with the corresponding iteration value ICNT1, ICNT2, ICNT3, ICNT4 and ICNT5 of the corresponding stream template register 2900. A loop end signal generates an iteration of the next higher loop. A loop end signal from Loop5 ends the stream.

FIG. 33 also illustrates the generation of Loop0 count. Loop0 count equals the updated data stored in the corresponding working count register 3311. Loop0 count is updated on each change of working Loop0 count register 3311. The loop counts for the higher loops (Loop1, Loop2, Loop3, Loop4 and Loop5) are similarly generated.

FIG. 33 also illustrates the generation of Loop0 address. Loop0 address equals the data output from multiplier 3313. Loop0 address is updated on each change of working Loop0 count register 3311. Similar circuits for Loop1, Loop2, Loop3, Loop4 and Loop5 produce corresponding loop addresses. In this example, Loop0 count register 3311 and the other loop count registers are implemented as count up registers. In another example, initialization and comparisons operate as count down circuits.

Referring again to FIG. 32, the value of the loop down count, such as Loop0/, is given by Loopx/=ICNTx−Loopx, i.e., the loop down count is the difference between the initial iteration count specified in the stream template register and the loop up count produced as illustrated in FIG. 33.

LANE/REMAINING ELEMENTS CONTROL WORD unit 3211 (FIG. 32) generates a control word 3213 based upon the number of lanes from NUMBER OF LANES unit 3204 and the loop down count selected by multiplexer 3212. The control input to multiplexer 3212 is the TRANSPOSE signal from field 3002 of FIG. 30. If TRANSPOSE is disabled ("000"), multiplexer 3212 selects the Loop0 down count Loop0/. For all other legal values of TRANSPOSE ("001", "010", "011", "100", "101" and "110") multiplexer 3212 selects the Loop1 down count Loop1/. The streaming engine maps the innermost dimension to consecutive lanes in a vector. For normal streams this is Loop0. For transposed streams, this is Loop1, because transposition exchanges the two dimensions.

LANE/REMAINING ELEMENTS CONTROL WORD unit 3211 generates control word 3213 as follows. Control word 3213 has a number of bits equal to the number of lanes from unit 3204. If the remaining count of elements of the selected loop is greater than or equal to the number of lanes, then all lanes are valid. For this case, control word 3213 is all ones, indicating that all lanes within the vector length VECLEN are valid. If the remaining count of elements of the selected loop is nonzero and less than the number of lanes, then some lanes are valid and some are invalid. According to the lane allocation described above in conjunction with FIGS. 21 and 22, stream elements are allocated lanes starting with the least significant lanes. Under these circumstances, control word 3213 includes a number of least significant bits set to one equal to the number of the selected loop down count. All other bits of control word 3213 are set to zero. In the example illustrated in FIG. 32, the number of lanes equals eight and there are five valid (1) least significant bits followed by three invalid (0) most significant bits which corresponds to a loop having five elements remaining in the final iteration.

Control word expansion unit 3214 expands the control word 3213 based upon the magnitude of LANE SIZE. The expanded control word includes one bit for each minimally sized lane. In this example, the minimum stream element size, and thus the minimum lane size, is one byte (8 bits). In this example, the size of holding registers 2818/2828 equals the vector size of 64 bytes (512 bits). Thus, the expanded control word has 64 bits, one bit for each byte of stream holding registers 2818/2828. This expanded control word fills the least significant bits of the corresponding valid register 2819 and 2829 (FIG. 28).

For the case when VECLEN equals the vector length, the description is complete. The expanded control word includes bits for all places within respective valid register 2819/2829. There are some additional considerations when VECLEN does not equal the vector length. When VECLEN does not equal the vector length, the expanded control word does not have enough bits to fill the corresponding valid register 2819/2829. As illustrated in FIG. 32, the expanded control word fills the least significant bits of the corresponding valid register 2819/2829, thus providing the valid/invalid bits for lanes within the VECLEN width. Another mechanism is provided for lanes beyond the VECLEN width up to the data width of stream head register 2818.

Referring still to FIG. 32, multiplexer 3215 and group duplicate unit 3216 are illustrated to provide the needed additional valid/invalid bits. Referring to the description of VECLEN, if group duplication is not enabled (GRDUP=0), then the excess lanes are not valid. A first input of multiplexer 3215 is an INVALID 0 signal that includes multiple bits equal in number to VECLEN. When GRDUP=0, multiplexer 3215 selects this input. Group duplicate unit 3216 duplicates this input to all excess lanes of stream head register 2818. Thus, the most significant bits of valid register 2819 are set to zero indicating the corresponding bytes of stream head register 2818 are invalid. This occurs for vectors 1-8 of the example shown in Table 15, vectors 1-15 of the example shown in Table 16, and vectors 1-29 of the example shown in Table 17.

In another example, mux 3215 and group duplicate block 3216 are replaced with group duplicate logic that is similar to the group duplicate logic 2025 illustrated in FIG. 31.

As previously described, if group duplication is enabled (GRDUP=1), then the excess lanes of stream head register 2818 (FIG. 28) are filled with copies of the least significant bits. A second input of multiplexer 3215 is the expanded control word from control word expansion unit 3214. When GRDUP=1, multiplexer 3215 selects this input. Group duplicate unit 3216 duplicates this input to all excess lanes of stream head register 2818.

There are two possible outcomes. In one outcome, in most cases, all the lanes within VECLEN are valid and the bits from control word expansion unit 3214 are all ones. This occurs for vectors 1-7 of the group duplication example shown in Table 18 and vectors 1-14 of the group duplication example shown in Table 19. Under these conditions, all bits of the expanded control word from control word expansion unit 3214 are one and all lanes of stream head register 2818 are valid. Group duplicate unit 3216 thus fills all the excess lanes with ones. In the other outcome, the number of remaining stream data elements is less than the number of lanes within VECLEN. This occurs for vector 8 in the group duplication example shown in Table 18 and vector 15 in the group duplication example shown in Table 19. Under these conditions, some lanes within VECLEN are valid and some are invalid. Group duplicate unit 3216 fills the excess lanes with bits having the same pattern as the expanded control word bits. In either case, the excess lanes are filled corresponding to the expanded control bits.

Referring still to FIG. 32, a boundary 3217 is illustrated between the least significant bits and the most significant bits. The location of this boundary is set by the size of VECLEN relative to the size of stream head register 2818.

Figure 34:
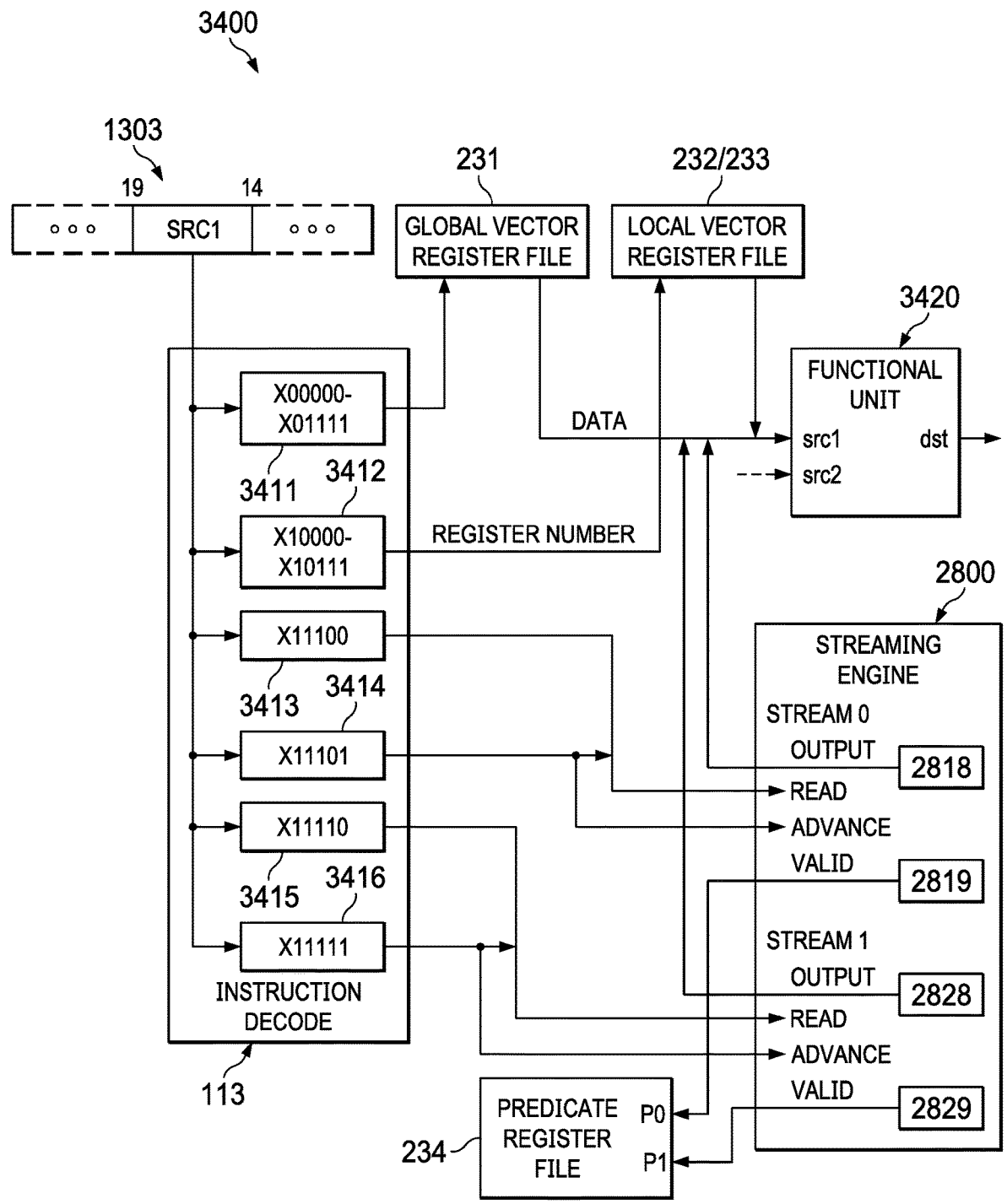
FIG. 34 illustrates a partial schematic diagram showing the streaming engine supply of data of this example.

FIG. 34 is a partial schematic diagram 3400 illustrating the stream input operand coding described above. In this example, the stream input operand is encoded using the lower five bits of the six bit operand field and the sixth bit is ignored. In other examples, all six bits of an operand field are used to encode the stream input operand. FIG. 34 illustrates a portion of instruction decoder 113 (see FIG. 1) decoding src1 field 1303 of one instruction to control corresponding src1 input of functional unit 3420. These same or similar circuits are duplicated for src2/cst field 1302 of an instruction controlling functional unit 3420. In addition, these circuits are duplicated for each instruction within an execute packet capable of employing stream data as an operand that are dispatched simultaneously.

Instruction decoder 113 receives the src1 field 1303 of an instruction. The opcode field 1304 and the unit field 1305 specify a corresponding functional unit 3420 and the function to be performed. In this example, functional unit 3420 can be L2 unit 241, S2 unit 242, M2 unit 243, N2 unit 244 or C unit 245. The relevant part of instruction decoder 113 illustrated in FIG. 34 decodes src1 field 1303. Sub-decoder 3411 determines whether the src1 field 1303 is in the range from 00000 to 01111. If this is the case, sub-decoder 3411 supplies a corresponding register number to global vector register file 231. In this example, the register number is the four least significant bits of the src1 field 1303. Global vector register file 231 recalls data stored in the register corresponding to the register number and supplies the data to the src1 input of functional unit 3420.

Sub-decoder 3412 determines whether the src1 field 1303 is in the range from 10000 to 10111. If this is the case, sub-decoder 3412 supplies a corresponding register number to the corresponding local vector register file. If the instruction is directed to L2 unit 241 or S2 unit 242, the corresponding local vector register file is local vector register file 232. If the instruction is directed to M2 unit 243, N2 unit 244 or C unit 245, the corresponding local vector register file is local vector register file 233. In this example, the register number is the three least significant bits of the src1 field 1303. The corresponding local vector register file 232/233 recalls data stored in the register corresponding to the register number and supplies the data to the src1 input of functional unit 3420.

Sub-decoder 3413 determines whether the src1 field 1303 is 11100. If this is the case, sub-decoder 3413 supplies a stream 0 read signal to streaming engine 125. Streaming engine 125 then supplies stream 0 data stored in holding register 2818 to the src1 input of functional unit 3420.

Sub-decoder 3414 determines whether the src1 field 1303 is 11101. If this is the case, sub-decoder 3414 supplies a stream 0 read signal to streaming engine 125. Streaming engine 125 then supplies stream 0 data stored in holding register 2818 to the src1 input of functional unit 3420. Sub-decoder 3414 also supplies an advance signal to stream 0. As previously described, streaming engine 125 advances to store the next sequential vector of data elements of stream 0 in holding register 2818.

Supply of a stream 0 read signal to streaming engine 125 by either sub-decoder 3413 or sub-decoder 3414 triggers another data movement. Upon such a stream 0 read signal, streaming engine 125 supplies the data stored in valid register 2819 to predicate register file 234 for storage. In accordance with this example, this is a predetermined data register within predicate register file 234. In this example, data register P0 corresponds to stream 0.

Sub-decoder 3415 determines whether the src1 field 1303 is 11110. If this is the case, sub-decoder 3415 supplies a stream 1 read signal to streaming engine 125. Streaming engine 125 then supplies stream 1 data stored in holding register 2828 to the src1 input of functional unit 3420.

Sub-decoder 3416 determines whether the src1 field 1303 is 11111. If this is the case, sub-decoder 3416 supplies a stream 1 read signal to streaming engine 125. Streaming engine 125 then supplies stream 1 data stored in holding register 2828 to the src1 input of functional unit 3420. Sub-decoder 3414 also supplies an advance signal to stream 1. As previously described, streaming engine 125 advances to store the next sequential vector of data elements of stream 1 in holding register 2828.

Supply of a stream 1 read signal to streaming engine 125 by either sub-decoder 3415 or sub-decoder 3416 triggers another data movement. Upon such a stream 1 read signal, streaming engine 125 supplies the data stored in valid register 2829 to predicate register file 234 for storage. In accordance with this example, this is a predetermined data register within predicate register file 234. In this example, data register P1 corresponds to stream 1.

Similar circuits are used to select data supplied to src2 input of functional unit 3402 in response to the bit coding of src2/cst field 1302. The src2 input of functional unit 3420 can be supplied with a constant input in a manner described above. If instruction decoder 113 generates a read signal for stream 0 from either src1 field 1303 or src2/cst field 1302, streaming engine 125 supplies the data stored in valid register 2819 to predicate register P0 of predicate register file 234 for storage. If instruction decode 113 generates a read signal for stream 1 from either src1 field 1303 or src2/cst field 1302, streaming engine 125 supplies the data stored in valid register 2829 to predicate register P1 of predicate register file 234 for storage.

The exact number of instruction bits devoted to operand specification and the number of data registers and streams are design choices. In particular, the specification of a single global vector register file and omission of local vector register files is feasible. This example employs a bit coding of an input operand selection field to designate a stream read and another bit coding to designate a stream read and advancing the stream.

The process illustrated in FIG. 34 automatically transfers valid data into predicate register file 234 each time stream data is read. The transferred valid data can then be used by P unit 246 for further calculation of meta data. The transferred valid data can also be used as a mask or as an operand for other operations by one or more of vector data path side B 116 functional units including L2 unit 241, S2 unit 242, M2 unit 243, N2 unit 244 and C unit 245. There are numerous feasible compound logic operations employing this stream valid data.

Figure 35:
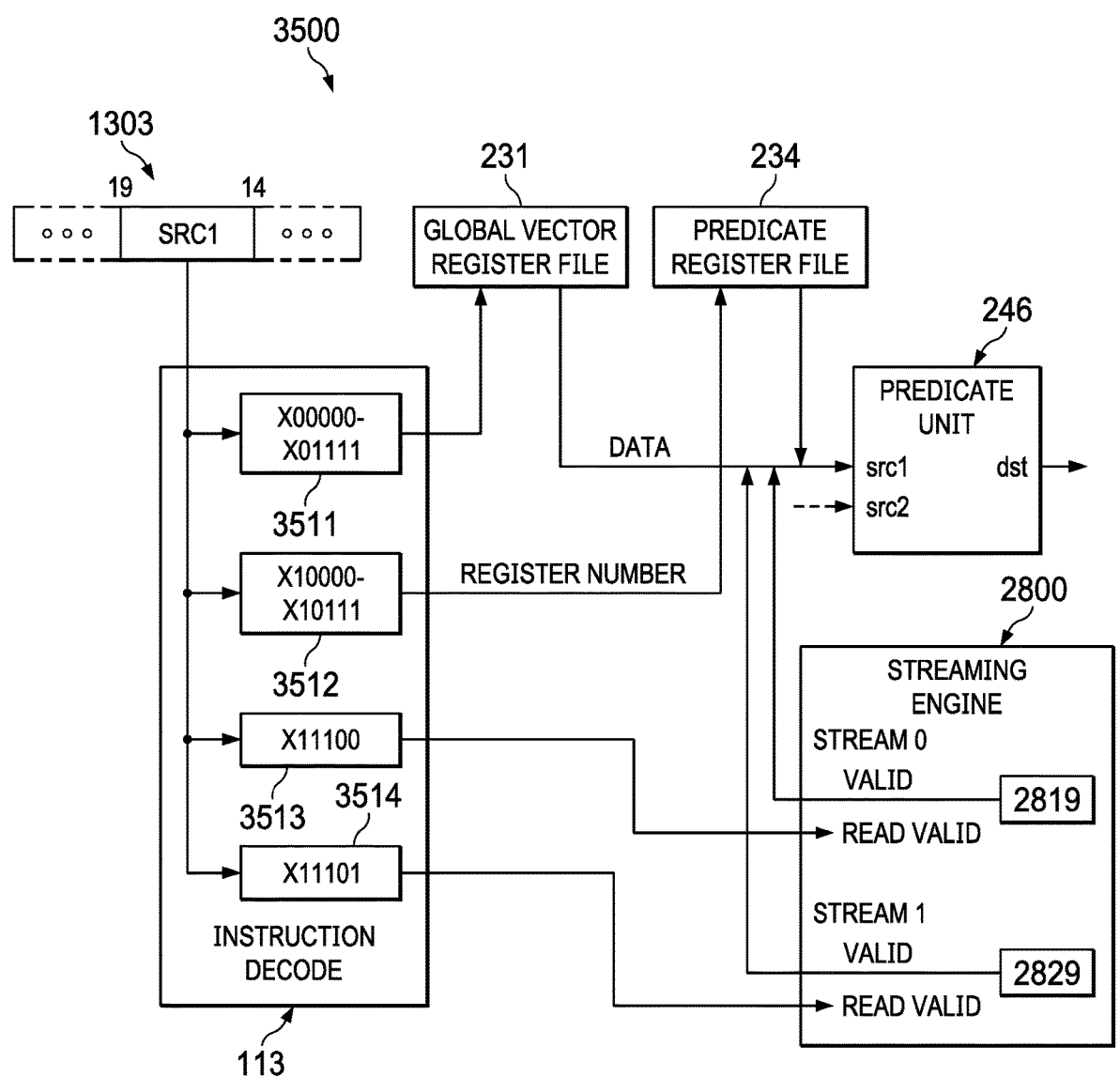
FIG. 35 illustrates a partial schematic diagram showing the streaming engine supply of valid data to the predicate unit.

FIG. 35 is a partial schematic diagram 3500 illustrating another example configuration for selecting operand sources. In this example, the stream input operand is encoded using the lower five bits of the six bit operand field and the sixth bit is ignored. In other examples, all six bits of an operand field are used to encode the stream input operand. In this example, the respective stream valid register 2819/2829 need not be automatically loaded to a predetermined register in predicate register file 234. Instead, an explicit instruction to P unit 246 is used to move the data. FIG. 35 illustrates a portion of instruction decoder 113 (see FIG. 1) decoding src1 field 1303 of one instruction to control a corresponding src1 input of P unit 246. These same or similar circuits can be duplicated for src2/cst field 1302 (FIG. 13) of an instruction controlling P unit 246.

Instruction decoder 113 receives the src1 field 1303 of an instruction. The opcode field opcode field 1304 and the unit field 1305 specify P unit 246 and the function to be performed. The relevant part of instruction decoder 113 illustrated in FIG. 35 decodes the src1 field 1303. Sub-decoder 3511 determines whether the src1 field 1303 is in the range 00000 to 01111. If this is the case, sub-decoder 3511 supplies a corresponding register number to global vector register file 231. In this example, the register number is the four least significant bits of the src1 field 1303. Global vector register file 231 recalls data stored in the register corresponding to the register number and supplies the data to the src1 input of P unit 246.

Sub-decoder 3512 determines whether the src1 field 1303 is in the range 10000 to 10111. If this is the case, sub-decoder 3512 supplies a decoded register number to the predicate register file 234. In this example, the register number is the three least significant bits of the src1 field 1303. The predicate register file 234 recalls data stored in the register corresponding to the register number and supplies the data to the src1 input of predicate unit 246.

Sub-decoder 3513 determines whether the src1 field 1303 is 11100. If this is the case, sub-decoder 3513 supplies a stream 0 valid read signal to streaming engine 125. Streaming engine 125 then supplies valid data stored in valid register 2819 to the src1 input of P unit 246.

Sub-decoder 3514 determines whether the src1 field 1303 is 11101. If this is the case, sub-decoder 3514 supplies a stream 1 valid read signal to streaming engine 125. Streaming engine 125 then supplies stream 1 valid data stored in valid register 2829 to the src1 input of P unit 246.

The P unit 246 instruction employing the stream valid register 2819/2829 as an operand can be any P unit instruction previously described such as NEG, BITCNT, RMBD, DECIMATE, EXPAND, AND, NAND, OR, NOR, and XOR.

The special instructions noted above can be limited to P unit 242. Thus, the operations outlined in FIGS. 34 and 35 can be used together. If the functional unit specified by the instruction is L2 unit 241, S2 unit 242, M2 unit 243, N2 unit 244 or C unit 245, then the src1 field 1303 is interpreted as outlined with respect to FIG. 34. If the functional unit specified by the instruction is P unit 246, then the src1 field 1303 is interpreted as outlined with respect to FIG. 35. Alternatively, the automatic saving of the stream valid register to a predetermined predicate register illustrated in FIG. 34 can be implemented in one example and not implemented in another example.

As previously described in reference to FIGS. 1 and 2, the processing unit core 110 includes scalar data path side A 115 and vector data path side B 116. The scalar data path 115 is organized as one 64-bit slice and the vector data path 116 is organized into eight 64-bit slices that taken together correspond to an entire 512-bit vector. Each data path slice corresponds to a 64-bit SIMD lane. Scalar data path side A 116 includes M1 unit 223 and N1 unit 224 and vector data path side B 116 includes M2 unit 243 and N2 unit 244. Each of the M1, N1, M2, and N2 units may be referred to generally as a multiplication unit herein although a unit may include circuitry for operations other than multiplication.

In some examples, the multiplication units 223, 224 in scalar data path side A 115 include identical multiplication circuitry and the multiplication units 243, 244 in vector data path side B 116 include identical multiplication circuitry. The multipliers in the multiplication circuitry each produce Wallace tree outputs based on the inputs to the multipliers. Note that each multiplier output is not the complete result of a*b but rather is the final two compressed products, referred to as the partial sum and partial carry, from a Wallace tree. In other words, each multiplier outputs two 32-bit words that when added together produce the actual product. Additional description of such multipliers may be found, for example, in U.S. Pat. No. 8,918,445, issued Dec. 23, 2014, which is incorporated by reference herein in its entirety. Additional description of Wallace tree multipliers may also be found in P. Kumawat and G. Sujediya, "Design and Comparison of 8×8 Wallace Tree Multiplier using CMOS and GDI Technology," IOSR Journal of VLSI and Signal Processing, Vol. 7, Issue 4, pp. 57-62, July-August 2017.

In the example processing unit core 110, rather than having a single multiplication unit in each data path 115, 116 that controls all the multipliers in the data path, each data path has two multiplication units, e.g., M1/N1 223, 224 and M2/N2 243, 244, with some number of 16-bit by 16-bit multipliers split between the two units. More specifically, in this example, each data path 115, 116 includes sixteen 16-bit by 16-bit multipliers for each 64-bit wide slice supported by the data path. In the scalar data path 115, which supports one 64-bit wide slice, the multiplication units 223, 224 each include eight 16-bit by 16-bit multipliers. In the vector data path 116, which supports eight 64-bit wide slices, the multiplication units 243, 244 each include sixty-four 16-bit by 16-bit multipliers. Other examples may have more or fewer multipliers per multiplication unit and/or the maximum number of bits handled by the multipliers may differ.

Figure 36:
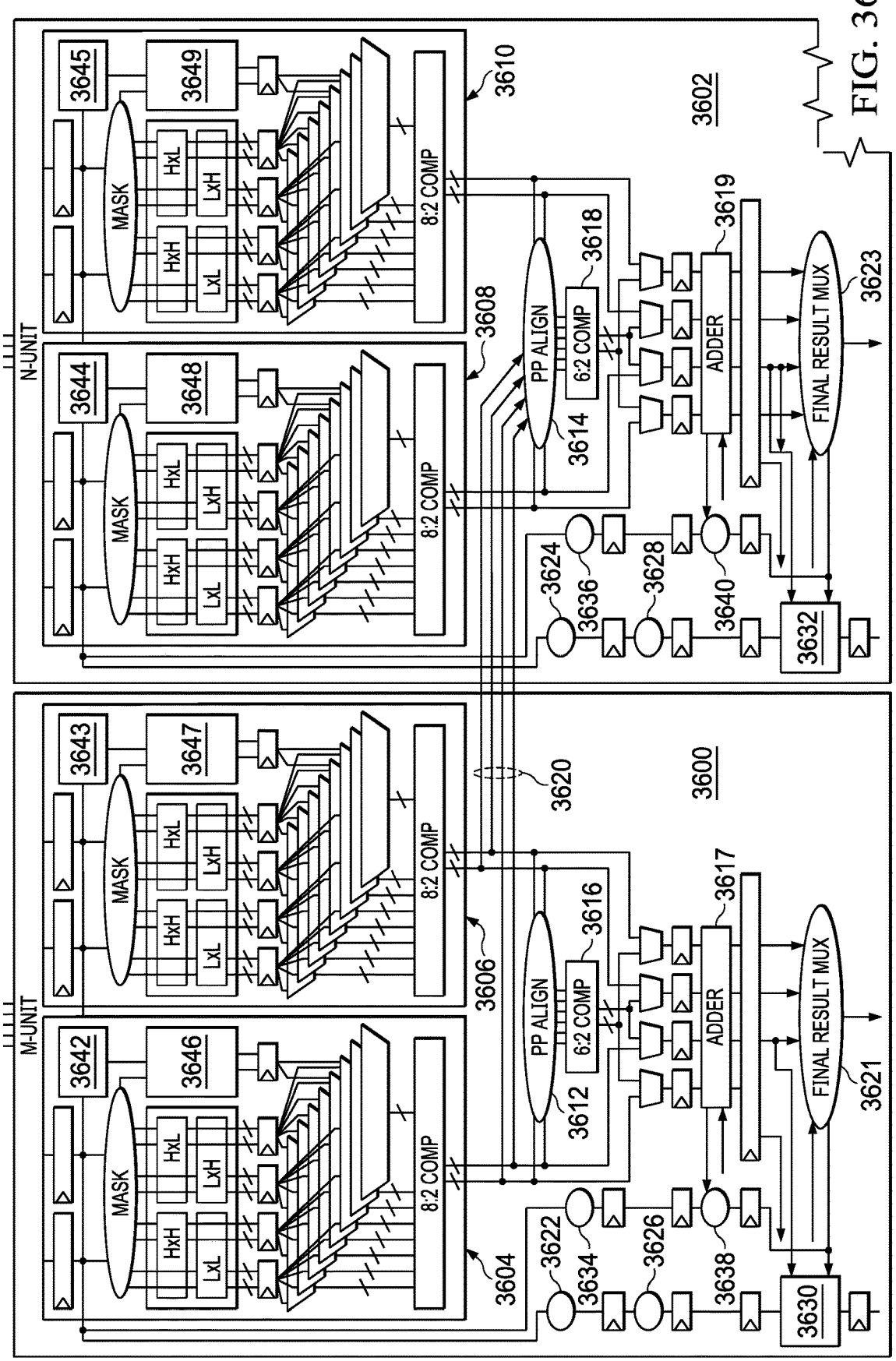
FIG. 36 illustrates an example of M unit slice multiply logic and N unit slice multiply logic in a data path.

FIG. 36 illustrates an example configuration of multipliers for a single 64-bit wide slice of a data path. In this example, the M unit slice multiply component 3600 includes two multiply clusters 3604, 3606 and the N unit slice multiply component 3602 includes two multiply clusters 3608, 3610. Each multiply cluster 3604, 3606, 3608, 3610 includes masking logic, an array of four 16-bit by 16-bit multipliers, a set of multiplexers coupled to the outputs of the multipliers, and a compressor (carry-save adder) coupled to the outputs of the set of multiplexers. Each input to a multiply cluster 3604, 3606, 3608, 3610 passes through the respective masking logic before being routed to respective multiplier arrays. The masking logic is configurable to mask off unused bits in the inputs for some multiplication operations.

Each set of multiplexers is configurable to arrange the outputs of the coupled multipliers for input into the respective compressor as needed for the particular instruction being executed. Each multiply cluster 3604, 3606, 3608, 3610 is configured to perform, for example, four 16×16 multiplies, one 32×32 multiply, one 32×32 complex multiply, or one 32×32 complex multiply with one operand conjugated.

Additional compressors (carry-save adders) 3616, 3618 are coupled via respective partial product alignment multiplexing logic 3612, 3614 to receive the outputs of two respective multiply clusters 3604, 3606, 3608, 3610. The partial product alignment multiplexing logic 3614 is also coupled to receive outputs of the multiply clusters 3604, 3606 and the compressor 3618 is configured to generate, for example, one 64×64 bit multiply for double precision floating point, one 64×64 complex multiply, or one 64×64 complex multiply with one operand conjugated using the outputs of the coupled multiply clusters.

The compressors 3616, 3618 are also configurable to add two sets of partial sum and partial carry from respective multiply clusters 3604, 3606, 3608, 3610 for 32×32 dot product operations, 8-tap finite impulse filter (FIR) operations, or matrix multiplication operations. The FIR instructions and matrix multiplication instructions that operate on the multiplication units 223, 224 are described in more detail herein. Outputs of the compressors 3616, 3618 are 128-bit partial sum and 128-bit partial carry.

Four 64-bit wide multiplexers are coupled to each compressor 3616, 3618 to either select the partial sum and partial carry output from the respective compressor 3616, 3618 or bypass the output based on the instruction being performed. The 128-bit adders 3617, 3619 are configured to calculate final products by adding the partial sum and partial carry using carry propagating addition. The adders 3617, 3619 are configured to perform four 32-bit additions, two 64-bit additions, or one 128-bit addition based on the instruction being executed. One 52-bit double precision floating point mantissa, two 23-bit single precision floating point mantissas, one 64-bit integer, or two 32-bit integers can be extracted from the output of the adder 3619. The output of the adder 3617 is the same as that of the adder 3619 except that the adder 3617 does not output a double precision mantissa. The final result multiplexers 3621, 3623 are coupled to respective adders 3617, 3619 to receive the outputs and are configured to produce a final result based on the instruction being executed.

As previously mentioned herein, multiply instructions may be single issue instructions or dual issue instructions. Single issue instructions are those instructions that can be executed independently in each multiplication unit 223, 224, 243, 244 in a data path 115, 116, i.e., instructions that can be executed on a single multiplication unit. In a single issue multiply instruction, the number of 16×16 or 8×8 multiplies needed for the instruction is not greater than what a multiplication unit provides for a slice. Further, two single issue multiply instructions can be executed independently and in parallel—e.g., one in M2 unit 243 and the other in N2 unit 244—to achieve 2× multiply throughput and hence 2× performance. For example, consider a complex multiply instruction that multiplies 16 complex elements with 16 complex elements in which each element is 16-bit real and 16-bit imaginary and produces 16 complex outputs in which each output is 16-bit real and 16-bit imaginary after rounding. With two multiplication units in a data path, two such complex multiply instructions can be executed in parallel in the data path to produce 32 complex outputs.

In another example, consider an algorithm that uses a vector multiply operation which multiplies half-words. With a single multiplication unit, only one multiply per clock cycle can be executed. With 32 half words per vector, performance is limited to 32 multiplies per clock cycle, even though the single multiplication unit contains 128 16×16 multipliers. With two multiplication units each having 64 16×16 multipliers, 64 multiplies can be executed per clock cycle. In another example, a 32-bit single-precision vector multiply instruction utilizes only 64 16×16 multipliers as there are sixteen single-precision numbers in each vector, and each takes four 16×16 multipliers. With two multiplication units, instruction throughput can be doubled by using 128 16×16 multipliers.

A dual issue instruction is an instruction that is executed on both multiplication units in a data path such that the multiplication units are "coupled", i.e., execute in lock-step, to share the multipliers in both units as needed to complete instruction execution. For example, a dual issue instruction may be an instruction that requires more than eight 16×16 or sixteen 8×8 multiplications per slice. In some examples, a dual issue instruction is issued on the multiplication unit N1 224 or N2 244 and, in response, the respective multiplication unit M1 223 or M2 243 is dedicated to executing the dual issue instruction and no other instruction can be issued to the multiplication unit M1 or M2 until execution of the dual issue instruction is complete. Arrows 3620 in FIG. 36 show internal communication between the two slices of both units used to complete dual issue instructions. Also, for dual issue vector instructions which do not require more than the available multipliers in a single multiplication unit but produce 1024-bit double vector outputs, the M2 multiplication unit 243 and the N2 multiplication unit 244 can be used together such that the most-significant 512-bit result is communicated via the M2 unit 243 result bus and the least-significant 512-bit result is communicated via the N2 unit 244 result bus.

If an operand of a dual issue instruction is dual vector, e.g., a 1024-bit operand, the LSB vector is dispatched to the N2 unit and the MSB vector is dispatched to the M2 unit. If an operand is a single vector, the vector is dispatched on both the M2 unit and the N2 unit. This approach helps reduce the input wires routing back and forth between the M2 and N2 units and improves frequency, area and power. If the output of a dual issue instruction is dual vector, the LSB vector output is issued from the N2 unit and the MSB vector output is issued from the M2 unit. If output is a single vector, the output is issued from the N2 unit.

FIG. 37 illustrates an instruction format for a dual issue instruction. The DST field 3700 designates the destination register for the result, the SRC2 3702 and SRC1 3704 fields designate the operand registers, the opcode field 3708 designates the opcode of the instruction (which encodes the functional unit), and the V bit field 3710 indicates whether or not the instruction is a dual issue instruction. If the V bit 3710 is 1, the instruction is a dual issue instruction that is dispatched to both the M and N units; otherwise, the instruction is a single issue instruction that is dispatched according to the functional unit encoded in the opcode 3708.

FIG. 38 illustrates a block diagram of the data flow for instruction decoding in the N unit and the M unit. Decoding an instruction in the N unit is the same for a dual issue and a single issue instruction. However, decoding an instruction in M unit is more involved for a dual issue instruction. This involvement comes in the form of generating the register read and write enables from the SRC1, SRC2, DST registers and the conditional execution of the instruction using the scalar predication register using the CREGZ format.

For a dual issue instruction, if the DST field 3700 (FIG. 37) designates a single register, the write to that register happens only from the N unit and the write enable for the M unit is suppressed. If the DST field 3700 designates a register pair such as VB1 and VB0, the M unit writes to VB1 and the N unit writes to VB0. If the SRC2 field 3702 and/or the SRC1 field 3704 designate a register pair such as VB1 and VB0, the M unit reads from VB1, and the N unit reads from VB0. If a source field designates a single register, then both the N and M units read from the designated register.

As previously described herein, the CREGZ instruction format specifies the predication register to be used on a per unit basis for the conditional execution of an instruction. If the execute packet includes the CREGZ instruction format, then depending on the scalar predication information specified, the instruction will be conditionally executed. For a dual issue instruction, the N unit scalar predication information from the CREGZ instruction format (if present in the execute packet) is used for both M and N units and any M unit information is ignored.

Referring again to FIG. 36, consider the execution of an example dual issue vector multiply instruction that specifies SRC1 and SRC2 operands of 512-bit vectors (VB0, VB1) with eight 64-bit SIMD lanes, and produces eight 64-bit SIMD outputs. For each 64-bit output, the product of two 64-bit elements that are in a 64-bit SIMD lane is calculated. Sixteen 16×16 multiplies are needed to calculate a 64-bit× 64-bit product. Because each N2 unit slice multiply component has eight 16×16 multipliers, the eight 16×16 multipliers from the respective M2 unit slice multiply component are shared for execution of the instruction. An M2 unit slice multiply component computes the partial product of the 32 least significant bits of the 64-bit elements and the respective N2 unit slice multiply component computes the partial product of 32 most significant bits of the 64-bit elements. The partial products are routed from each M2 unit slice multiply component to the respective N2 unit slice multiply component where the partial products are aligned before the compressor produces the partial sum and partial carry. The adder in the N2 unit slice multiply component uses these two terms as inputs to produce the final product that is subsequently stored in the respective SIMD lane of the location specified in the DST field of the instruction.

The M1/N1 units 223, 224 and M2/N2 units 243, 244 of the processing unit core 110 are designed to handle single precision (SP) and double precision (DP) floating point multiply with both normal and subnormal numbers according to the IEEE Standard for Floating-Point Arithmetic (IEEE 754) in IEEE Std 754-2008, IEEE Computer Society, Aug. 29, 2008, pp. 1-70. The products of the single or double precision mantissas, also referred to as significands, are computed on shared 16×16 multipliers in the M and N units. As is described in more detail herein, a floating point pipeline in each set of slice multiply logic in the multiplication units 223, 224, 243, 244, e.g., M unit slice multiply component 3600 and N unit slice multiply component 3602, executes in parallel to the main execution path of the slice multiply logic to perform some floating point operations.

Each N unit slice multiply component and M unit slice multiply component in a data path 115, 116 can perform two single issue IEEE SP floating point multiply operations, i.e., the M2 unit 243 and N2 unit 244 in the vector data path 116 can each generate sixteen SP floating point products and the M1 unit 223 and N1 unit 224 in the scalar data path 115 can each generate two SP floating point products. The IEEE DP multiply instruction is dual issue so each pair of M and N unit multiply slice components can perform one IEEE DP floating point multiply, i.e., the M2 unit 243 and N2 unit 244 in the vector data path 116 can generate eight DP floating point products and the M1 unit 223 and N1 unit 224 in the scalar data path 115 can generate one DP floating point product.

Subnormal numbers, also referred to as denormal numbers, are very small floating point values near zero. Formally, subnormal numbers are numbers smaller than those that can be represented without leading zeros in the mantissa, e.g., normal numbers. Typically, floating point numbers are represented without leading zeros in the mantissa. Instead, the leading zeros in the number are moved to the exponent, e.g., 0.0123 is represented as $1.23 \times 10^{-2}$. Subnormal numbers are therefore numbers in which such a representation would cause the exponent to be lower than the minimum possible value. In such a situation, the mantissa is forced to have leading zeros. Thus, a subnormal number is represented with a biased exponent of all 0 bits, which represents an exponent of −126 in single precision (not −127), or −1022 in double precision (not −1023). In contrast, the smallest biased exponent representing a normal number is 1.

Accordingly, the binary representation of a floating point number is made unique by choosing the smallest representable exponent allowing the value to be represented exactly. Further, the exponent is not represented directly, but a bias is added so that the smallest representable exponent is represented as 1, with 0 used for subnormal numbers. For numbers with an exponent in the normal range (the exponent field being not all ones or all zeros), the leading bit of the mantissa will always be 1. Consequently, a leading 1 can be implied rather than explicitly present in the memory encoding of the mantissa, and under the standard the explicitly represented part of the significand will lie between 0 and 1. Implying the leading 1 allows the binary format to have an extra bit of precision and may be referred to as leading bit convention, implicit bit convention, or hidden bit convention. Further, a mantissa with an implied leading bit may be referred to as a leading bit encoded mantissa herein.

An IEEE floating point product may be computed as follows: 1) determine the value of the implied bit for each operand, which indicates whether or not an operand is a subnormal number; 2) generate the product of mantissas with implied bits; 3) normalize the mantissa product followed by sticky bit computation and rounding; 4) extract the final mantissa; 5) conditionally add 1 to the final exponent based on the result after rounding; 6) determine the final sign by XOR of the signs of the two operands; and 7) output the final product: [sign] [exponent] [mantissa].

The previously mentioned floating point pipelines perform some of the above computations for determining the floating point product. Referring again to FIG. 36, the floating point pipeline for an M unit slice multiply component 3600 and an N unit slice multiply component 3602 are identical and include an IEEE mode floating point path and a flush-to-zero (FTZ) path. Each IEEE mode floating point path includes a leading zeros count component 3622, 3624, a shift amount computation component 3626, 3628, and a normalization component 3630, 3632, two implied bit determination components 3642, 3643, 3644, 3645, and two implied bit partial product computation components 3646, 3647, 3648, 3649. Each FTZ path includes an exponent calculation component 3634, 3636, and an exponent adjustment component 3638, 3640.

To handle the multiplication of subnormal numbers, the number of leading zeros in the mantissas of the operands is important as the mantissa product is shifted by an amount that is based on the number of leading zeros in the mantissas to generate a normal number. The leading zeros count components 3622, 3624 are configured to detect the number of leading zeroes in the mantissas of the respective operands. For SP floating point multiplies, the leading zeros count components 3622, 3624 can determine the number of leading zeros for both SP multiplies. For the dual issue DP floating point multiplies, the leading zeros count component 3624 determines the number of leading zeros. The leading zeros count components are also configured to perform exponent calculation, special value handling, and sign handling.

The shift amount computation components 3626, 3628 are configured to determine a right shift amount for each mantissa product based on the respective number of leading zeroes detected by the leading zeros count components 3622, 3624. The right shift amount for an SP floating point multiply, RSSP, is determined as per $$RSSP = (48 - LZC) - (25 - \{(EP - LZC) - Emin\}),$$
$$\text{when } EP - LZC < Emin$$
$$= 23 - LZC + \{(EP - LZC) - Emin)\},$$
$$\text{when } EP - LZC < Emin$$
$$= 23 - LZC, \text{ when } EP - LZC >= Emin$$

and the right shift amount for a DP floating point multiply, RSDP, is determines as per $$RSDP = (106 - LZC) - (54 - \{(EP - LZC) - Emin\}),$$
$$\text{when } EP - LZC < Emin$$
$$= 52 - LZC + \{(EP - LZC) - Emin)\},$$
$$\text{when } EP - LZC < Emin$$
$$= 52 - LZC, \text{ when } EP - LZC >= Emin$$

where LZC is the leading zero count, EP is the biased exponent of the product, and Emin is the minimum biased exponent of the product. The right shift amounts are provided to the respective normalization components 3630, 3632. For SP floating point multiplies, the shift amount computation components 3626, 3628 can determine the shift amount for both SP multiplies. For the dual issue DP floating point multiplies, the shift computation component 3628 determines the shift amount.

The normalization components 3630, 3632 are configured to perform normalization of the mantissa product output by the respective adders 3617, 3619 using the right shift amounts from the respective shift amount computation components 3626, 3628, sticky bit determination and rounding after normalization, exponent adjustment after rounding, special value handling, and sign handling. The resulting mantissa and exponent are provided to the respective final result multiplexer 3621, 3623. For SP floating point multiplies, the normalization components 3630, 3632 can perform the above operations for both SP multiplies. For the dual issue DP floating point multiplies, the normalization component 3632 determines performs the above operations.

The exponent calculation components 3634, 3636 and the exponent adjustment components 3638, 3640 are configured to calculate exponents for flush-to-zero (FTZ) mode. In FTZ mode, denormalized operands are replaced with zeroes. The exponent calculation components 3634, 3636 are configured to calculate exponents and perform sign handling and special value handling in FTZ mode and the exponent adjustment components 3638, 3640 are configured to perform exponent adjustment due to rounding and/or sign handling and/or special value handling. The exponent adjustment components 3638, 3640 provide final exponents and special value and sign information and adders 3617, 3619 provide corresponding mantissas to respective final result multiplexers 3621, 3623. The exponent adjustment components 3638, 3640 also share some information with normalization components 3630, 3632, e.g., special value and sign information.

The implied bit determination components 3642, 3643, 3644, 3645 and the implied bit partial product calculation components 3646, 3647, 3648, 3649 are configured to perform implied bit detection and computation of the mantissa partial products attributable to the implied bits in parallel with computation of the partial products of the remainder of the mantissa bits, i.e., the leading bit encoded mantissas, by the multipliers. As previously mentioned, prior to executing floating point multiplication operations, the value of the implied bit is determined. This may be done by determining if the exponent of an operand is zero. A zero value exponent indicates that the operand is subnormal and the implied bit is zero. A non-zero value exponent indicates that the operand is normal and the implied bit is one.

Each of the implied bit determination components 3642, 3643, 3644, 3645 is configured to perform this determination for respective operands and provide the results to the implied bit partial product calculation components 3646, 3647, 3648, 3649. In some examples, the implied bit determination components 3642, 3643, 3644, 3645 implement the implied bit determination as a bit-wise OR-reduction of the exponent bits implemented with four levels of 2-input OR gates.

Further, the computation of the partial product terms of the mantissas of the operands can be split into computation of the partial product terms of the mantissas without the respective implied bits, i.e., the leading bit encoded mantissas, and computation of the partial product terms attributable to the implied bits. For example, let the two SP floating point products in a slice be given by a[23:0]×b[23:0] and a[55:32]×b[55:32] where bits 23 and 55 are the implied bits in each operand. Note that a[23:0]×b[23:0] can be decomposed into computation of a[22:0]×b[22:0] and computation using the implied bits as illustrated in Table 30 and a[55:32]×b[55:32] can be similarly decomposed. Further, as illustrated in Table 31, a DP floating point product in a slice given by a[52:0]×b[52:0] where bit 52 is the implied bit in each operand can be decomposed into a computation of a[51:0]×b[51:0] computation using the implied bits. Note that in each table, the X represents the portion of the multiplication attributable to the implied bit and "^" indicates exponentiation.

TABLE 30

$$a[23:0] \times b[23:0] = (a[23].2\wedge 23 + a[22:0]) \times (b[23].2\wedge 23 + b[22:0])$$
$$= ((a[23]*b[23]*2\wedge 46 + a[22:0]*b[23]*2\wedge 23 + a[23]*b[22:0]*2\wedge 23)) + a[22:0]*b[22:0]$$
$$= X + a[22:0]*b[22:0]$$

TABLE 31

$$a[52:0] \times b[52:0] = (a[52].2\wedge 52 + a[51:0]) \times (b[52].2\wedge 52 + b[51:0])$$
$$= ((a[52]*b[52]*2\wedge 104 + a[51:0]*b[52]*2\wedge 52 + a[52]*b[51:0]*2\wedge 52)) + a[51:0]*b[51:0]$$
$$= X + a[51:0]*b[51:0]$$

The implied bit partial product computation components 3646, 3647, 3648, 3649 components are configured to compute "X" using the implied bit values from the respective implied bit determination components 3642, 3643, 3644, 3645. More specifically, the implied bit partial product computation components 3646, 3647, 3648, 3649 compute the partial product terms for the implied bit products with the mantissas as illustrated in Table 30 and Table 31. The resulting partial product terms are provided as inputs to the compressor in the respective multiply cluster 3604, 3606, 3608, 3610 via one of the multiplexers. In some examples, the computation of X is implemented using two rows of 2-input 'AND' gates that output the partial product terms.

For an SP floating point multiply, each adder 3617, 3619 produces a respective final mantissa product and the exponents and signs of the final results are produced in parallel by respective normalization components 3630, 3632. Corresponding exponents, signs, and mantissas are joined by the respective final result multiplexer 3621, 3623 to generate the final floating point product as [sign] [exponent] [mantissa] where the sign is one bit, the exponent is eight bits, and the mantissa is twenty-three bits. For a DP floating point multiply, the adder 3619 produces the final mantissa product and the exponent and sign of the final result is produced by the normalization component 3632. The exponent, sign, and mantissa are joined by the final result multiplexer 3623 to generate the final floating point product as [sign] [exponent] [mantissa] where the sign is one bit, the exponent is eleven bits, and the mantissa is fifty-two bits. The final exponent may be incremented if there is a carryout from rounding the mantissa product.

In some examples, a multiplication unit in each data path 115, 116 includes arithmetic logic for each slice supported by the data path in addition to the multiplication logic. The arithmetic logic performs arithmetic instructions such as addition, subtraction, minimum, maximum, and Boolean logic operations. FIG. 39 illustrates an example configuration for a single 64-bit wide slice such as that shown in FIG. 36. The M unit slice multiply component 3600 includes arithmetic logic 3902 and multiply logic 3904. Operands are routed to the arithmetic logic 3902 or the multiply logic 3904 based on the decoded instruction. The multiply logic 3904 includes all the multiplication components of the M unit slice multiply component 3600 and the multiply logic 3906 includes all the multiplication components of the N unit slice multiply component 3602. Arithmetic instructions can be executed by arithmetic logic 3902 in parallel with execution of single issue multiply instructions by multiply logic 3906. In other examples, the arithmetic logic may be included in the N unit slice multiply logic rather than the M unit slice multiply logic.

Figure 40:
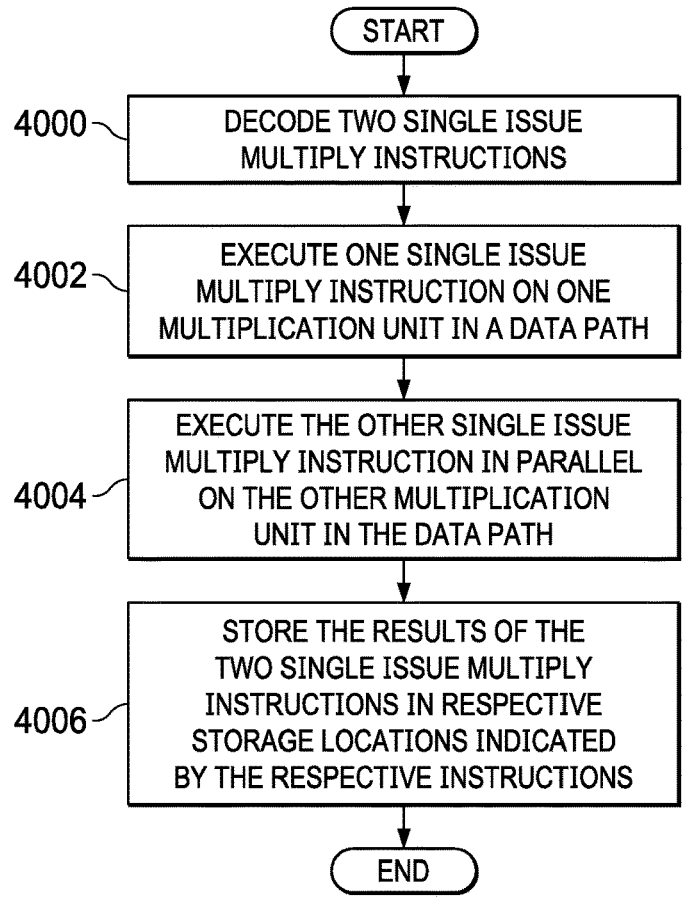
FIG. 40 is a flow diagram of a method for performing multiply instructions.

FIG. 40 is a flow diagram of a method for performing multiply instructions that can be performed by a processor, e.g., processing unit core 110. In this method, two single issue multiply instructions are decoded 4000 by the processor. One of the single issue multiply instructions is executed 4002 on one multiplication unit of a data path of the processor, e.g., the scalar data path 115 or vector data path 116 of the processing core 110, and the other single issue multiply instruction is executed 4004 in parallel on the other multiplication unit in the data path. While FIG. 40 illustrates the execution of the two single issue instructions in sequential boxes, the execution of these instructions is performed in parallel. The results of the two single issue multiply instructions are then stored 4006 in respective locations indicated by the respective instructions.

Figure 41:
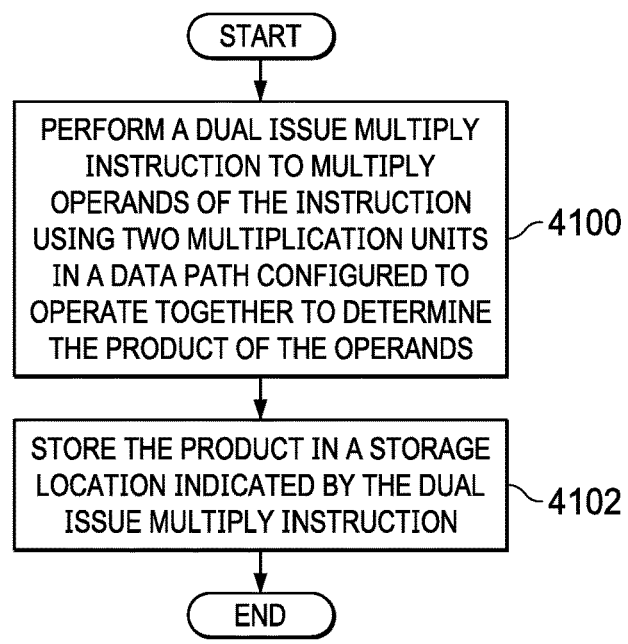
FIG. 41 is a flow diagram of a method for performing a dual issue multiply instruction.

FIG. 41 is a flow diagram of a method for performing a dual issue multiply instruction that can be performed by a processor, e.g., processing unit core 110 (FIG. 1). In this method, a dual issue multiply instruction is performed 4100 by the processor to multiply operands of the instructions using two multiplication units in a data path of the processor, e.g., the scalar data path 115 or vector data path 116 of the processing core 110, configured to operate together to determine the product of the operands. The product is then stored 4102 in a location specified by the dual issue multiply instruction. Dual issue multiply instructions are previously described herein.

Figure 42:
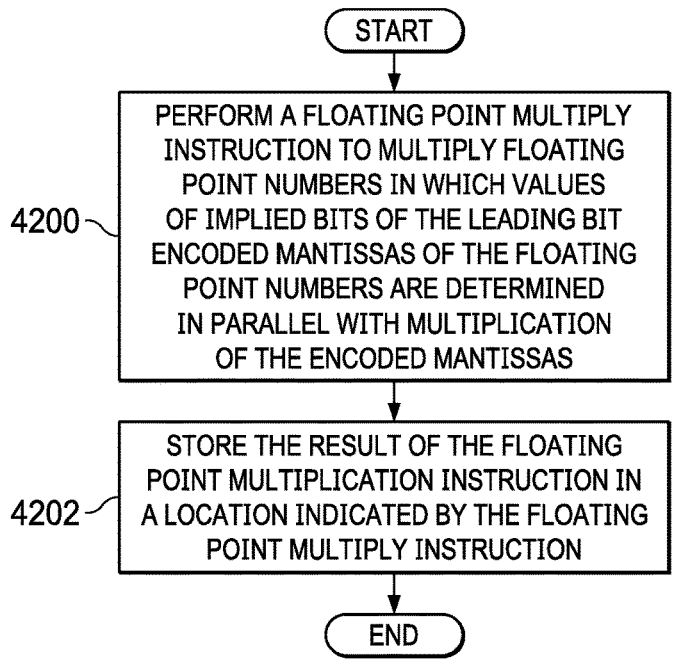
FIGS. 42 and 43 are flow diagrams of methods for performing a floating point multiply instruction.

FIG. 42 is a flow diagram of a method for performing a floating point multiply instruction that can be performed by a processor, e.g., processing unit core 110 (FIG. 1). In this method, a floating point multiply instruction is performed 4200 by the processor to multiply floating point numbers in which values of implied bits of the leading bit encoded mantissas of the floating point numbers are determined in parallel with multiplication of the encoded mantissas. The result of the floating point multiplication instruction is then stored 4202 in a location indicated by the instruction. Floating point multiply instructions are previously described herein.

Figure 43:
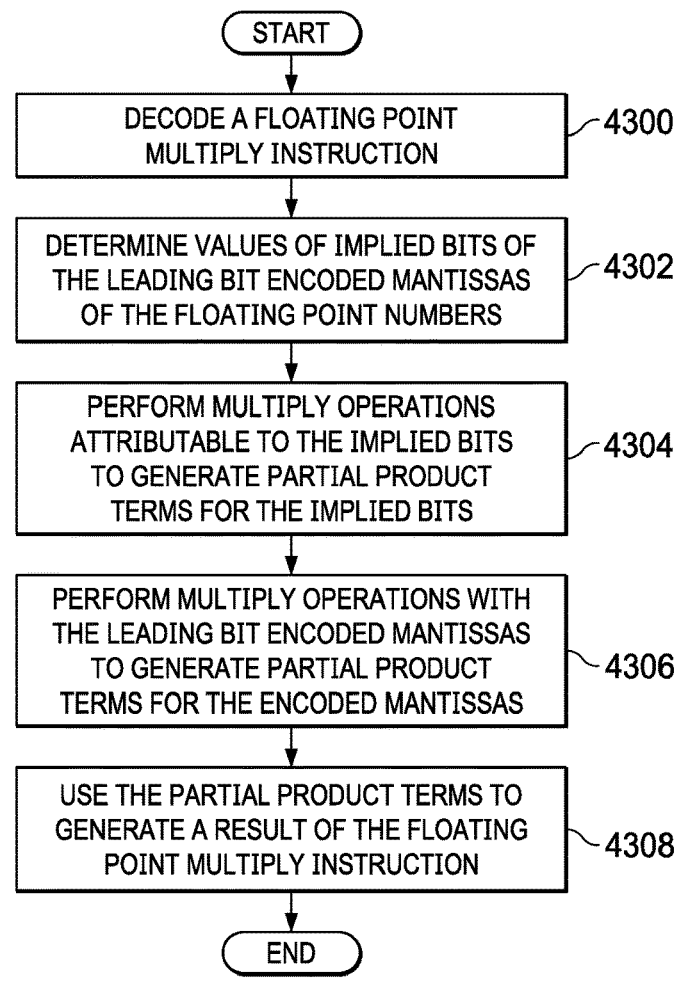

FIG. 43 is a flow diagram of a method for performing a floating point multiply instruction that can be performed by a processor, e.g., processing unit core 110 (FIG. 1). In this method, a floating point multiply instruction is decoded 4300 by an instruction decoder, e.g., instruction decoder 113 of processing unit core 110. The floating point multiply instruction is then executed by a multiplication unit of the processor, e.g., multiplication units 223, 224, 243, 244 of processing unit core 110. As part of the execution of the instruction, the values of implied bits of the leading bit encoded mantissas of the floating point numbers are determined 4302, multiply operations attributable to the implied bits are performed 4304 to generate partial product terms for the implied bits, and multiply operations are performed 4306 with the leading bit encoded mantissas to generate partial product terms for the encoded mantissas.

The determination of the implied bit values and the multiply operations using these implied bit values are performed in parallel with performing the multiply operations with the encoded mantissas. While FIG. 43 illustrates the determination of the implied bit values, performance of the multiply operations using the implied bit values, and performance of the multiply operations with the encoded mantissas in sequential boxes, the implied bit processing is performed in parallel the multiply operations with the encoded mantissas. The multiplication unit then uses 4308 the partial product terms for the implied bits and the partial product terms for the encoded mantissas to generate a result of the floating point multiply instruction.

Referring again to FIG. 1 and FIG. 2, in some examples of processing unit core 110, vector instructions supporting the execution of 8-tap and 4-tap finite impulse response (FIR) filters are provided. Such low order FIR filters are often used in certain application, such as for video analytics. For a FIR filter of order N, each value of the output sequence is a weighted sum of the most recent input values as formally given by:

$$y[n] = b_0 x[n] + b_1 x[n-1] + \ldots + b_N x[n-N] = \sum_{i=0}^{N} b_i * x[n-i]$$

where x[n] is the input signal, y[n] is the output signal, N is the filter order, and $b_i$ is the ith coefficient of the filter. For purposes of describing the operations performed by the FIR instructions herein, the follow notation is used:
- a[n] or an: data elements in the input stream
- c[n] or cn: filter coefficients (also referred to as "taps")
- r[n] or rn: elements in the output stream.

The order of the filter coefficient array c[n] (b[i] in the above formal definition) is also redefined to remove the subtraction in the summation, i.e., the formula used is $$r[n]=\Sigma_{i=0}^{N-1} c[i]*a[n+i].$$

The FIR instructions, referred to generically herein as VFIRxxx, vary according to the number of filter taps, the size of the input and output data elements, and the signs for the operands. More specifically, in some examples, the available instructions are VFIR4HW, VFIR8HW, and VFIR8HD for which both the coefficients and the input data elements are signed, VFIR4SUHW, VFIR8SUHW, and VFIR8SUHD for which the coefficients are signed and the input data elements are unsigned, and VFIR4UHW, VFIR8UHW, and VFIR8UHD for which both the coefficients and the input data elements are unsigned. In these instructions, the letters HW indicate half-word inputs (16-bits) and word outputs (32-bits) and the letters HD indicate half-word inputs, and double-word outputs (64-bits).

The VFIRxxx instructions are dual issue instructions performed on the M2 multiplication unit 243 and the N2 multiplication unit 244, e.g., filter computation logic, of processing unit core 110. The instructions are based on the concept of an instruction taking multiple registers, i.e., register pairs, for each source and destination. The notation for a register pair is Register1:Register2, for example VB1:VB0, and the order of the registers in the pair is high register:low register, e.g., VB0:VB1 is not allowed. Each instruction has the src1 operand, which may be referred to as a coefficient operand, as a vector register pair storing the filter coefficients, the src2 operand, which may be referred to as a data operand, as the streaming engine 125, which provides the input data elements, and the dst operand as a vector register or vector register pair, e.g., VFIRxxx.N2 VB1:VB0, SE0, VB11:VB10. As is illustrated in more detail below, the four or eight filter coefficients of a VFIR4xx or VFIR8xx operation are duplicated in the src1 operand such that a copy of the coefficients is available in each SIMD lane of the multiplication units 243, 244 used to perform the specified instruction.

As previously described herein, each multiplication unit 243, 244 includes eight slice multiply components, one for each 64-bit slice (64-bit SIMD lane). Further, each slice multiply component includes two multiply clusters of four 16-bit by 16-bit multipliers. As is explained in more detail herein, to execute a VFIRxxx instruction on the multiplication units 243, 244, the coefficients cn and data elements as specified by the instruction operands are mapped to 64-bit SIMD lanes corresponding to the slice multiply components. The ordering of the coefficients and data elements in each 64-bit SIMD lane indicates how the coefficients and data elements are mapped to individual multipliers in the corresponding slice multiply components. The mapping varies based on the particular instruction.

In the detailed descriptions of the VFIRxxx instructions below, Tables 32-34 are provided to illustrate this coefficient and data element mapping for specific instructions. In these tables, the first three rows show the inputs per 64-bit slice for the N2 multiplication unit 244 and the M2 multiplication unit 243 and other rows show the outputs per slice. There are two entries in each cell of the input rows. The top entry indicates the values mapped to one multiply cluster of the corresponding slice multiply component and the bottom entry indicates the values mapped to the other multiply cluster.

FIG. 44 illustrates an example of the operation of the VFIR8HD, VFIR8SUHD, and VFIR8UHD instructions. These instructions take 16-bit inputs (eight coefficients and twenty-three data elements) and produce sixteen 64-bit outputs. In this example, the eight 16-bit coefficients c0-c7 are duplicated in the src1 operand register pair VBM1:VBM0 of the M2/N2/C local register file 233 (FIG. 9). The high register VBM1 stores c7-c4 in each 64-bit SIMD lane and the low register VBM0 stores c3-c0 in each 64-bit SIMD lane. The twenty-three data elements a0-a22 are provided by stream 0 (SE0) of the streaming engine 125 (FIG. 28). The sixteen 64-bit outputs r0-r15 are stored as indicated by the dst operand register pair in the 64-bit SIMD lanes of global registers VB1 and VB0 of the global register file 231 (FIG. 7).

For these instructions, eight rn values are computed on respective slice multiply components of the N2 multiplication unit 244 and the other eight rn values are computed on respective slice multiply components of the M2 multiplication unit 243. Table 32 illustrates which value of rn is computed on each slice multiply component. For example, r0 is computed on the slice multiply component for slice 0 in the N2 multiplication unit 244 and r8 is computed on the slice multiply component for slice 0 in the M2 multiplication unit 243.

To compute each rn in the multiplication units 243, 244, the data elements a0-a22 that are provided in sequential order from SE0 are routed to the appropriate slice multiply component. Table 32 illustrates which data elements are routed to each slice multiply component. For example, r0=a7*c7+a6*c6+a5*c5+a4*c4+a3*c3+a2*c2+a1*c1+a0*c0 and r1=a8*c7+a7*c6+a6*c5+a5*c4+a4*c3+a3*c2+a2*c1+a1*c0. Accordingly, a0-a7 are routed to the slice multiply component of the N2 multiplication unit 244 for slice 0 and a1-a8 are routed to the slice multiply component of the N2 multiplication unit 244 for slice 1. An approach for accomplishing this routing is described herein in reference to FIG. 58 and FIG. 59.

Table 32 also illustrates which data elements and which coefficients are multiplied in each multiply cluster in each slice multiply component. For example, c0-c3 and a0-a3 are multiplied in one multiply cluster of the slice multiply component of the N2 multiplication unit 244 for slice 0 and c4-c7 and a4-a7 are multiplied in the other multiply cluster. Further, c0-c3 and a8-a11 are multiplied in one multiply cluster of the slice multiply component of the M2 multiplication unit 243 for slice 0 and c4-c7 and a12-a15 are multiplied in the other multiply cluster.

TABLE 32

|  | Slice 0 | Slice 1 | Slice 2 | Slice 3 | Slice 4 | Slice 5 | Slice 6 | Slice 7 |
| --- | --- | --- | --- | --- | --- | --- | --- | --- |
| M2, N2 input | c0-c3 | c0-c3 | c0-c3 | c0-c3 | c0-c3 | c0-c3 | c0-c3 | c0-c3 |
|  | c4-c7 | c4-c7 | c4-c7 | c4-c7 | c4-c7 | c4-c7 | c4-c7 | c4-c7 |
| N2 input | a0-a3 | a1-a4 | a2-a5 | a3-a6 | a4-a7 | a5-a8 | a6-a9 | a7-a10 |
|  | a4-a7 | a5-a8 | a6-a9 | a7-a10 | a8-a11 | a9-a12 | a10-a13 | a11-a14 |

TABLE 32-continued

|  | Slice 0 | Slice 1 | Slice 2 | Slice 3 | Slice 4 | Slice 5 | Slice 6 | Slice 7 |
| --- | --- | --- | --- | --- | --- | --- | --- | --- |
| M2 input | a8-a11 a12-a15 | a9-a12 a13-a16 | a10-a13 a14-a17 | a11-a14 a15-a18 | a12-a15 a16-a19 | a13-a16 a17-a20 | a14-a17 a18-a21 | a15-a18 a19-a22 |
| N2 output | r0 | r1 | r2 | r3 | r4 | r5 | r6 | r7 |
| M2 output | r8 | r9 | r10 | r11 | r12 | r13 | r14 | r15 |

Figure 45:
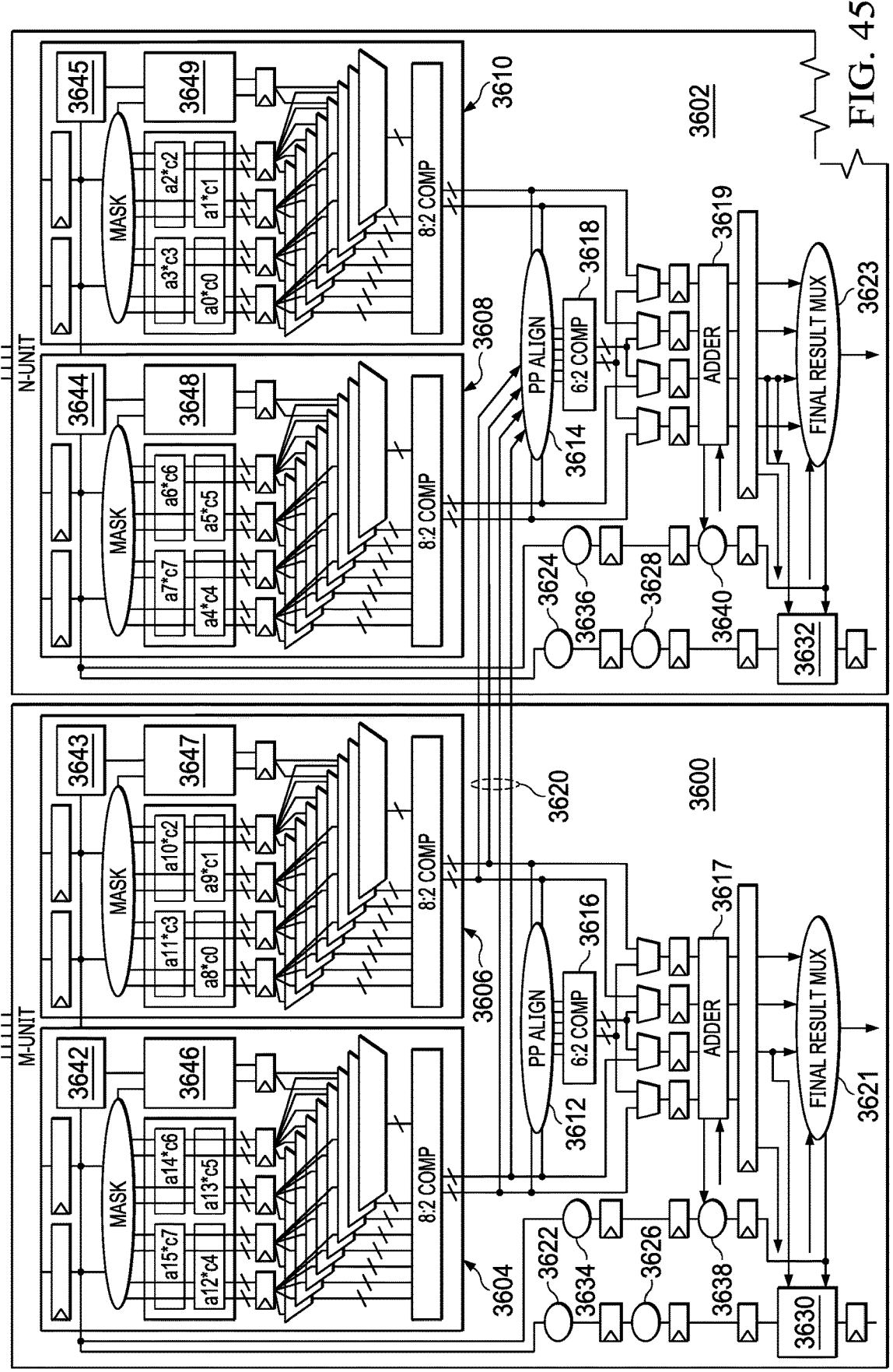
FIG. 45 illustrates an example of multiplier use for the VFIR8×HD instructions.

FIG. 45 illustrates an example of which multipliers are used for each coefficient/data element multiplication in computing r0 and r8 in the slice multiply components of the M2 multiplication unit 243 and the N2 multiplication unit 244 for slice 0. For purposes of this example, the M unit slice multiply component 3600 and the N unit slice multiply component 3602 of FIG. 36 are assumed to be the slice multiply components for slice 0. As indicated in FIG. 45, to compute r0, the four multipliers in the multiply cluster 3610 are used in the determination of a0*c0, a1*c1, a2*c2, and a3*c3, and the four multipliers in the multiply cluster 3608 are used in the determination a4*c4, a5*c5, a6*c6, and a7*c7. Similarly, to compute r8, the four multipliers in the multiply cluster 3606 are used in the determination of a8*c0, a9*c1, a10*c2, and a11*c3, and the four multipliers in the multiply cluster 3604 are used in the determination of a12*c4, a13*c5, a14*c6, and a15*c7.

FIG. 46 illustrates an example of the operation of the VFIR8HW, VFIR8SUHW, and VFIR8UHW instructions. These instructions take 16-bit inputs (eight coefficients and twenty-three data elements) and produce sixteen 32-bit outputs. In this example, the eight 16-bit coefficients c0-c7 are duplicated in the src1 operand register pair VBM1: VBM0 of the M2/N2/C local register file 233 (FIG. 9). The high register VBM1 stores c7-c4 in each 64-bit SIMD lane and the low register VBM0 stores c3-c0 in each 64-bit SIMD lane. The twenty-three data elements a0-a22 are provided by stream 0 (SE0) of the streaming engine 125 (FIG. 28). The order from SE0 are routed to the appropriate slice multiply component. Table 33 illustrates which data elements are routed to each slice multiply component. For example, r0=a7*c7+a6*c6+a5*c5+a4*c4+a3*c3+a2*c2+a1*c1+a0*c0 and r1=a8*c7+a7*c6+a6*c5+a5*c4+a4*c3+a3*c2+a2*c1+a1*c0. Accordingly, a0-a7 are routed to the slice multiply component of the N2 multiplication unit 244 for slice 0 and a1-a8 are routed to the slice multiply component of the M2 multiplication unit 243 for slice 0. In another example, r4=a11*c7=a10*c6+a9*c5+a8*c4+a7*c3+a6*c2+a5*c1+a4*c0 and r5=a12*c7=a11*c6+a10*c5+a9*c4+a8*c3+a7*c2+a6*c1+a5*c0. Accordingly, a4-a11 are routed to the slice multiply component of the N2 multiplication unit 244 for slice 2 and a8-a11 are routed to the slice multiply component of the M2 multiplication unit 243 for slice 2. An approach for accomplishing this routing is described herein with reference to FIG. 58 and FIG. 59.

Table 33 also illustrates which data elements and which coefficients are multiplied in each multiply cluster in each slice multiply component. For example, c0-c3 and a0-a3 are multiplied in one multiply cluster of the slice multiply component of the N2 multiplication unit 244 for slice 0 and c4-c7 and a4-a7 are multiplied in the other multiply cluster. Further, c0-c3 and a1-a4 are multiplied in one multiply cluster of the slice multiply component of the M2 multiplication unit 243 for slice 0 and c4-c7 and a5-a8 are multiplied in the other multiply cluster.

TABLE 33

|  | Slice 0 | Slice 1 | Slice 2 | Slice 3 | Slice 4 | Slice 5 | Slice 6 | Slice 7 |
| --- | --- | --- | --- | --- | --- | --- | --- | --- |
| M2, N2 | c0-c3 c4-c7 | c0-c3 c4-c7 | c0-c3 c4-c7 | c0-c3 c4-c7 | c0-c3 c4-c7 | c0-c3 c4-c7 | c0-c3 c4-c7 | c0-c3 c4-c7 |
| N2 input | a0-a3 a4-a7 | a2-a5 a6-a9 | a4-a7 a8-a11 | a6-a9 a10-a13 | a8-a11 a12-a15 | a10-a13 a14-a17 | a12-a15 a16-a19 | a14-a17 a18-a21 |
| M2 input | a1-a4 a5-a8 | a3-a6 a7-a10 | a5-a8 a9-a12 | a7-a10 a11-a14 | a9-a12 a13-a16 | a11-a14 a15-a18 | a13-a16 a17-a20 | a15-a18 a19-a22 |
| N2 output | r0, r1 | r2, r3 | r4, r5 | r6, r7 | r8, r9 | r10, r11 | r12, r13 | r14, r15 |
| M2 output | — | — | — | — | — | — | — | — | sixteen 32-bit outputs r0-r15 are stored as pairs in the 64-bit SIMD lanes of global register VB0 of the global register file 231 (FIG. 7).

For these instructions, eight rn values are computed on respective slice multiply components of the N2 multiplication unit 244 and the other eight rn values are computed on respective slice multiply components of the M2 multiplication unit 243. The output of the pairs of rn values in the SIMD lanes of VB0 is performed in the N2 multiplication unit 244. Table 33 illustrates which value of rn is computed on each slice multiply component. For example, r0 is computed on the slice multiply component for slice 0 in the N2 multiplication unit 244 and r1 is computed on the slice multiply component for slice 0 in the M2 multiplication unit 243.

To compute each rn in the multiplication units 243, 244, the data elements a0-a22 that are provided in sequential FIG. 47 illustrates an example of which multipliers are used for each coefficient/data element multiplication in computing r0 and r1 in the slice multiply components of the M2 multiplication unit 243 and the N2 multiplication unit 244 for slice 0. For purposes of this example, the M unit slice multiply component 3600 and the N unit slice multiply component 3602 of FIG. 36 are assumed to be the slice multiply components for slice 0. As indicated in FIG. 47, to compute r0, the four multipliers in the multiply cluster 3610 are used in the determination of a0*c0, a1*c1, a2*c2, and a3*c3, and the four multipliers in the multiply cluster 3608 are used in the determination a4*c4, a5*c5, a6*c6, and a7*c7. Similarly, to compute r1, the four multipliers in the multiply cluster 3606 are used in the determination of a1*c0, a2*c1, a3*c2, and a4*c3, and the four multipliers in the multiply cluster 3604 are used in the determination of a5*c4, a6*c5, a7*c6, and a8*c7. For these instructions, the outputs of the adder 3617 in the M unit slice multiply component 3600 are routed to the final result mux 3623 in the N unit slice multiply component 3602 to be merged with the outputs of the adder 3619 to generate the r0, r1 pair output to VB0.

FIG. 48 illustrates an example of the operation of the VFIR4HW, VFIR4SUHW, and VFIR4UHW instructions. These instructions take 16-bit inputs (four coefficients and thirty-five data elements) and produce thirty-two 32-bit outputs. In this example, the four 16-bit coefficients c0-c3 are duplicated in each 64-bit SIMD lane of the src1 operand register VBM0 of the M2/N2/C local register file 233 (FIG. 9). The thirty five data elements a0-a34 are provided by the streaming engine 125 (FIG. 28) with a0-a31 coming from stream 0 (SE0) and a32-a34 coming from stream 1 (SE1). The thirty-two 32-bit outputs are stored as pairs in the 64-bit SIMD lanes of the global register pair VB1:VB0 of the global register file 231 (FIG. 7).

For these instructions, sixteen rn values are computed on respective slice multiply components of the N2 multiplication unit 244 and the other sixteen rn values are computed on respective slice multiply components of the M2 multiplication unit 243. Table 34 illustrates which values of rn are computed on each slice multiply component. For example, r0 and r1 are computed on the slice multiply component for slice 0 in the N2 multiplication unit 244 and r16 and r17 are computed on the slice multiply component for slice 0 in the M2 multiplication unit 243.

To compute each rn in the multiplication units 243, 244, the data elements a0-a34 that are provided in sequential order from SE0 and SE1 are routed to the appropriate slice multiply component. Table 34 illustrates which data elements are routed to each slice multiply component. For example, r0=a3*c3+a2*c2+a1*c1+a0*c0 and r1=a4*c3+a3*c2+a2*c1+a1*c0. Accordingly, a0-a3 and a1-a4 are routed to the slice multiply component of the N2 multiplication unit 244 for slice 0. Further, r16=a19*c3+a18*c2+a17*c1+a16*c0 and r17=a12*c3+a19*c2+a18*c1+a17*c0. Accordingly, a16-a19 and a17-a20 are routed to the slice multiply component of the M2 multiplication unit 243 for slice 0. An approach for accomplishing this routing is described herein in reference to FIG. 58 and FIG. 59.

Table 34 also illustrates which data elements and which coefficients are multiplied in each multiply cluster in each slice multiply component. For example, c0-c3 and a0-a3 are multiplied in one multiply cluster of the slice multiply component of the N2 multiplication unit 244 for slice 0 and c0-c3 and a1-a4 are multiplied in the other multiply cluster. Further, c0-c3 and a16-a19 are multiplied in one multiply cluster of the slice multiply component of the M2 multiplication unit 243 for slice 0 and c0-c3 and a17-a20 are multiplied in the other multiply cluster.

Figure 49:
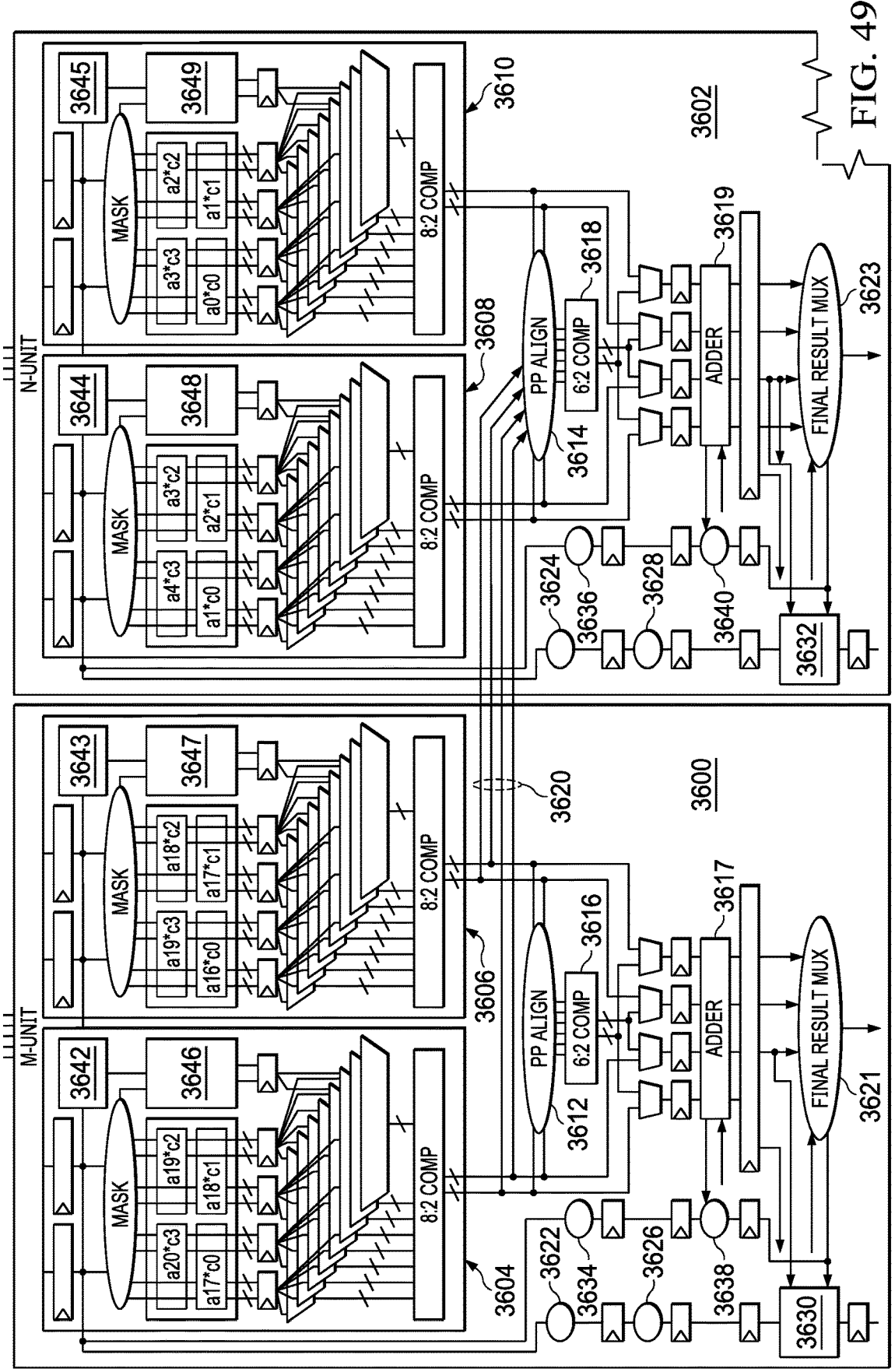
FIG. 49 illustrates an example of multiplier use for the VFIR4×HW instructions.

FIG. 49 illustrates an example of which multipliers are used for each coefficient/data element multiplication in computing r0, r1, r16, and r17 in the slice multiply components of the M2 multiplication unit 243 and the N2 multiplication unit 244 for slice 0. For purposes of this example, the M unit slice multiply component 3600 and the N unit slice multiply component 3602 of FIG. 36 are assumed to be the slice multiply components for slice 0. As indicated in FIG. 49, to compute r0, the four multipliers in the multiply cluster 3610 are used in the determination of a0*c0, a1*c1, a2*c2, and a3*c3, and to compute r1, the four multipliers in the multiply cluster 3608 are used in the determination a1*c0, a2*c1, a3*c2, and a4*c3. Similarly, to compute r16, the four multipliers in the multiply cluster 3606 are used in the determination of a16*c0, a17*c1, a18*c2, and a19*c3, and to compute r17, the four multipliers in the multiply cluster 3604 are used in the determination of a17*c0, a18*c1, a19*c2, and a20*c3.

Figure 50:
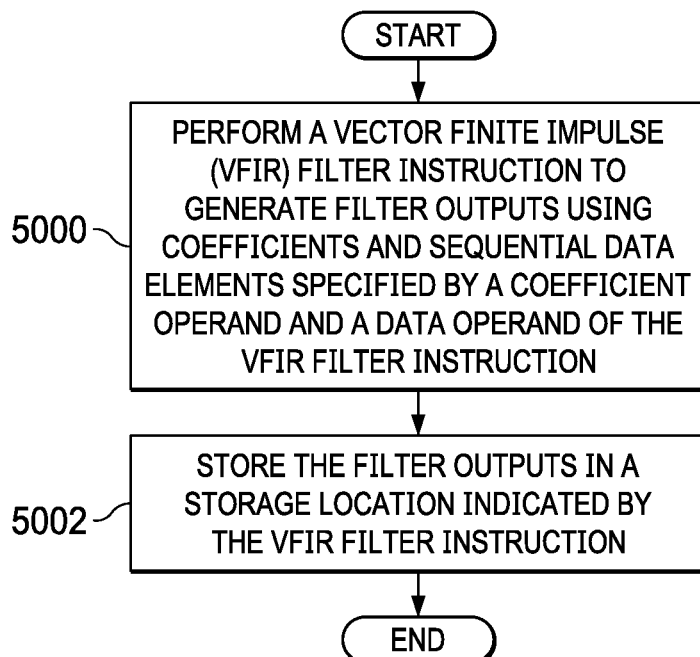
FIG. 50 is a flow diagram of a method for performing a vector finite impulse response (VFIR) filer instruction.

FIG. 50 is a flow diagram of a method for performing a vector finite impulse response (VFIR) filter instruction that can be performed by a processor, e.g., processing unit core 110 (FIG. 1). In this method, a vector finite impulse (VFIR) filter instruction is performed 5000 by the processor to generate filter outputs using coefficients and sequential data elements specified by a coefficient operand and a data operand of the VFIR filter instruction. The filter outputs are then stored 5002 in a storage location indicated by the VFIR filter instruction. VFIR filter instructions are previously described herein.

Referring again to FIG. 1 and FIG. 2, in some examples of processing unit core 110, instructions for vector based multiplication of an 8×4 matrix and a 4×8 matrix to generate a 4×4 output matrix are provided. If A is an m×n matrix and B is an n×p matrix, $$A = \begin{pmatrix} a_{11} & a_{12} & \cdots & a_{1n} \\ a_{21} & a_{22} & \cdots & a_{2n} \\ \vdots & \vdots & \ddots & \vdots \\ a_{m1} & a_{m2} & \cdots & a_{mn} \end{pmatrix}, B = \begin{pmatrix} b_{11} & b_{12} & \cdots & b_{1p} \\ b_{21} & b_{22} & \cdots & b_{2p} \\ \vdots & \vdots & \ddots & \vdots \\ b_{n1} & b_{n2} & \cdots & b_{np} \end{pmatrix}$$

the matrix product R=AB is the m×p matrix $$R = \begin{pmatrix} r_{11} & r_{12} & \cdots & r_{1p} \\ r_{21} & r_{22} & \cdots & r_{2p} \\ \vdots & \vdots & \ddots & \vdots \\ r_{m1} & r_{m2} & \cdots & r_{mp} \end{pmatrix}$$

TABLE 34

|  | Slice 0 | Slice 1 | Slice 2 | Slice 3 | Slice 4 | Slice 5 | Slice 6 | Slice 7 |
| --- | --- | --- | --- | --- | --- | --- | --- | --- |
| M2, N2 input | c0-c3 | c0-c3 | c0-c3 | c0-c3 | c0-c3 | c0-c3 | c0-c3 | c0-c3 |
|  | c0-c3 | c0-c3 | c0-c3 | c0-c3 | c0-c3 | c0-c3 | c0-c3 | c0-c3 |
| N2 input | a0-a3 | a2-a5 | a4-a7 | a6-a9 | a8-a11 | a10-a13 | a12-a15 | a14-a17 |
|  | a1-a4 | a3-a6 | a5-a8 | a7-a10 | a9-a12 | a11-a14 | a13-a16 | a15-a18 |
| M2 input | a16-a19 | a18-a21 | a20-a23 | a22-a25 | a24-a27 | a26-a29 | a28-a31 | a30-a33 |
|  | a17-a20 | a19-a22 | a21-a24 | a23-a26 | a25-a28 | a27-a30 | a29-a32 | a31-a34 |
| N2 output | r0, r1 | r2, r3 | r4, r5 | r6, r7 | r8, r9 | r10, r11 | r12, r13 | r14, r15 |
| M2 output | r16, r17 | r18, r19 | r20, r21 | r22, r23 | r24, r25 | r26, r27 | r28, r29 | r30, r31 |

-continued where $$r_{ij} = a_{i1}b_{1j} + a_{i2}b_{2j} + \ldots + a_{in}b_{nj} = \sum_{k=1}^{n} a_{ik}b_{kj}$$

for i=1, ..., m and j=1, ..., p. That is, an entry $r_{ij}$ of the matrix product R is determined by multiplying term-by-term the elements of the ith row of A and the jth column of B and adding the n products. For purpose of describing the operations performed by the VMATMPYxxx instructions herein, the follow notation is used:

$a_{ik}$ or aik: elements of the 8×4 A matrix, where i=0, ..., 7, k=0, ..., 3

$b_{kj}$ or bkj: elements of the 4×8 B matrix, where k=0, ..., 3, j=0, ..., 7

$r_{ij}$ or rij: elements of the 4×4 matrix R, where i=0, ..., 3, j=0, ..., 3.

The matrix multiply instructions, referred to generically herein as VMATMPYxxx, vary according to the size of the output data elements and the signs of the operands. More specifically, the available instructions are VMATMPYHW and VMATMPYHD, for which the array elements for both the 8×4 array and 4×8 array are signed, VMATMPYSUHW and VMATMPYSUHD, for which the array elements in the 8×4 array are signed and the array elements in the 4×8 array are unsigned, VMATMPYUSHW and VMATMPYUSHD, for which the array elements in the 8×4 array are unsigned and the array elements in the 4×8 array are signed, and VMATMPYUHW and VMATMPYUHD, for which the array elements for both the 8×4 array and 4×8 array are unsigned. In these instructions, the letters HW indicate half-word inputs (16-bits) and word outputs (32-bits) and the letters HD indicate half-word inputs, and double-word outputs (64-bits).

The VMATMPYxxx instructions can be used to multiply large matrices in 8×4 by 4×8 blocks. Such matrix multiplication support is important for multiple applications such as high performance computing (BLAS and BLIS type operations for fixed point), fully connected layers in convolution neural networks (deep learning), and space applications where precision of accumulation of results is important. The sizes of the matrices in such applications are very large and require accumulating the multiplication results as 32-bit or 64-bit without losing precision. The results may be rounded and shifted after the matrix multiplication.

The VMATMPYxxx instructions are dual issue instructions performed on the M2 multiplication unit 243 and the N2 multiplication unit 244, e.g., vector matrix multiplication logic, of processing unit core 110. For each instruction, the src1 operand is an 8×4 matrix, i.e., the A matrix, provided by one stream of the streaming engine 125 (FIG. 28), the src2 operand is a 4×8 matrix, i.e., the B matrix, provided by the other stream of the streaming engine 125, and the dst operand is a vector register for the instructions producing 32-bit results and a vector register pair for the instructions producing 64-bit results, e.g., VMATMPYHW. N2 SE0, SE1, VB0.

As previously described herein, each multiplication unit 243, 244 includes eight slice multiply components, one for each 64-bit slice (64-bit SIMD lane). Further, each slice multiply component includes two multiply clusters of four 16-bit by 16-bit multipliers. As is explained in more detail herein, to execute a VMATMPYxxx instruction on the multiplication units 243, 244, the elements of the 8×4 A matrix and the 4×8 B matrix are mapped to 64-bit SIMD lanes corresponding to the slice multiply components. The ordering of the elements in each 64-bit SIMD lane indicates how the elements are mapped to individual multipliers in the corresponding slice multiply components.

Figure 52:
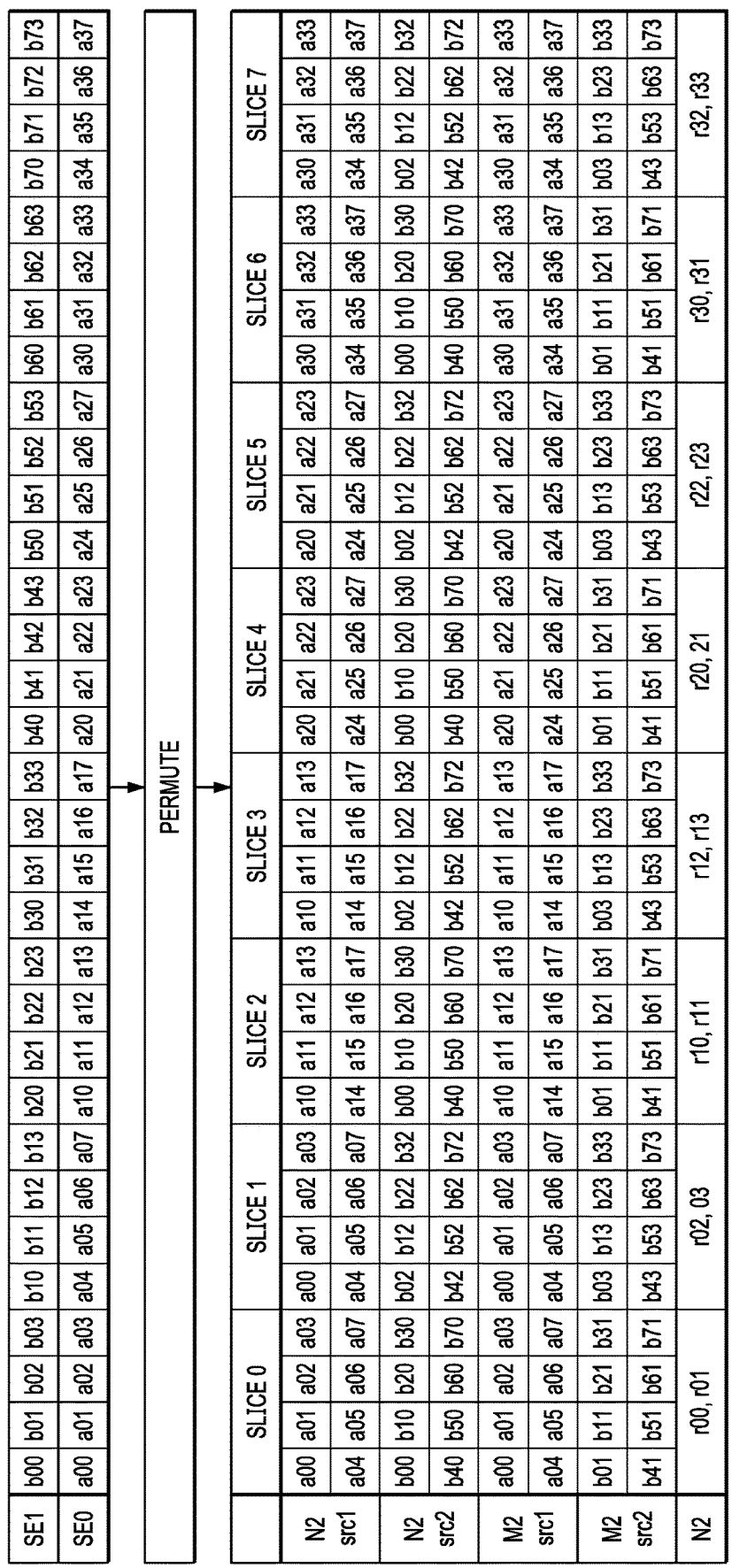
FIG. 52 illustrates mapping of matrix elements to slices for VMATMPY×HW instructions.
Figure 55:
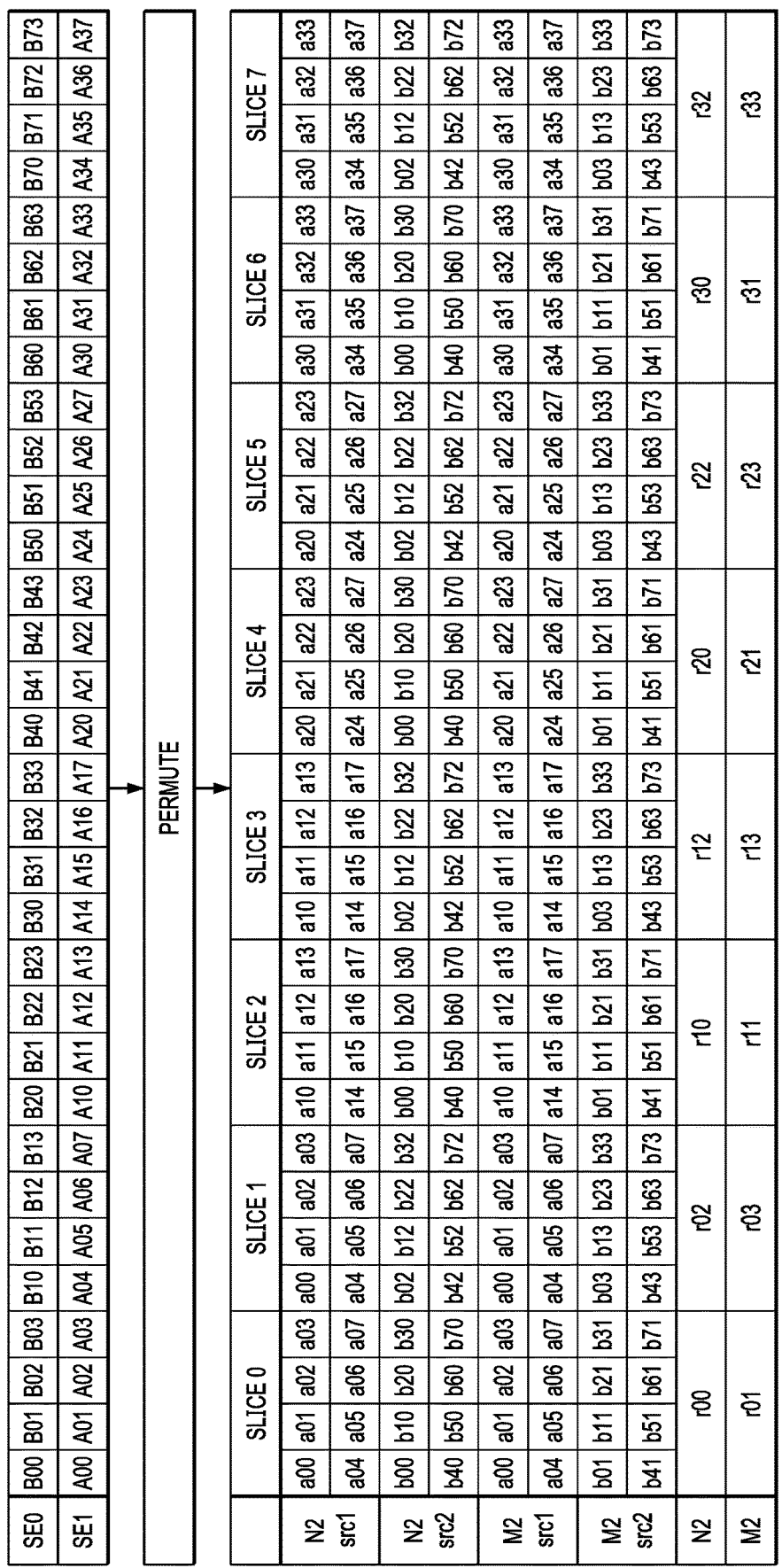
FIG. 55 illustrates mapping of matrix elements to slices for VMATMPY×HD instructions.

In the detailed descriptions of the VMATMPYxxx instructions below, tables in FIG. 52 and FIG. 55 illustrate the element mapping. In these tables, the N2 src1 and M2 src1 rows show the mapping of the elements of the A matrix per 64-bit slice for the N2 multiplication unit 244 and the M2 multiplication unit 243. The N2 src2 and M2 src2 rows show the mapping of the elements of the B matrix per 64-bit slice for the N2 multiplication unit 244 and the M2 multiplication unit 243. The bottom row or rows show the outputs per slice. Each of the input rows includes eight entries per slice. The top four entries indicate the values mapped to one multiply cluster of the corresponding slice multiply component and the bottom four entries indicate the values mapped to the other multiply cluster.

Figure 51:
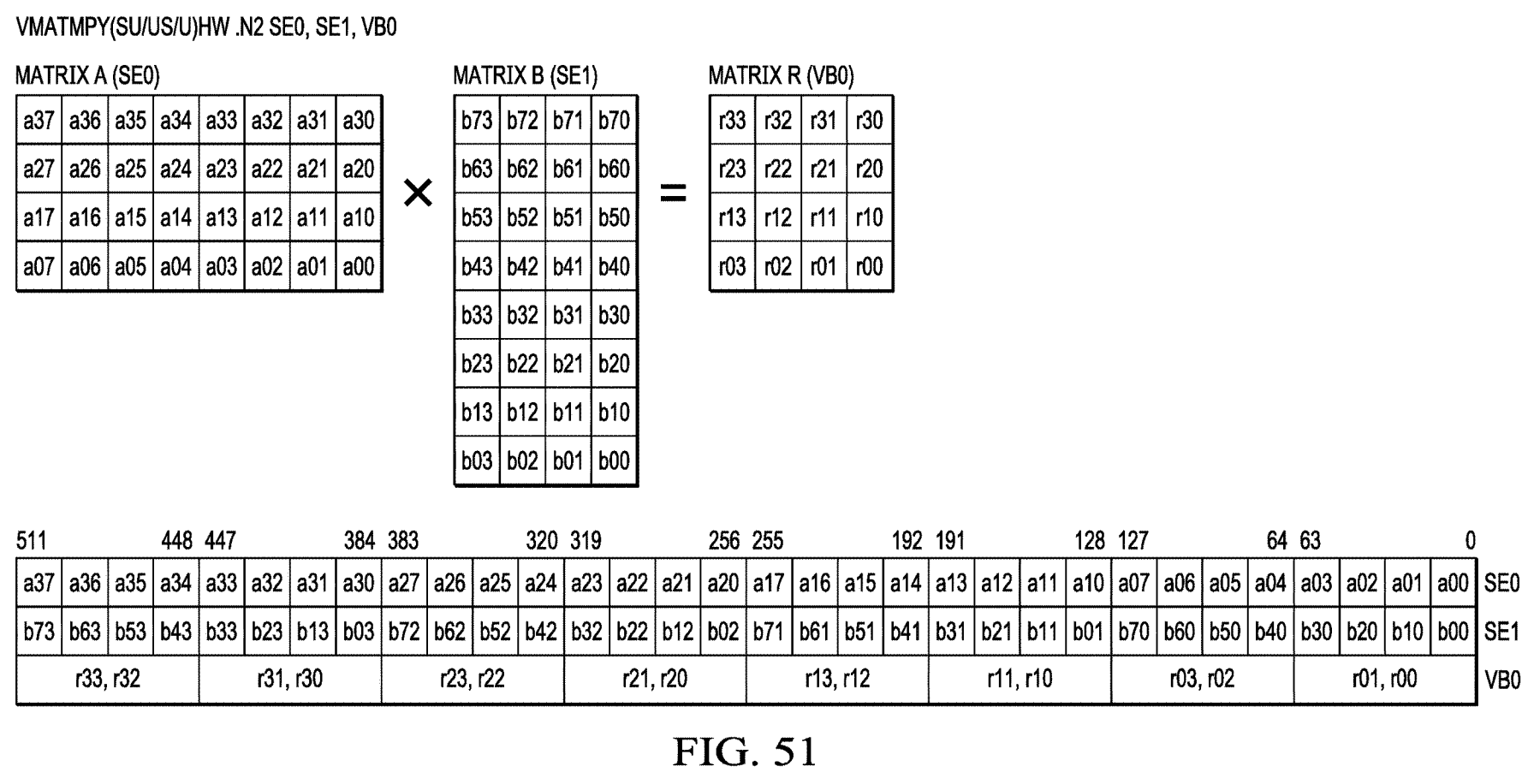

FIG. 51 illustrates an example of the operation of the VMATMPYHW, VMATMPYSUHW, VMATMPYUSHW, and VMATMPYUHW instructions. These instructions take 16-bit inputs (thirty-two elements of the A matrix and thirty-two elements of the B matrix) and produce sixteen 32-bit output (sixteen elements of the R matrix). In this example, the thirty-two elements of the A matrix are provided by stream 0 (SE0) of the streaming engine 125 (FIG. 28) and the thirty-two elements of the B matrix are provided by stream 1 (SE1) of the streaming engine 125. The sixteen 32-bit outputs r00-r33 are stored as pairs in the 64-bit SIMD lanes of global register VB0 of the global register file 231 (FIG. 7).

For these instructions, eight rij values are computed on respective slice multiply components of the N2 multiplication unit 244 and the other eight rij values are computed on respective slice multiply components of the M2 multiplication unit 243. The output of the pairs of rij values in the SIMD lanes of VB0 is performed in the N2 multiplication unit 244. The table shown in FIG. 52 illustrates which value of rij is computed on each slice multiply component. For example, r00 is computed on the slice multiply component for slice 0 in the N2 multiplication unit 244 and r01 is computed on the slice multiply component for slice 0 in the M2 multiplication unit 243.

To compute each rij in the multiplication units 243, 244, the A matrix elements a00-a37 that are provided in sequential order from SE0 and the B matrix elements b00-b73 that are provided in sequential order from SE1 are routed to the appropriate slice multiply component. The table in FIG. 52 illustrates which matrix elements are routed to each slice multiply component. For example, r00=a00b00+a01b10+a02b20+a03b30+a04b40+a05b50+a06b60+a07b70 and r01=a00b01+a01b11+a02b21+a03b31+a04b41+a05b51+a06b61+a07b71. Accordingly, a00-a07 and b00-b70 are routed to the slice multiply component of the N2 multiplication unit 244 for slice 0 and a00-a07 and b02-b72 are routed to the slice multiply component of the N2 multiplication unit 244 for slice 1. An approach for accomplishing this routing is described herein in reference to FIG. 58 and FIG. 59.

The table in FIG. 52 also illustrates which matrix elements are multiplied in each multiply cluster in each slice multiply component. For example, a00-a03 and b00-b30 are multiplied in one multiply cluster of the slice multiply component of the N2 multiplication unit 244 for slice 0 and a04-a07 and b40-b70 are multiplied in the other multiply cluster. Further, a00-a03 and b01-b31 are multiplied in one multiply cluster of the slice multiply component of the M2 multiplication unit 243 for slice 0 and a04-a07 and b41-b71 are multiplied in the other multiply cluster.

Figure 53:
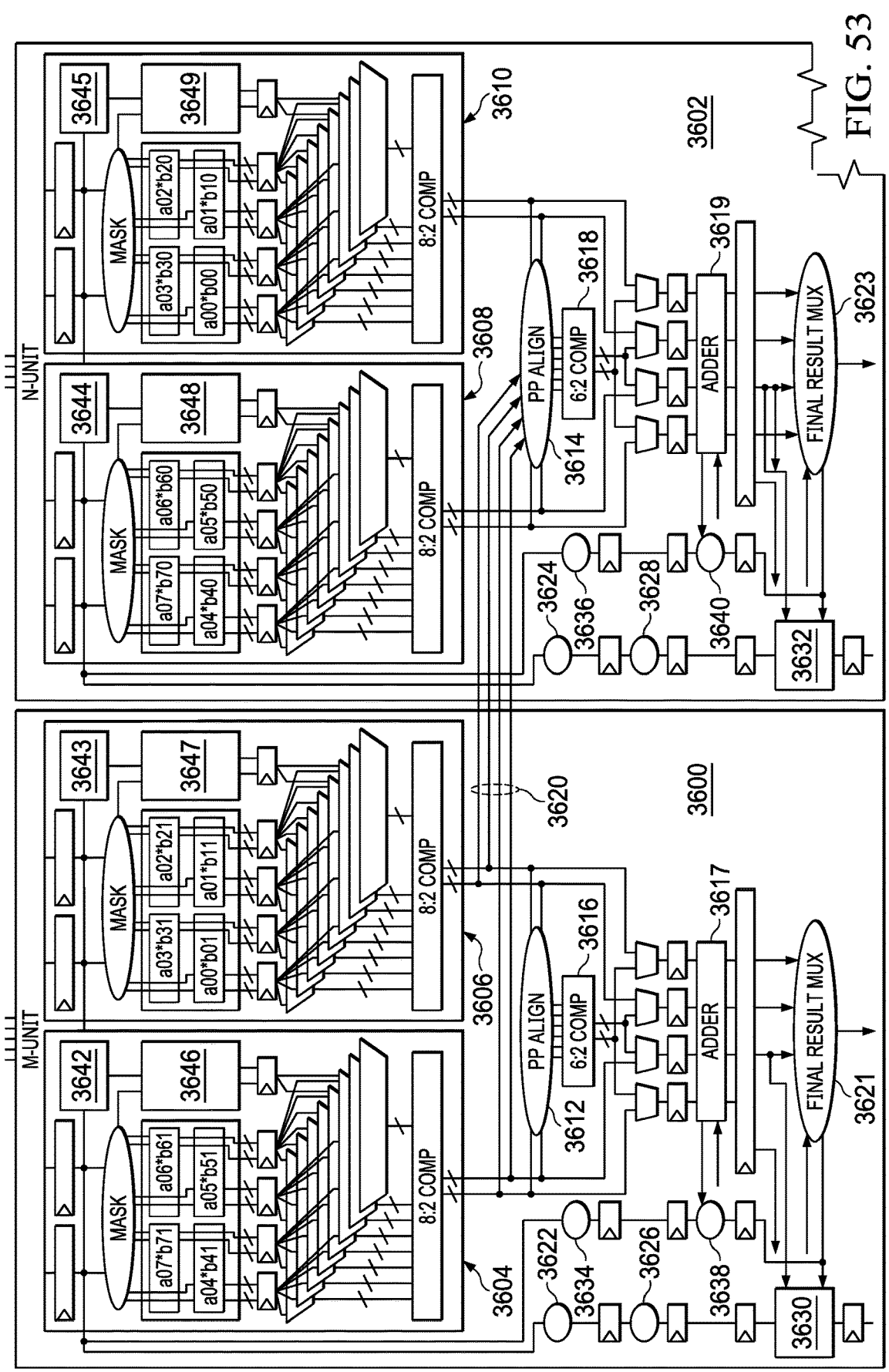
FIG. 53 illustrates an example of multiplier use for the VMATMPY×HW instructions.

FIG. 53 illustrates an example of which multipliers are used for each matrix element multiplication in computing r00 and r01 in the slice multiply components of the M2 multiplication unit 243 and the N2 multiplication unit 244 for slice 0. For purposes of this example, the M unit slice multiply component 3600 and the N unit slice multiply component 3602 of FIG. 36 are assumed to be the slice multiply components for slice 0. As indicated in FIG. 53, to compute r00, the four multipliers in the multiply cluster 3610 are used in the determination of a00*b00, a01*b10, a02*b20, and a03*b30, and the four multipliers in the multiply cluster 3608 are used in the determination a04*b40, a05*b50, a06*b60, and a07*b70. Similarly, to compute r01, the four multipliers in the multiply cluster 3606 are used in the determination of a00*b01, a01*b11, a02*b21, and a03*b31, and the four multipliers in the multiply cluster 3604 are used in the determination of a04*b41, a05*b51, a06*b61, and a07*b71. For these instructions, the outputs of the adder 3617 in the M unit slice multiply component 3600 are routed to the final result mux 3623 in the N unit slice multiply component 3602 to be merged with the outputs of the adder 3619 to generate the r00, r01 pair output to VB0.

Figure 54:
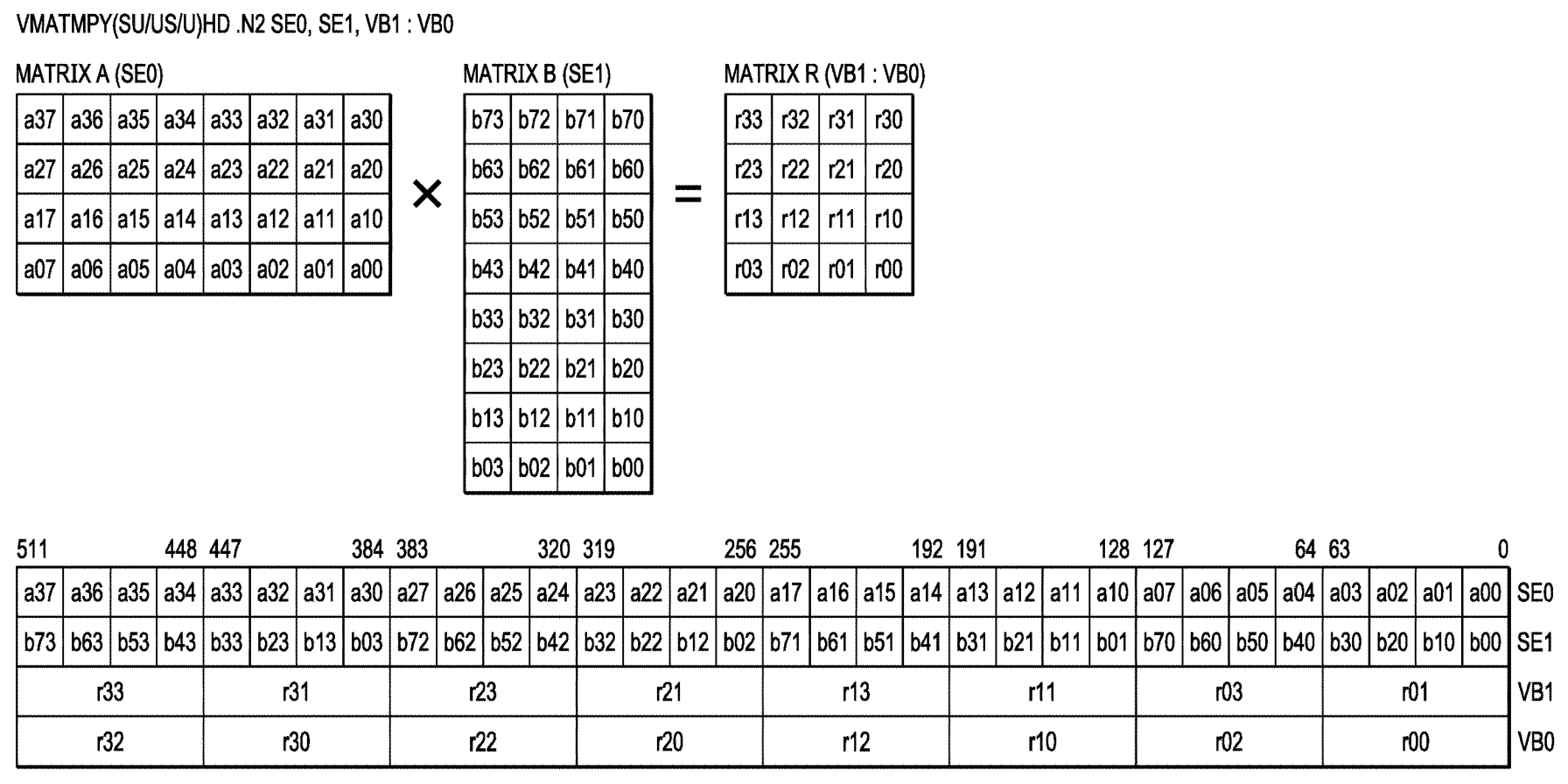

FIG. 54 illustrates an example of the operation of the VMATMPYHD, VMATMPYSUHD, VMATMPYUSHD, and VMATMPYUHD instructions. These instructions take 16-bit inputs (thirty-two elements of the A matrix and thirty-two elements of the B matrix) and produce sixteen 64-bit output (sixteen elements of the R matrix). In this example, the thirty-two elements of the A matrix are provided by stream 0 (SE0) of the streaming engine 125 (FIG. 28) and the thirty-two elements of the B matrix are provided by stream 1 (SE1) of the streaming engine 125. The sixteen 64-bit outputs r00-r33 are stored as indicated by the dst operand register pair in the 64-bit SIMD lanes of global registers VB1 and VB0 of the global register file 231 (FIG. 7).

For these instructions, eight rij values are computed on respective slice multiply components of the N2 multiplication unit 244 and the other eight rij values are computed on respective slice multiply components of the M2 multiplication unit 243. The output of each rij value into the SIMD lanes of VB0 and VB1 is performed in by the multiplication unit that computes the value. The table in shown in FIG. 55 illustrates which value of rij is computed on each slice multiply component. For example, r00 is computed on the slice multiply component for slice 0 in the N2 multiplication unit 244 and r01 is computed on the slice multiply component for slice 0 in the M2 multiplication unit 243.

To compute each rij in the multiplication units 243, 244, the A matrix elements a00-a37 that are provided in sequential order from SE0 and the B matrix elements b00-b73 that are provided in sequential order from SE1 are routed to the appropriate slice multiply component. The table in FIG. 55 illustrates which matrix elements are routed to each slice multiply component. For example, r00=a00b00+a01b10+a02b20+a03b30+a04b40+a05b50+a06b60+a07b70 and r01=a00b01+a01b11+a02b21+a4*c4+a03b31+a04b41+a05b51+a06b61+a07b71. Accordingly, a00-a07 and b00-b70 are routed to the slice multiply component of the N2 multiplication unit 244 for slice 0 and a00-a07 and b01-b71 are routed to the slice multiply component of the M2 multiplication unit 243 for slice 0. An approach for accomplishing this routing is described herein in reference to FIG. 58 and FIG. 59.

The table in FIG. 55 also illustrates which matrix elements are multiplied in each multiply cluster in each slice multiply component. For example, a00-a03 and b00-b30 are multiplied in one multiply cluster of the slice multiply component of the N2 multiplication unit 244 for slice 0 and a04-a07 and b40-b70 are multiplied in the other multiply cluster. Further, a00-a03 and b01-b31 are multiplied in one multiply cluster of the slice multiply component of the M2 multiplication unit 243 for slice 0 and a04-a07 and b41-b71 are multiplied in the other multiply cluster.

FIG. 56 illustrates an example of which multipliers are used for each matrix element multiplication in computing r00 and r01 in the slice multiply components of the M2 multiplication unit 243 and the N2 multiplication unit 244 for slice 0. For purposes of this example, the M unit slice multiply component 3600 and the N unit slice multiply component 3602 of FIG. 36 are assumed to be the slice multiply components for slice 0. As indicated in FIG. 56, to compute r00, the four multipliers in the multiply cluster 3610 are used in the determination of a00*b00, a01*b10, a02*b20, and a03*b30, and the four multipliers in the multiply cluster 3608 are used in the determination a04*b40, a05*b50, a06*b60, and a07*b70. Similarly, to compute r01, the four multipliers in the multiply cluster 3606 are used in the determination of a00*b01, a01*b11, a02*b21, and a03*b31, and the four multipliers in the multiply cluster 3604 are used in the determination of a04*b41, a05*b51, a06*b61, and a07*b71.

Figure 57:
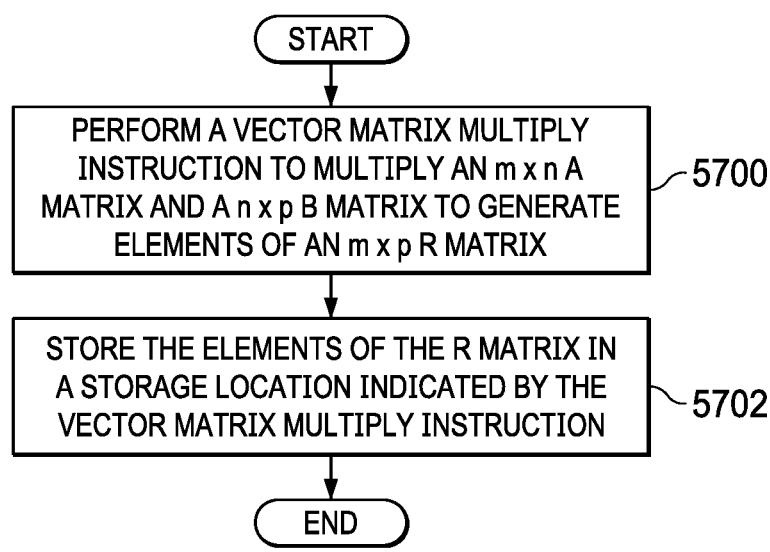
FIG. 57 is a flow diagram of a method for performing vector-based matrix multiplication.

FIG. 57 is a flow diagram of a method for performing vector-based matrix multiplication instruction that can be performed by a processor, e.g., processing unit core 110 (FIG. 1). In this method, a vector matrix multiply instruction is performed 5700 by the processor to multiply an m×n A matrix and an n×p B matrix to generate elements of an m×p R matrix. The elements of the R matrix are then stored 5702 in a storage location indicated by the vector matrix multiply instruction. Vector matrix multiply instructions are previously described herein.

Referring again to FIG. 1 and FIG. 2, as previously described herein, the streaming engine 125 generally reads data elements from memory according to a stream definition and maps the data elements sequentially into lanes or slices of a vector in increasing lane order. For some types of instructions that use vector data from the streaming engine 125, the data elements in the vectors generated by the streaming engine 125 need to be permuted for correct execution of the instruction on a functional unit. For example, an instruction for implementing a finite impulse response (FIR) filter, VFIR8HD, performs multiplications of eight 16-bit signed coefficients with eight 16-bit signed samples, and accumulates the products as 64-bit outputs. The filter coefficients are the same for all outputs but the samples need to be shifted left by sixteen bits before multiplication in a multiplication unit 243, 244 for each consecutive output. Similarly, for vector-based matrix multiplication instructions such as VMATMPYHD, the data from the streaming engine 125 needs to be arranged such that each row of the A matrix is multiplied with each column of the B matrix in a multiplication unit 243, 244.

Figure 58:
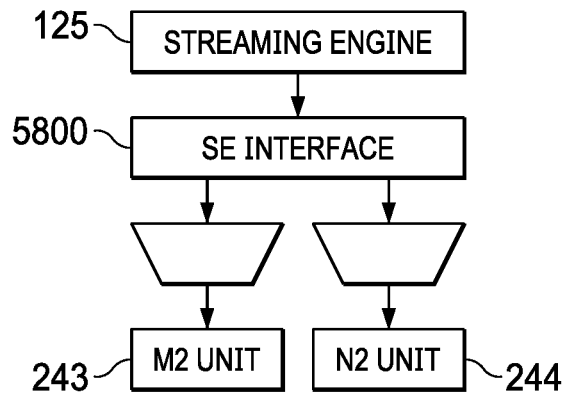
FIG. 58 illustrates a block diagram of connectivity between the streaming engine and the vector multiplication units.

As illustrated in the block diagram of FIG. 58, in some examples, there is a streaming engine interface 5800 between the streaming engine 125 and the vector multiplication units M2 243 and N2 244. The streaming engine interface 5800 includes functionality to buffer data from the streaming engine 125. The streaming engine interface 5800 also includes permute networks for rearranging or permuting the data elements from the streaming engine 125 as needed for execution of selected instructions in the M2 unit 243 and/or the N2 unit 244.

Figure 59:
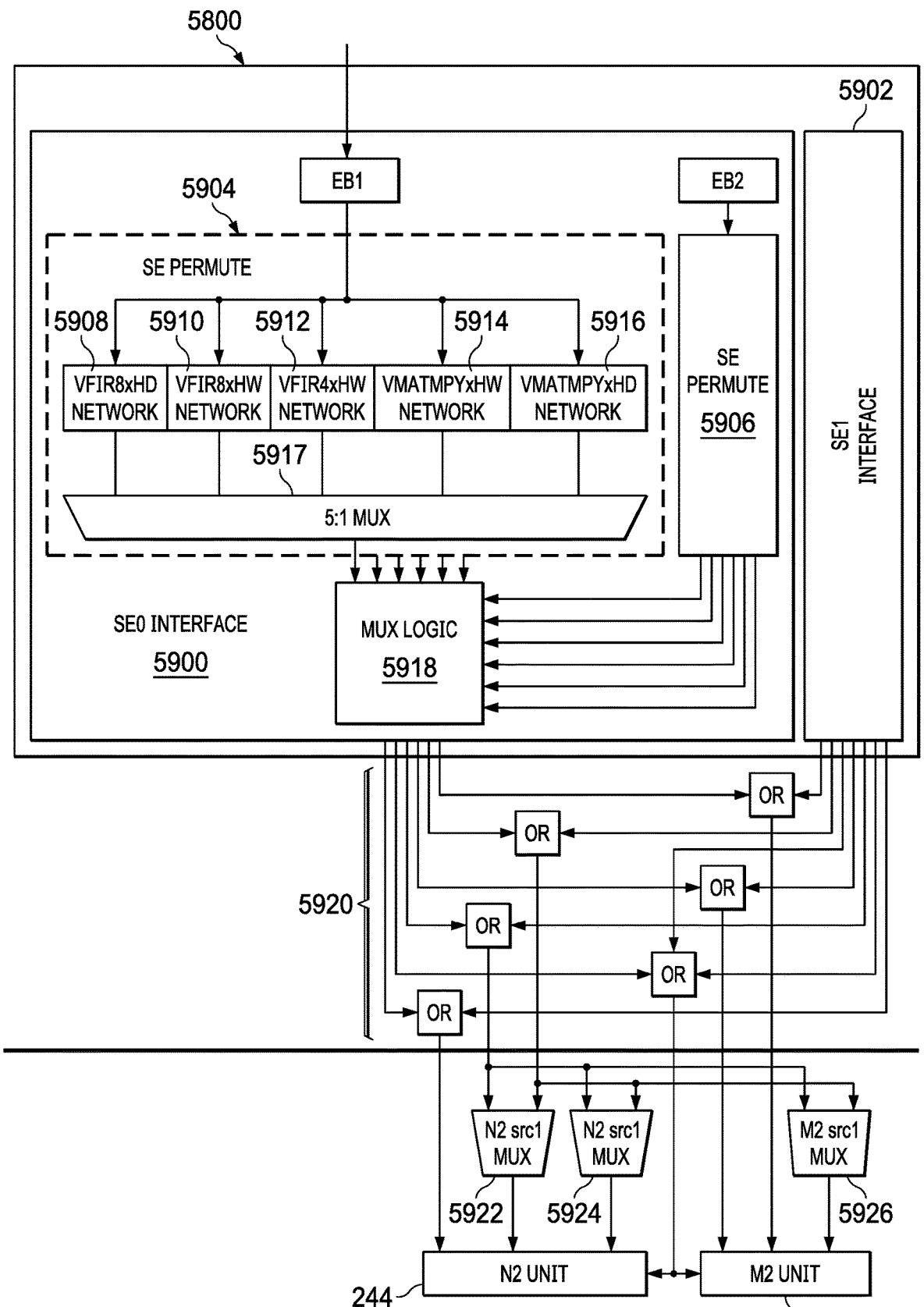
FIG. 59 is a block diagram illustrating an example streaming engine interface.

FIG. 59 is a block diagram illustrating an example streaming engine interface 5800 in more detail. As previously described herein, the streaming engine 125 (FIG. 28) includes two closely coupled streaming engines, SE0 and SE1, that can manage two data streams simultaneously. The streaming engine interface 5800 includes an SE0 interface component 5900 coupled between SE0 and the vector multiplication units 243, 244 and an SE1 interface component 5902 coupled between SE0 and the vector multiplication units 243, 244. A detailed view of the SE0 interface component 5900 is provided. The SE1 interface component 5902 is identical.

The SE0 interface component 5900 includes two elastic buffers, EB1 and EB2, coupled to receive 512-bit input from SE0. The elastic buffers are configured to store two consecutive packets of data elements from SE0. Each of the elastic buffers EB1 and EB2 is coupled to a respective permute component 5904, 5906. Input packets from SE0 are alternated in a ping pong fashion between EB1 and EB2. A detailed view of the permute component 5904 coupled to EB1 is provided. The other permute component 5906 is identical.

The permute component 5904 includes functionality to arrange (permute) data elements from the elastic buffer EB1 into locations in a 512-bit vector as needed for execution of specific instructions on the M2 unit 243 and/or N2 unit 244. The permute component 5904 includes permute networks 5908, 5910, 5912, 5914, 5916 configured to permute data elements for the VFIRxxx and VMATMPYxxx instructions. The 5:1 multiplexer 5917 is configured to select the output of one of the permute networks 5908, 5910, 5912, 5914, 5916 according to the particular instruction being executed. The select signal (not shown) comes from the instruction decoder 113 (FIG. 1). The multiplexer logic 5918 is coupled to the permute component 5904 and the permute component 5906 and is configured to select between the outputs of the two components. The select signal (not shown) is set based on which of EB1 and EB2 contains the next data packet for the multiplication units 243, 244.

The permute network 5908 for the VFIR8×HD instructions permutes the streaming engine data to the data pattern for performing vector multiplications for FIR operations for an 8 tap filter as previously described herein. Table 32 illustrates the permutation results, i.e., the data pattern, output by the network 5908 for input to the N2 multiplication unit 244 and the M2 multiplication unit 243 given the sequential data elements a0-a22. Similarly, the permute network 5910 for the VFIR8×HW instructions and the permute network 5912 for the VFIR4×HW instructions permute the streaming engine data to the data patterns for performing vector multiplications for FIR operations for an 8 tap filter or a 4 tap filter as previously described herein. Table 33 and Table 34 respectively illustrate the permutation results of the network 5910 and the network 5912 for input to the N2 multiplication unit 244 and the M2 multiplication unit 243 given the respective sequential data elements a0-a22 and a0-a34.

The permute network 5914 for the VMATMPY×HW instructions and the permute network 5916 for the VMATMPY×HD instructions permute the streaming engine data for the A matrix and the B matrix to the data patterns for performing vector multiplications for matrix multiply operations as previously described herein. The tables in FIG. 52 and FIG. 55 respectively illustrate the permutation results of the network 5914 and the network 5916 for input to the N2 multiplication unit 244 and the M2 multiplication unit 243 given the respective sequential data elements a00-a37 of the A matrix and b00-b73 of the B matrix.

The OR circuitry 5920 is "glue logic" between the SE interface 5800 and the vector multiplication units 243, 244. The OR circuitry 5920 is configured to select between the output of the SE0 interface component 5900 and the SE1 interface component 5902. The OR circuitry is further configured to concatenate permuted data elements from SE0 and SE1 for those instructions that receive data elements from both, e.g., the VFIR4xx instructions. The multiplexers 5922, 5924, 5926 coupled between the OR circuitry 5920 and the N2 multiplication unit 244 and the M2 multiplication unit 243 are configured to select either SE0 or SE1 as inputs to the respective multiplication unit.

Figure 60:
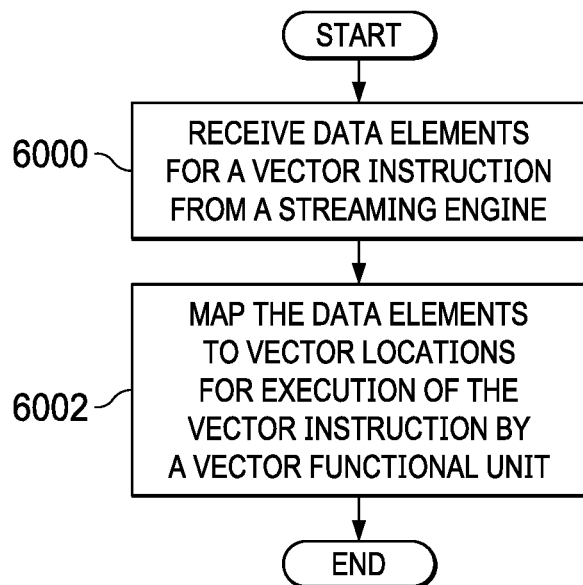
FIG. 60 is a flow diagram of a method for performing permutation of streamed data elements.

FIG. 60 is a flow diagram of a method for performing permutation of streamed data elements that can be performed by a permute network, e.g., permute networks 5908, 5910, 5912, 5914, 5916 (FIG. 59). In this method, data elements for a vector instruction, e.g., a VFIRxxx or VMATMPYxxx instruction, are received 6000 in a permute network from a streaming engine, e.g., streaming engine 125 (FIG. 28). The permute network then maps 6002 the data elements to vector locations for execution of the vector instruction by a vector functional unit, e.g., multiplication units 243, 244 (FIG. 2). Permute networks for vector instructions are previously described herein.

Figure 61:
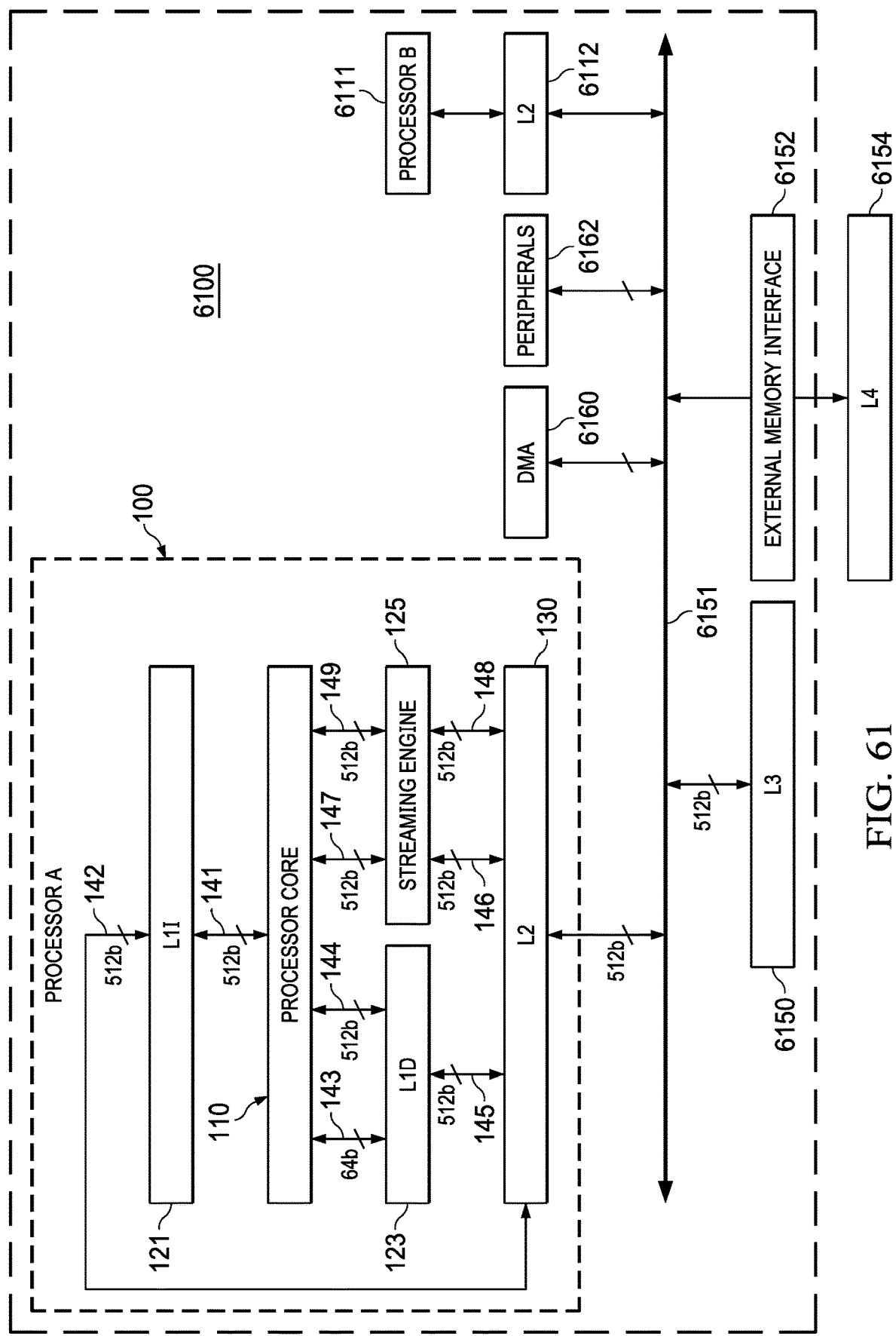
FIG. 61 is a block diagram of a multiprocessor system.

FIG. 61 illustrates an example multiprocessor system. In this example, SoC 6100 includes processor 100 (FIG. 1) (referred to as "processor A") and it is combined with a second processor 6111 (referred to as "processor B"). Each processor is coupled to a block of shared level three (L3) memory 6150 via bus 6151. Processor B includes a block of unshared level two (L2) memory 6112. A direct memory access (DMA) engine 6160 may be programmed to transfer blocks of data/instructions from L3 memory to L2 memory 130 or L2 memory 6112 using known or later developed DMA techniques. Various types of peripherals 6162 are also coupled to memory bus 6151, such as wireless and/or wired communication controllers, etc.

In this example, processor A, processor B, L3 memory 6150 are all included in a SoC 6100 that may be encapsulated to form a package that may be mounted on a substrate such as a printed circuit board (PCB) using known or later developed packaging techniques. For example, SoC 6100 may be encapsulated in a ball grid array (BGA) package. In this example, external memory interface (EMI) 6152 allows additional external bulk memory 6154 to be accessed by processor A and/or processor B.

In this example, processor B is an ARM® processor that may be used for scalar processing and control functions. In other examples, various types of known or later developed processors may be combined with DSP 100. While two processors are illustrated in this example, in another example, multiple copies of DSP 100 and/or multiple copies of processor B may be included within an SoC.

OTHER EMBODIMENTS

While the disclosure has been described with respect to a limited number of embodiments, other embodiments can be devised which do not depart from the scope of the invention as disclosed herein.

For example, embodiments of VFIRxxx instructions are described herein as being implemented on a processor in which functional units, data paths, and register files are used for accumulation. In some embodiments, the VFIRxxx instructions are implemented on a processor with an accumulator based architecture.

In another example, embodiments of VFIRxxx and VMATMPYxxx instructions are described herein as being implemented using vector multiplication units that designed for vector multiplication instructions. In some embodiments, such instructions are implemented using special purpose functional units, e.g., filter computation logic and vector matrix multiplication logic, designed to execute the instructions.

In another example, embodiments of VFIRxxx instructions for 8-tap and 4-tap FIR filters are described herein. In some embodiments, VFIR instructions are provided for other numbers of taps.

In another example, embodiments of VMATMPYxxx instructions for multiplying an 8×4 matrix and a 4×8 matrix are described herein. In some embodiments, VMATMPY instructions are provided for multiplication of matrices of other sizes.

In another example, embodiments of VFIRxxx and VMATMPYxxx instructions are described herein assuming 512-bit vectors and either 16-bit or 32-bit or 64-bit elements/lanes. In other examples, the vectors may be smaller or larger and/or the size of the elements may be larger or smaller.

In another example, permutation of input data elements for VFIRxxx and VMATMPYxxx instructions is described herein using permute networks inside a streaming engine interface. In some embodiments, the permutations are hardwired in the functional units performing the instructions.

In another example, permutation of input data elements for instruction execution is described herein as being implemented with five permute networks, one for each instruction type requiring input data permutation. In some embodiments, more or fewer permute networks are provided, depending on the number of instructions requiring such permutation.

In another example, embodiments are described herein in which a 5-bit constant stored in the 6-bit SRC2/CST field 1302 (FIG. 13) is concatenated with 27-bits in a constant extension slot to form a 32-bit constant. In some embodiments, a 6-bit constant is stored in the 6-bit SRC2/CST field 1302 and is concatenated with 26-bits in a constant extension slot to form a 32-bit constant.

It is therefore contemplated that the appended claims will cover any such modifications of the embodiments as fall within the true scope of the disclosure.

What is claimed is:

1. A method comprising:
   receiving, by a processor, a vector finite impulse response (VFIR) filter instruction that specifies a set of coefficients, a set of data elements, and an output storage location;
   performing, by the processor, the VFIR instruction by:
   storing a subset of the set of data elements in a buffer;
   reordering the subset of the set of data elements using a permute network coupled to the buffer such that each data element of the reordered subset of the set of data elements is provided to a respective slice multiply component of a vector multiplication unit of the processor, the reordered subset based on a configuration of the permute network set using the VFIR filter instruction; and
   generating, using the vector multiplication unit, a set of filter outputs using the set of coefficients and the set of data elements; and
   storing the filter outputs in the output storage location.

2. The method of claim 1, wherein a number of coefficients of the set of coefficients is eight.

3. The method of claim 2, wherein a number of data elements in the set of data elements is twenty-three and a number of filter outputs in the set of filter outputs is sixteen.

4. The method of claim 1, wherein a number of coefficients of the set of coefficients is four.

5. The method of claim 4, wherein a number of data elements in the set of data elements is thirty-five and a number of filter outputs in the set of filter outputs is thirty-two.

6. The method of claim 1, wherein the vector multiplication unit includes a set of slice multiply components and each slice multiply component of the set of slice multiply components generates at least one respective filter output of the set set of filter outputs.

7. The method of claim 6 wherein the set of coefficients is duplicated such that the set of coefficients is provided to each slice multiply component of the set of slice multiply components.

8. The method of claim 7, wherein the set of data elements is provided by a streaming engine coupled to the buffer.

9. The method of claim 1, wherein:
   the permute network is a first permute network;
   the processor includes a set of permute networks that includes the first permute network coupled in parallel between the buffer and the vector multiplication unit; and
   the method further comprises selecting the first permute network from among the set of permute networks based on the VFIR filter instruction.

10. A processor comprising:
    an instruction decoder configured to decode a vector finite impulse response (VFIR) filter instruction that specifies a set of coefficients and a set of data elements;
    a buffer configured to store a subset of the set of data elements;
    a permute network coupled to the buffer and the instruction decoder, the permute network configured to reorder the subset of the set of data elements based on the VFIR instruction; and
    filter computation logic coupled to the buffer that includes a vector multiplication unit that includes a set of slice multiply components, wherein the filter computation logic is configured to:
    receive the subset of the set of data elements from the permute network; and
    generate, responsive to the VFIR filter instruction, a set of filter outputs using the set of coefficients and the set of data elements.

11. The processor of claim 10, wherein a number of coefficients in the set of coefficients is eight.

12. The processor of claim 11, wherein a number of data elements in the set of data elements is twenty-three and a number of filter outputs in the set of filter outputs is sixteen.

13. The processor of claim 10, wherein a number of coefficients of the set of coefficients is four.

14. The processor of claim 12, wherein a number of data elements in the set of data elements is thirty-five and a number of filter outputs in the set of filter outputs is thirty-two.

15. The processor of claim 10, wherein each slice multiply component of the set of slice multiply components is configured to generate at least one respective filter output of the set of filter outputs.

16. The processor of claim 15, wherein the set of coefficients is duplicated such that the set of coefficients is provided to each slice multiply component of the set of slice multiply components.

17. The processor of claim 16, wherein the set of data elements is provided by a streaming engine.

18. The processor of claim 10, wherein the processor is a digital signal processor (DSP).

19. The processor of claim 9, wherein:
the permute network is a first permute network;
the processor further comprises a set of permute networks that includes the first permute network coupled in parallel between the buffer and the vector multiplication unit; and
the instruction decoder is configured to select the first permute network from among the set of permute networks.

20. The processor of claim 9, wherein:
the vector multiplication unit is a first vector multiplication unit;
the processor further comprises a second vector multiplication unit coupled to the permute network and configured to perform the VFIR filter instruction; and
the VFIR filter instruction specifies the first vector multiplication unit from among the first vector multiplication unit and the second vector multiplication unit.

\* \* \* \* \*